United States Patent
Sugaya et al.

(10) Patent No.: US 6,936,774 B2
(45) Date of Patent: Aug. 30, 2005

(54) WIRING SUBSTRATE PRODUCED BY TRANSFER MATERIAL METHOD

(75) Inventors: Yasuhiro Sugaya, Osaka (JP); Shingo Komatsu, Kadoma (JP); Koichi Hirano, Hirakata (JP); Seiichi Nakatani, Hirakata (JP); Yasuyuki Matsuoka, Neyagawa (JP); Toshiyuki Asahi, Osaka (JP); Yoshihisa Yamashita, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 7 days.

(21) Appl. No.: 10/283,386

(22) Filed: Oct. 29, 2002

(65) Prior Publication Data

US 2003/0102153 A1 Jun. 5, 2003

Related U.S. Application Data

(63) Continuation of application No. 09/778,709, filed on Feb. 7, 2001, now Pat. No. 6,871,396.

(30) Foreign Application Priority Data

| Feb. 9, 2000 | (JP) | ......................... 2000-031422 |
| Apr. 12, 2000 | (JP) | ......................... 2000-110307 |
| Oct. 24, 2000 | (JP) | ......................... 2000-324524 |

(51) Int. Cl.⁷ ..................... H05K 1/05; H01R 43/20
(52) U.S. Cl. ................... 174/255; 174/262; 29/876; 29/879
(58) Field of Search ............... 257/773, 786; 438/125, 611–614; 29/825, 829, 874, 876, 877–879; 174/255, 261, 262–266; 361/792–795

(56) References Cited

U.S. PATENT DOCUMENTS

| 4,244,605 A | 1/1981 | Deneau |
| 4,612,083 A | 9/1986 | Yasumoto et al. |
| 4,797,508 A | 1/1989 | Chant |
| 5,141,790 A | 8/1992 | Calhoun et al. |
| 5,309,629 A | * 5/1994 | Traskos et al. ................ 29/830 |
| 5,407,511 A | 4/1995 | Nakatani et al. ............. 156/230 |
| 5,408,053 A | * 4/1995 | Young ......................... 174/264 |
| 5,546,375 A | 8/1996 | Shimada et al. |
| 5,667,884 A | 9/1997 | Bolger |
| 5,689,879 A | 11/1997 | Urasaki et al. ................ 29/846 |
| 5,699,613 A | 12/1997 | Chong et al. .................. 29/852 |
| 5,744,758 A | * 4/1998 | Takenouchi et al. ......... 174/255 |
| 5,776,662 A | 7/1998 | Shirai et al. ................. 430/313 |
| 5,855,716 A | 1/1999 | Tonucci et al. .............. 156/230 |

(Continued)

FOREIGN PATENT DOCUMENTS

| DE | 1106822 B | 5/1961 |
| EP | 0 525 956 | 2/1993 |
| EP | 568 930 | 11/1993 |

(Continued)

OTHER PUBLICATIONS

Handbook of Electronic Packaging, Mc–Graw–Hill, 1969, pp. 1–17 and 1–21.*

*Primary Examiner*—Alonzo Chambliss
(74) *Attorney, Agent, or Firm*—Merchant & Gould P.C.

(57) ABSTRACT

A transfer material capable of transferring a fine wiring pattern to a substrate reliably and easily. The transfer material includes at least three layers of a first metal layer as a carrier, a second metal layer that is transferred to the substrate as a wiring pattern, and a peel layer adhering the first and second metal layers releasably. On the surface portion of the first metal layer, a concave and convex portion corresponding to the wiring pattern is formed, and the peel layer and the second metal layer are formed on a region of the convex portions.

15 Claims, 20 Drawing Sheets

U.S. PATENT DOCUMENTS

| | | | |
|---|---|---|---|
| 5,951,803 A | 9/1999 | Johnston ................... 156/233 |
| 6,000,603 A | 12/1999 | Koskenmaki et al. |
| 6,060,150 A | 5/2000 | Nakatani et al. ............ 174/258 |
| 6,138,348 A | 10/2000 | Kulesza et al. |
| 6,143,116 A * | 11/2000 | Hayashi et al. ............. 156/233 |
| 6,195,882 B1 | 3/2001 | Tsukamoto et al. .......... 29/852 |
| 6,320,140 B1 * | 11/2001 | Enomoto .................... 174/264 |
| 6,359,235 B1 * | 3/2002 | Hayashi ...................... 174/260 |
| 6,370,013 B1 * | 4/2002 | Iino et al. ................ 361/306.3 |
| 6,373,000 B2 * | 4/2002 | Nakamura et al. .......... 174/264 |
| 6,459,046 B1 * | 10/2002 | Ochi et al. .................. 174/256 |

FOREIGN PATENT DOCUMENTS

| | | |
|---|---|---|
| EP | 0 629 110 | 12/1994 |
| EP | 645 950 | 3/1995 |
| EP | 651 602 | 5/1995 |
| EP | 0 960 725 | 12/1999 |
| EP | 1 102 355 | 5/2001 |
| GB | 999183 | 7/1965 |
| JP | 60-55691 | 3/1985 |
| JP | 60-164392 | 8/1985 |
| JP | 6-132667 | 5/1994 |
| JP | 7-142867 | 6/1995 |
| JP | 8-125291 | 5/1996 |
| JP | 8-125308 | 5/1996 |
| JP | 8-288596 | 11/1996 |
| JP | 2587596 | 12/1996 |
| JP | 8-330709 | 12/1996 |
| JP | 2601128 | 1/1997 |
| JP | 2603053 | 1/1997 |
| JP | 9-36551 | 2/1997 |
| JP | 9-51168 | 2/1997 |
| JP | 9-116267 | 5/1997 |
| JP | 9-270584 | 10/1997 |
| JP | 9-326562 | 12/1997 |
| JP | 10-41611 | 2/1998 |
| JP | 10-51139 | 2/1998 |
| JP | 10-84186 | 3/1998 |
| JP | 10-173097 | 6/1998 |
| JP | 10-173316 | 6/1998 |
| JP | 10-190191 | 7/1998 |
| JP | 11-135946 | 5/1999 |
| JP | 11220262 A * | 8/1999 ............ H05K/3/46 |
| JP | 11-261219 | 9/1999 |
| JP | 2000-15742 | 1/2000 |
| JP | 2001-210933 | 8/2001 |
| TW | 220027 | 2/1994 |
| TW | 340297 | 9/1998 |

\* cited by examiner

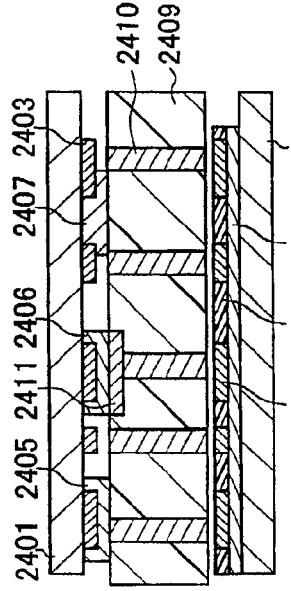
FIG. 22A
FIG. 22B
FIG. 22C
FIG. 22D
FIG. 22E
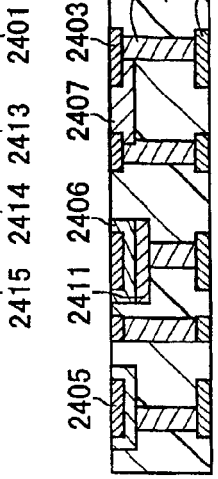
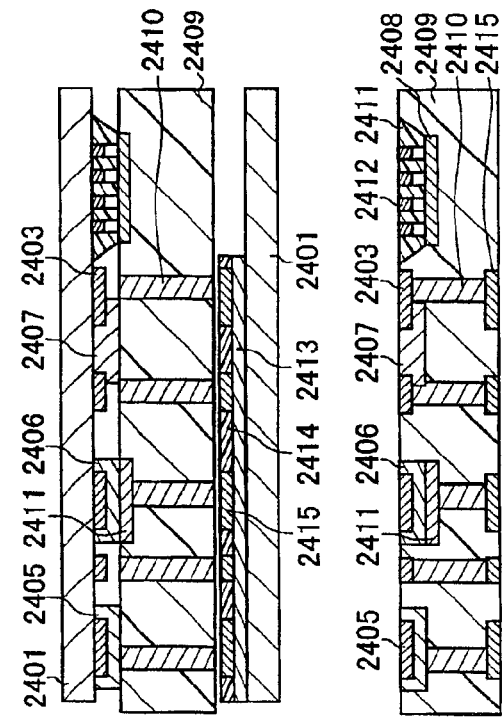
FIG. 22E'
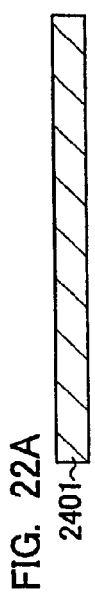
FIG. 22F
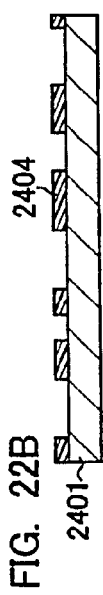
FIG. 22G
FIG. 22F'
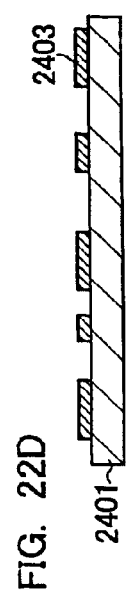
FIG. 22G'
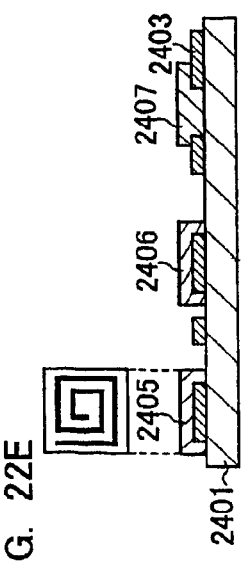
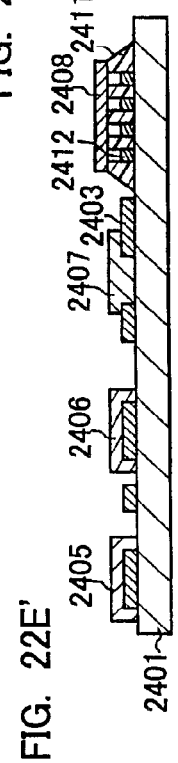

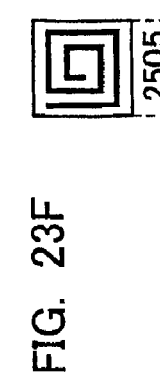
FIG. 23A
FIG. 23B
FIG. 23C
FIG. 23D
FIG. 23E
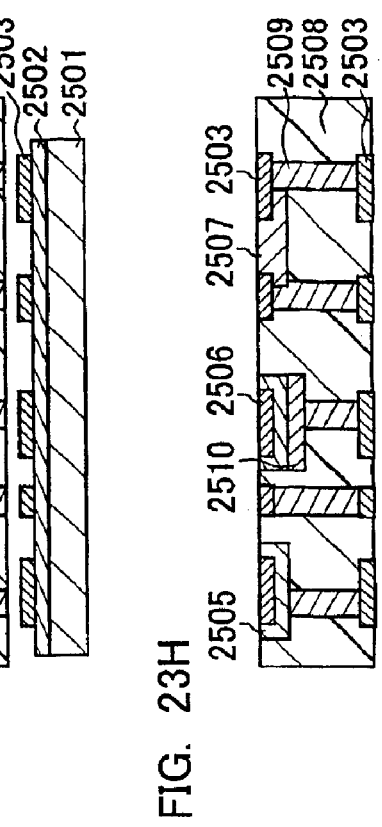
FIG. 23F
FIG. 23G
FIG. 23H

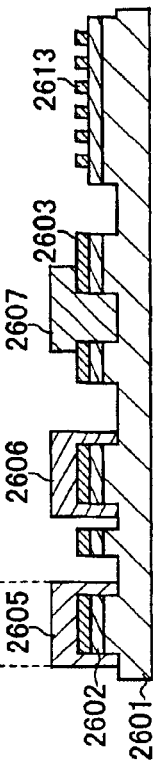
FIG. 24A
FIG. 24B
FIG. 24C
FIG. 24D
FIG. 24E
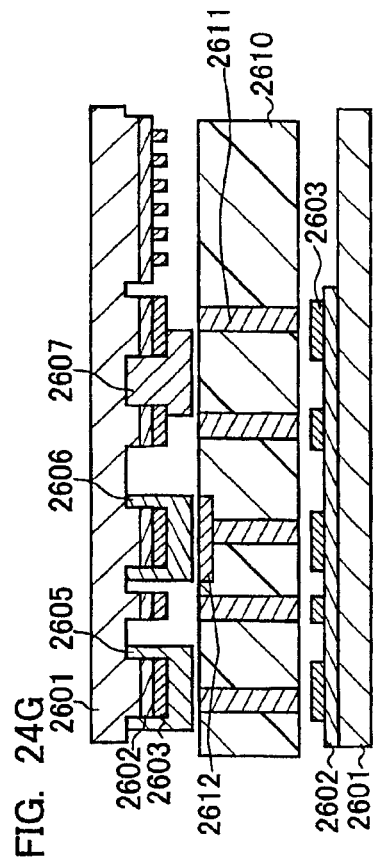
FIG. 24F
FIG. 24G
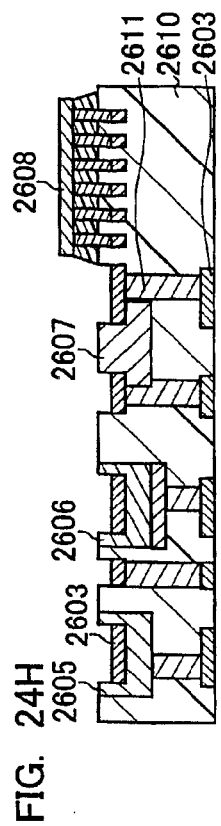
FIG. 24H

WIRING SUBSTRATE PRODUCED BY TRANSFER MATERIAL METHOD

This application is a continuation of application Ser. No. 09/778,709, filed Feb. 7, 2001, now U.S. Pat. No. 6,871,396 which application(s) are incorporated herein by reference.

BACKGROUND OF THE INVENTION

1. Field of the Invention

The present invention relates to a transfer material for transferring a fine wiring pattern or circuit components to a substrate, and a method for producing the same. Furthermore, the present invention relates to a wiring substrate on which a wiring pattern or a circuit component is formed and a method for producing the same.

2. Related Background Art

Recently, with a demand for high performance and miniaturization of electronic equipment, high-density and high-performance semiconductor devices increasingly have been desired. This leads to a demand for a small size and high density circuit substrate on which such semiconductor devices are to be mounted.

In order to meet such demands, a connection method using inner via holes (IVHs) that can connect between wiring patterns of large-scale integrated circuits (LSIs) or circuit components in the shortest distance has been developed in various fields. In general, an example of wiring patterns having such IVH configurations includes a multi-layered ceramic wiring substrate, a multi-layered wiring substrate produced by a build-up method, a multi-layered composite wiring substrate including a mixture of a resin and an inorganic filler, and the like.

The multi-layered ceramic wiring substrate can be produced, for example, by a following method. First, a plurality of green sheets including a ceramic powder such as alumina, etc., an organic binder and a plasticizer are prepared. Then, each of the green sheets is provided with via holes and the via holes are filled with a conductive paste. Thereafter, a wiring pattern is printed on the green sheets, and the printed green sheets are laminated. Then, the thus obtained laminate is subjected to a binder removing treatment and a firing treatment, thus forming a multi-layered ceramic wiring substrate. Since the thus obtained multi-layered ceramic wiring substrate has an IVH structure, an extremely high-density wiring pattern can be formed. Therefore, such multi-layered ceramic wiring substrates are suitable for miniaturization of electronic equipment.

Also, the print wiring substrate produced by the build-up method, which imitates the structure of the multi-layered ceramic wiring substrate, has been developed in various fields. For example, JP9 (1997)-116267A, JP9 (1997)-51168A, etc. disclose a conventional general build-up method. In this method, a conventionally used glass-epoxy substrate is used as a core and a photosensitive insulating layer is formed on the surface of the substrate. The surface is provided with via holes by photolithography, the entire surface is copper-plated, and then the copper-plated surface is subjected to a chemical etching process, to thus form a wiring pattern.

Furthermore, JP9 (1997)-326562A discloses a method in which a conductive paste is filled in via holes processed by photolithography as in the build-up method. JP9 (1997)-36551A, JP10 (1998)-51139A, etc. disclose a method for producing a multi-layered substrate by forming a conductive circuit on one surface of a hard insulating base material and an adhesive layer on another, respectively; providing through holes thereon; filling the through holes with a conductive paste; and then laminating a plurality of base materials to thus form a multi-layered substrate.

Furthermore, specification of Japanese Patent Nos. 2601128, 2603053, 2587596 disclose a method for producing a multi-layered structure in which an aramid-epoxy prepreg is provided with through holes by laser machining, the through holes are filled with a conductive paste, and then a copper foil is laminated and patterning is carried out. This substrate is used as a core, and is impregnated by prepregs with a conductive paste, to thus form a multilayer structure.

As mentioned above, similar to the above-mentioned multi-layer ceramic wiring pattern, the connection method using IVHs for, for example, a resin based printing wiring substrate, allows an electrical connection only between the layers necessary to be connected. Furthermore, since no through holes are provided on the top layer of the substrate, the mountability is also excellent.

However, in general, such a high-density mounted resin based printing wiring substrate including an IVH structure has a low thermal conductivity. As the mounting density of components becomes higher, it is getting more difficult to release heat that has been generated in the components.

In addition, in the year 2000, a clock frequency of a CPU is about 1 GHz. It is estimated that with the sophistication in the function of the CPU, its electric power consumption accordingly reaches 100 to 150 W per chip.

In general, a ceramic wiring substrate excellent in the thermal conductivity has an excellent heat releasing property, but there are some disadvantages, for example, it is relatively expensive, it is poor in impact resistance property when it is applicable for a substrate or a module used for portable terminals, and the like.

Therefore, in order to solve the problem of the thermal conductivity of the resin based printing wiring substrate, or in order to form a capacitor on the resin multi-layered substrate, a structure in which a resin based wiring substrate and a ceramic substrate are laminated is proposed in specification of Japanese Patent No. 3063427 or JP7 (1995)-142867.

Furthermore, a multi-layered composite wiring substrate for enhancing the thermal conductivity of a base material itself is disclosed in JP9 (1997)-270584A, JP8 (1996)-125291A, JP8 (1996)-288596A, JP10 (1998)-173097A, etc. This multi-layered composite substrate is formed by mixing a thermosetting resin such as an epoxy resin and an inorganic filler having an excellent thermal conductivity (for example, a ceramic powder, etc.) to make a composite. This substrate can contain an inorganic filler with high density, so that the thermal conductivity can be enhanced. Furthermore, by selecting a suitable inorganic filler, for example, the dielectric constant, the coefficient of thermal expansion, or the like, can be controlled suitably.

On the other hand, in developing the high density mounting of the substrate, the formation of a fine wiring pattern is important. A generally used method for forming the wiring pattern in the multi-layered ceramic wiring substrate includes, for example, a screen printing of a thick film conductive paste onto the ceramic substrate followed by firing for hardening. However, in this screen printing method, it is said that the mass production of wiring patterns having a line width of 100 $\mu$m or less is difficult.

Furthermore, in a usual printing wiring substrate, for example, a wiring pattern is formed by a subtractive method. In this subtractive method, the wiring pattern is formed by chemically etching a copper foil having a thickness of about 18 to 35 µm. Also in this case, it is said that the mass production of the wiring patterns having a line width of 75 µm or less is difficult. In order to make the wiring pattern finer, the copper foil is required to be thin.

Furthermore, in the subtractive method, since the wiring pattern is projected to the surface of the substrate, it is difficult to mount a solder or conductive adhesives, etc. for an electric connection on the bump formed on a semiconductor device. Furthermore, the bump moves to a place between the wiring patterns, which may lead to a short circuit. Furthermore, the projected wiring patterns may damage the sealing with a sealing resin in a later process.

In addition, in the printing wiring pattern by the build-up method, besides the subtractive method, an additive method tends to be employed. By the additive method, wiring patterns are plated selectively on the surface of a substrate on which resist is formed. This allows the formation of wiring patterns having a line width of about 30 µm. However, the additive method has a problem in that the adhesive strength of the wiring patterns to the substrate is lower as compared with the subtractive method.

A method is proposed in which fine wiring patterns that have been formed beforehand are subjected to a pattern test, and only excellent wiring patterns are transferred to the desired substrate. For example, U.S. Pat. No. 5,407,511 discloses a method in which a fine wiring pattern that has been formed beforehand on the surface of a carbon plate is formed by printing or firing, and then transferred to a ceramic substrate. Furthermore, JP10(1998)-84186A, and JP10(1998)-41611 disclose a method of transferring a copper foil wiring pattern that has been formed on a mold release support plate to a prepreg. Similarly, JP11(1999)-261219A discloses a method of transferring a copper foil wiring pattern to the mold release support plate formed of a copper foil via a peel layer made of nickel-phosphorus alloy. Furthermore, JP8(1996)-330709A discloses a method of transferring a copper foil wiring pattern to a substrate by utilizing a difference in adhesive degree between a roughened surface and a bright surface.

In the wiring patterns transferred by such transferring methods, a wiring pattern is embedded in the surface of the substrate, so that the substrate surface becomes flat and can avoid the problem due to the projection of the wiring pattern. Furthermore, JP10(1998)-190191A discloses an effect of compressing a conductive via paste to be filled in through holes by an amount of the thickness of the wiring pattern when the wiring pattern is embedded in the surface of the substrate.

In recent years, a further fining of the wiring pattern is demanded. However, it is difficult to form a finer wiring pattern on the mold release support plate by conventional techniques for transferring the wiring pattern. Namely, for example, when a copper foil adhered to the mold release support plate is formed into a pattern, if the adhesive strength of the copper foil with respect to the mold release support plate is weak, the fine wiring pattern is peeled off in a chemical etching process. On the contrary, in a case where the adhesive strength is strong, after the transfer of the wiring pattern to the substrate, when the mold release support plate is peeled off, the wiring pattern is peeled off together. Furthermore, there is also a method in which the surface of the copper foil is roughened so as to make the adhesive strength between the copper foil and the substrate stronger than the adhesive strength between the copper foil and the release molding support plate, thereby transferring the copper foil onto the substrate. However, with this method, it is difficult to form a fine wiring pattern.

Furthermore, in sintering the conductive paste containing a conductive powder, unlike a metal layer such as a copper foil, the electric conductivity is poor, which may lead to a problem about a trend toward a high frequency in the future.

On the contrary, conventionally, it was difficult to form a ceramic multi-layered substrate in which a wiring pattern is formed of a metal foil such as a copper foil, etc. because the formation of a wiring pattern by the use of a metal foil on a green sheet without damaging the property of the green sheet is difficult.

Furthermore, in a production method of the resin based printing wiring pattern, conventionally, a general method is to laminate layers sequentially. A plurality of press processes are needed. Therefore, in order to realize an accurate interlayer connection, complicated steps for correcting hardening and shrinkage occurring in each press process cannot be avoided.

Furthermore, for the purpose of solving the problem of the thermal conductivity of the resin printing wiring substrate, or for forming a capacitor with a capacitance on the resin multi-layered substrate, a laminated structure itself of a resin printing wiring substrate and a ceramic substrate has been proposed. However, in fact, since damages such as cracks are generated mainly in the ceramic layer through the laminating process etc., it was difficult to realize this structure.

SUMMARY OF THE INVENTION

It is an object of the present invention to provide a wiring pattern formation and transfer material, which transfers a fine wiring pattern to a substrate, more particularly, to a wiring pattern formation and transfer material capable of transferring a fine wiring pattern to a substrate easily and reliably and at a low cost.

In addition, in order to advance the high density mounting, it is important not only to make a wiring pattern to be fine but also to form and mount circuit components connecting to a wiring pattern. Conventionally, a passive component such as an inductor, a capacitor, a resistor, or the like, is mounted generally on the surface of the substrate. And it was difficult to incorporate such passive components into the substrate. Therefore, there was a limitation to high density mounting.

For example, in the conventional method disclosed in the above-mentioned official gazettes, etc., the pattern formed on the transfer material is only a wiring portion such as a copper foil. In order to enhance the mounting density, a method of mounting the passive components in a form of a chip can be proposed. However, in embedding the passive components, etc. into the substrate, there arise some problems of breakage of line between the wiring pattern and the connection portion, the dislocation of chip, and the like.

It is another object of the present invention to provide a wiring pattern formation and transfer material for incorporating a fine wiring pattern or circuit components into a circuit substrate, more specifically, a wiring pattern formation and transfer material capable of mounting a circuit component etc. on the circuit substrate accurately and at a low cost.

It is a further object of the present invention to provide a wiring pattern on which a wiring pattern and circuit components are formed by the use of a wiring pattern formation and transfer material or a wiring pattern and circuit component formation and transfer material.

In order to achieve the above-mentioned object, a transfer material according to the first configuration of the present invention includes at least three layers of a first metal layer as a carrier, a second metal layer as a wiring pattern, and a peel layer that is sandwiched between the first metal layer and the second metal layer and allows the first metal layer and the second metal layer to be adhered releasably, wherein a convex portion corresponding to the wiring pattern is formed on the surface portion of the first metal layer, and the peel layer and the second metal layer are formed on a region of the convex portions.

A transfer material according to the second configuration of the present invention includes a transfer material including at least two layers, a first metal layer as a carrier, and a second metal layer as a wiring pattern, wherein a circuit component is formed on the first metal layer by a printing method for electrically connecting to the second metal layer.

Furthermore, in order to achieve the object, a first method for producing a transfer material of the present invention includes forming a peel layer on a first metal layer, forming a second metal layer on the peel layer, and etching the second metal layer, the peel layer and the surface portion of the first metal layer by a chemical etching process, thereby forming the second metal layer and the peel layer into the wiring pattern, and at the same time, forming a convex and concave portion having a convex portion corresponding to the wiring pattern on the surface portion of the first metal layer.

With the transfer material of the second configuration, it is possible to form circuit components such as an inductor, a capacitor, and a resistor, etc. by printing in one process. In particular, the formation of the resistor becomes easy. Moreover, the circuit components are not necessarily limited to these passive materials, and an active component such as a semiconductor chip, etc. can be formed.

Furthermore, mounting of the circuit components by using a solder etc. becomes unnecessary, thus simplifying a mounting process. Furthermore, since the soldering connection is reduced, the reliability of the wiring substrate can be improved. Furthermore, since the circuit components are formed on the transfer material by printing, as compared with the case where component chips are mounted by soldering, the height of the circuit components can be reduced, thus facilitating the transfer while embedding the components into the substrate and the integration of the components into the substrate. Furthermore, the circuit components can be placed freely, for example, it is possible to make the wiring distance from the circuit components to the integrating capacitor, etc. the shortest, thereby improving the high frequency property.

Furthermore, in the transfer material of the second configuration, after transfer, by forming new second metal layer or wiring pattern or component pattern on the first metal layer that is a peeled carrier, it is possible to reuse the first metal layer. And the configuration of the wiring pattern is not particularly limited. Therefore, low cost can be realized, and furthermore, it is useful from the viewpoint of industrial applicability.

Furthermore, a first method for producing a transfer material of the present invention includes forming a second metal layer into a wiring pattern on the first metal layer, and forming a circuit component by a printing method for electrically connecting to the second metal layer.

Furthermore, a second method for producing a transfer material of the present invention includes forming a peel layer and a second metal layer on a first metal layer, processing the second metal layer and the peel layer into a wiring pattern, and forming a circuit component by a printing method on the second metal layer for electrically connecting the second metal layer.

The second metal layer that is a wiring pattern can be formed directly on the first metal layer that is a carrier by a plating method, an evaporation method, a sputtering method, or the like. At the formation of the second meat layer, similarly, a thin resistor film can be formed by a sputtering method, and the like.

Furthermore, a third method for producing a transfer material of the present invention includes an electrically insulating substrate, and a wiring pattern formed on at least one principal plane of the electrically insulating substrate by a transfer method by the use of the transfer material according to the first configuration, wherein the wiring pattern is formed in the concave portion formed on the principal plane.

Furthermore, a wiring substrate according to the second configuration of the present invention has an inner via hole structure in which a plurality of wiring substrates are laminated, wherein at least one layer has a wiring substrate according to the first configuration.

Furthermore, a wiring substrate according to the third configuration of the present invention includes an electrically insulating substrate, and a wiring pattern and a circuit component that are formed on at least one principal plane of the electrically insulating substrate by a transfer method by the use of the transfer material according to the second configuration, wherein the circuit component is electrically connected to the wiring pattern, and the circuit component and the wiring pattern are embedded in the principal plane.

Furthermore, a wiring substrate according to the fourth configuration of the present invention has an inner via hole structure in which a plurality of wiring substrates are laminated, wherein at least one layer has a wiring substrate according to the third configuration.

Furthermore, a first method for producing a wiring substrate of the present invention using the transfer material according to the first configuration includes pressing the side of the transfer material where the wiring pattern metal layer including at least a second metal layer is formed onto at least one principal plane of an uncured base material sheet, and peeling off a first metal layer adhered to the second metal layer from the second metal layer, thereby transferring the wiring pattern metal layer to the base material sheet.

Furthermore, a second method for producing a wiring substrate of the present invention includes providing a ceramic sheet with a through hole, placing a constrained sheet, having an inorganic composition that substantially is not sintered nor shrunk at the firing temperature of the ceramic sheet as a main component, on both surfaces of the ceramic sheet provided with a through hole, firing the ceramic sheet together with the constrained sheet, after firing, removing the constrained sheet, filling the through hole with a thermosetting conductive composition so as to form a ceramic substrate having a via conductor, pressing the side where the wiring pattern metal layer including at least a second metal layer is formed of the transfer material according to the first configuration onto at least one principal plane of an uncured base material sheet including a thermosetting resin composition, peeling off the first metal layer adhered to the second metal layer via the peel layer from the second metal layer, thereby transferring the wiring pattern metal layer to the base material sheet, providing a base material sheet including the thermosetting resin composition with a through hole before or after the transfer, filling the through hole with a conductive composition so as to form a composite wiring substrate having a via conductor, laminating the ceramic substrate and the composite wiring substrate, and heating and pressing the laminate so as to form a multi-layered wiring substrate.

Furthermore, a third method for producing a wiring substrate of the present invention using the transfer material according to the second configuration includes: pressing the side of the transfer material where the wiring pattern metal layer including at least a second metal layer is formed onto at least one principal plane of an uncured base material sheet, and peeling off the first metal layer, thereby transferring at least the second metal layer and the circuit component to the base material sheet.

Furthermore, a fourth method for producing a wiring substrate of the present invention includes providing a ceramic sheet with a through hole, placing a constrained sheet, having an inorganic composition that substantially is not sintered nor shrunk at the firing temperature of the ceramic sheet as a main component, on both surfaces of the ceramic sheet provided with a through hole, firing the ceramic sheet together with the constrained sheet, after firing, removing the constrained sheet, filling the through hole with a thermosetting conductive composition so as to form a ceramic substrate having a via conductor, pressing the side where the wiring pattern metal layer including at least a second metal layer is formed of the transfer material according to the second configuration onto at least one principal plane of an uncured base material sheet including a thermosetting resin composition, peeling off the first metal layer adhered to the second metal layer via the peel layer from the second metal layer, thereby transferring the wiring pattern metal layer to the base material sheet, providing a base material sheet including the thermosetting resin composition with a through holes before or after the transfer, filling the through hole with a conductive composition so as to form a composite wiring substrate having a via conductor, laminating the ceramic substrate and the composite wiring substrate, and heating and pressing the laminate so as to form a multi-layered wiring substrate.

With the transfer material of the second configuration, it is possible to transfer the circuit components onto any of the layers of the multi-layered substrate, and further the components can be placed freely. Therefore, the degree of freedom in designing the electric circuit is radically improved.

BRIEF DESCRIPTION OF THE DRAWINGS

FIGS. 22A to 22G' are cross-sectional views schematically showing a process for producing a multi-layered circuit component using the fourth transfer material of the present invention.

FIGS. 23A to 23H are cross-sectional views schematically showing a process for producing a multi-layered circuit component using the fifth transfer material of the present invention.

FIGS. 24A to 24H are cross-sectional views schematically showing an outline process for producing a multi-layered circuit component using the sixth transfer material of the present invention.

FIGS. 26A' to 26C' are cross-sectional views showing each layer of the multi-layered circuit substrate produced by the process shown in FIGS. 26A to 26C.

DESCRIPTION OF THE PREFERRED EMBODIMENTS

Hereinafter, the present invention will be described more specifically with reference to embodiments.

First Embodiment

Figure 1:
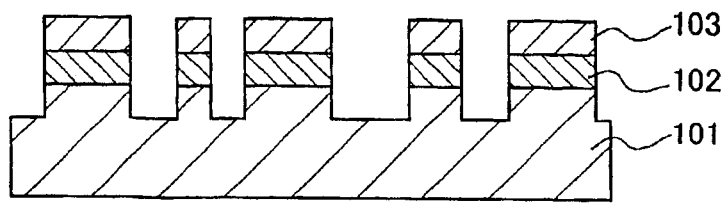
FIG. 1 is a cross-sectional view showing a schematic configuration of a wiring pattern formation and transfer material (hereinafter, a transfer material will be referred to) (a first transfer material) according to a first embodiment of the present invention.

One example of a wiring pattern formation and transfer material according to a first embodiment of the present invention (hereinafter, a first transfer material will be referred to) is described. FIG. 1 is a cross-sectional view showing a schematic configuration of the first transfer material.

As shown in FIG. 1, the first transfer material includes a first metal layer 101 having a concave and convex portion (for example, the height of the convex portion is about 1 to 12 $\mu$m) on a surface portion thereof. The convex portion of the first metal layer 101 corresponds to a wiring pattern. A peel layer 102 made of an organic layer or a metal plating layer and a second metal layer 103 are formed on the convex portions. Namely, the first transfer material has a three-layered structure in which the first metal layer 101 is adhered to the second metal layer 103 with the peel layer 102 sandwiched therebetween.

In the first transfer material, the second metal layer 103 is a wiring-pattern and the first metal layer 101 serves as a carrier for transferring the wiring pattern to a substrate. The first metal layer 101 transfers the second metal layer 103 that is a wiring pattern to the substrate, and then the first metal layer 101 is peeled off from the substrate together with the peel layer 102.

For example, a method for producing the first transfer material includes the steps of:

(a) forming a three-layered structure by forming the second metal layer containing the same metal component as that contained in the first metal layer on the first metal layer with the peel layer made of an organic layer or a metal plating layer sandwiched between the first and second metal layers; and (b) processing not only the second metal layer and the peel layer but also the surface portion of the first metal layer into the wiring pattern by a chemical etching process, thus to form a concave and convex portion on the surface portion of the first metal layer.

With this production method, it is possible to form the second metal layer into a fine wiring pattern by a chemical etching process such as photolithography, etc. Furthermore, since a metal foil forming the wiring pattern (second metal layer) contains the same material as that contained in the metal foil forming a carrier (first metal layer), it is possible to form the convex and concave portion having the same pattern as the wiring pattern of the second metal layer on the first metal layer that forms the carrier in one etching process.

Furthermore, in the first transfer material of this embodiment, the same transfer material can be reproduced by reusing the first metal layer peeled off after use, and by forming the second metal layer having the same shape as the convex portion of the first metal layer on the first metal layer with the peel layer such as a plating layer etc. sandwiched between the first and second metal layers. The first metal layer also can be reused for the other applications of use, for example, for a pattern formation material for a letterpress printing method. Therefore, since the first transfer material of this embodiment can make effective use of resources, it is advantageous from the viewpoint of saving resources and reducing waste. The same is true in the second and third transfer materials described in the other embodiments.

Moreover, it is also possible to form circuit components such as an inductor, a capacitor, a resistor, a semiconductor device, or the like, for electrically connecting to the wiring pattern of the transfer material of this embodiment, and to transfer them to the substrate together with the wiring pattern. It is preferable that the passive components such as inductor, capacitor, and resistor, etc. are formed on the substrate by a printing method, for example a screen printing method.

Second Embodiment

Figure 2:
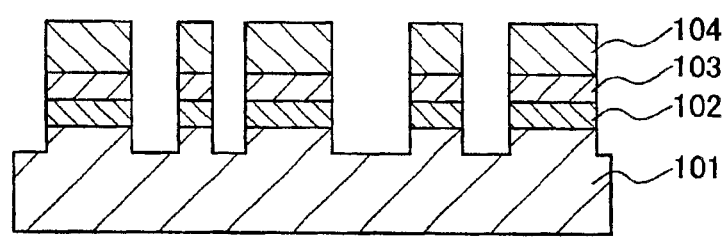
FIG. 2 is a cross-sectional view showing a schematic configuration of a transfer material (a second transfer material) according to a second embodiment of the present invention.

One example of a transfer material according to a second embodiment of the present invention (hereinafter, a second transfer material will be referred to) is described. FIG. 2 is a cross-sectional view showing a schematic configuration of the second transfer material.

As shown in FIG. 2, the second transfer material includes a first metal layer 101 having a concave and convex portion on a surface portion thereof. The convex portion corresponds to a wiring pattern. The second transfer material has a four-layered structure in which a peel layer 102 made of an organic layer or a metal plating layer and a second metal layer 103 are formed on the convex portion, and further a third metal layer 104 is formed on the second metal layer 103. The first metal layer 101 is adhered to the second metal layer 103 with the peel layer 102 sandwiched therebetween.

In the second transfer material, the second metal layer 103 and the third metal layer 104 make a two-layered wiring pattern and the first metal layer 101 serves as a carrier for transferring the wiring pattern to the substrate. Therefore, the first metal layer 101 transfers the second metal layer 103 and the third metal layer 104, which are the wiring patterns, to the substrate, and then is peeled off from the substrate together with the peel layer 102.

For example, a method for producing the second transfer material includes steps of:

(a) forming a three-layered structure by forming the second metal layer containing the same metal component as that contained in the first metal layer on the first metal layer with the peel layer made of an organic layer or a metal plating layer sandwiched between the first and second metal layers;

(b) forming a plating resist on an arbitrary region on the second metal layer so as to make an exposed region that is not covered with the plating resist into a wiring pattern;

(c) forming the third metal layer made of a plating layer on the exposed region of the wiring pattern on the surface of the second metal layer by pattern plating;

(d) forming the third metal layer into the convex portion of the wiring pattern on the second metal layer by peeling off the plating resist; and (e) selectively removing, by a chemical etching process, the second metal layer, the peel layer, and the upper part of the first metal layer of the region in which the third metal layer is not formed.

In this producing method, when the same metal component as the second metal layer is used for the third metal layer, for example, when a copper plating layer (third metal layer) is formed on the copper foil (second metal layer), it is possible to form the second and third metal layers into a fine wiring pattern for the reason as mentioned in the first embodiment and further because an additive method is employed.

Furthermore, since the second metal layer and the peel layer are thinner than the third metal layer, they can be removed in a short-time etching. Basically, the third metal layer can be maintained with the thickness of the third metal layer hardly reduced. Therefore, the thickness of the wiring pattern can be controlled freely.

On the other hand, when a metal different from that of the second metal layer is used for the third metal layer, for example, when a gold (third metal layer) is formed on the copper foil (second metal layer) by pattern plating, the third metal layer serves as an etching resist. Therefore, it is possible to remove selectively the second metal layer, the peel layer, and the upper surface of the first metal layer on the region in which the third metal layer having the wiring pattern is not formed. Furthermore, when gold is used for the third metal layer, the top layer of the wiring pattern of the transfer material is gold. Therefore, when for example, a bare chip, a bare SAW (Surface Acoustic Wave) filter, or the like is flip-chip mounted on the wiring pattern, a low resistance and stable connection can be realized. Moreover, the same effect can be obtained when silver is used for the third metal layer.

Moreover, it is preferable in the production method that before the third metal layer is formed on the second metal layer, the surface of the second metal layer is roughened. The term "before the third metal layer is formed" means that before the plating resist as a mask for forming the wiring pattern is formed on the second metal layer, or before the third metal layer is formed along the wiring pattern on the second metal layer on which masking is performed in the wiring pattern. In this way, when the surface of the second metal layer is roughened, the adhesion between the second metal layer and the third metal layer is improved.

It is preferable in the production method that the third metal layer is formed on the second metal layer by electrolytic plating. When the third metal layer or the metal layer for forming a wiring pattern is formed by electrolytic plating, appropriate adhesion can be obtained on the adhering surface between the second metal layer and the third metal layer. Furthermore, even if, for example, the etching process, etc. is carried out, no gap occurs between the metal layers, so that an excellent wiring pattern can be formed. On the other hand, the pattern may be formed by masking the wiring pattern after the third metal layer is formed on the second metal layer by panel plating. This case provides an effect of preventing the surface oxidization of the second metal layer after transfer and improving the soldering wettability.

It is preferable in the production method that the second and third metal layers as well as the surface of the first metal layer are processed into the wiring pattern by a chemical etching process.

For the same reason as mentioned above, it is preferable in the production method that the second metal layer includes at least one metal selected from the group consisting of copper, aluminum, silver and nickel, particularly, copper. It is desirable that the first metal layer includes the same metal component as the second metal component because the convex portion having the same shape as that of the wiring pattern (second metal layer) is formed on the surface of the first metal layer, because a convex portion having the same shape as the wiring pattern (second metal layer) is formed on the surface of the first metal layer when the second metal layer is etched by a chemical etching process. In particular, the first and second metal layers are formed of a copper foil, and more preferably, an electrolytic copper foil.

The method for producing the first and second metal layers is not particularly limited. For example, the well-known method for producing metal foil can be employed.

For a treatment for roughening the surface, for example, a blackening treatment, a soft etching treatment, a sandblast treatment, and the like, can be employed.

Moreover, it is also possible to form circuit components such as an inductor, a capacitor, a resistor, a semiconductor device, or the like, for electrically connecting to the wiring pattern of the transfer material of this embodiment, and to transfer them to the substrate together with the wiring pattern. It is preferable that the passive components such as inductor, capacitor, and resistor, etc. are formed on the substrate by a printing method, for example a screen printing method.

Third Embodiment

Figure 3:
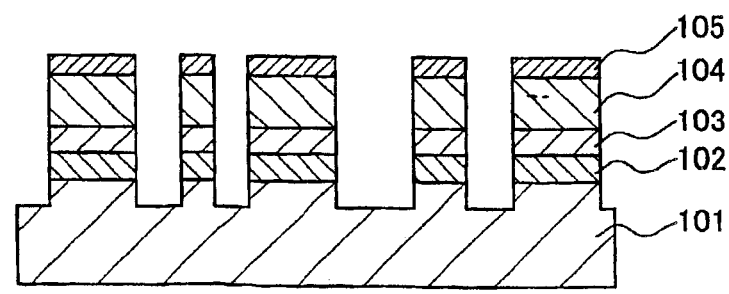
FIG. 3 is a cross-sectional view showing a schematic configuration of a transfer material (a third transfer material) according to a third embodiment of the present invention.

One example of a transfer material according to a third embodiment of the present invention (hereinafter, a third transfer material will be referred to) is described. FIG. 3 is a cross-sectional view showing a schematic configuration of the third transfer material.

As shown in FIG. 3, the third transfer material includes a first metal layer 101 having a concave and convex portion on a surface portion thereof. The convex portion corresponds to a wiring pattern. The third transfer material has a five-layered structure in which a peel layer 102 made of an organic layer or a metal plating layer and a second metal layer 103 are formed on the convex portion, further a third metal layer 104 is formed thereon, and further a fourth metal layer 105 is formed thereon. The first metal layer 101 is adhered to the second metal layer 103 via the peel layer 102.

In the third transfer material, the second metal layer 103, the third metal layer 104 and the fourth metal layer 105 make a three-layered wiring pattern. The first metal layer 101 serves as a carrier for transferring the wiring pattern to the substrate. The first metal layer 101 transfers the second metal layer 103, the third metal layer 104 and the fourth metal layer 105, which serve as the wiring pattern, to the substrate, and then is peeled off from the substrate together with the peel layer 102.

For example, a method for producing the third transfer material includes the steps of:

(a) forming a three-layered structure by forming the second metal layer containing the same metal component as the first metal layer on the first metal layer with a peel layer sandwiched between the first and second metal layers;

(b) forming a plating resist on an arbitrary region on the second metal layer so as to make an exposed region that is not covered with the plating resist into a wiring pattern;

(c) forming the third metal layer made of a plating layer on the exposed region of the wiring pattern on the surface of the second metal layer;

(d) on the third metal layer, forming a fourth metal layer of a metal component that is different from the components of the first to third metal layers and that is chemically stable with respect to an etching liquid corroding the first to third metal layers;

(e) forming the third and fourth metal layers into a convex portion of the wiring pattern by peeling off the plating resist; and (f) selectively removing the second metal layer, the peel layer, and the upper part of the first metal layer of the region in which the third and fourth metal layers are not formed by a chemical etching process.

With this production method, it is possible to form a fine wiring pattern for the reason as mentioned in the first embodiment and further because an additive method is employed. Furthermore, the thickness of the wiring pattern can be controlled freely.

It is preferable in the production method that before the third metal layer is formed on the second metal layer, the surface of the second metal layer is roughened. The term "before the third metal layer is formed" means that before the plating resist for forming the wiring pattern is formed on the second metal layer, or before the third metal layer is formed along the wiring pattern on the second metal layer on which masking is performed in the wiring pattern. In this way, when the surface of the second metal layer is roughened, the adhesion between the second metal layer and the third metal layer is improved.

It is preferable in the production method that the third metal layer is formed on the second metal layer by electrolytic plating. When the third metal layer or the metal layer for forming the wiring pattern is formed by electrolytic plating, appropriate adhesion can be obtained on the adhering surface between the second metal layer and the third metal layer. Furthermore, even if, for example, the etching process etc. is carried out, no gap occurs between the metal layers, so that an excellent wiring pattern can be formed.

On the other hand, the pattern may be formed by masking on the wiring pattern after the third metal layer is formed on the second metal layer by panel plating. This case provides an effect of preventing the surface oxidation of the second metal layer after transfer and improving the soldering wettability.

Furthermore, it is preferable in the production method that the fourth metal layer is formed on the third metal layer by electrolytic plating. It is preferable that as a material for the fourth metal layer, by selecting a component that is different from the components of the first to third metal layers, that is, a metal component chemically stable with respect to an etching liquid corroding the first to third metal layers, the second, third, and fourth metal layers can be processed into the wiring pattern together with the surface portion of the first metal layer without reducing the thickness even in the chemical etching process of the step (f).

For the same reason mentioned above, it is preferable in the production method that the second and third metal layers include at least one metal selected from the group consisting of copper, aluminum, silver and nickel, particularly, copper. It is desirable that the first metal layer contains the same metal component as the component contained in the second metal component because a convex portion having the same shape as the wiring pattern (second metal layer) is formed on the surface of the first metal layer when the second metal layer is etched by a chemical etching process. In particular, these metal layers are formed of a copper foil, more preferably, an electrolytic copper foil. On the other hand, a preferable example of the fourth metal layer includes, for example, a plating layer of Ag, Au, or the like, having chemical stability and the low resistance property.

The method for producing the first and second metal layers is not particularly limited. For example, the well-known method for producing a metal foil can be employed.

For a treatment for roughening the surface, for example, a blackening treatment, a soft etching treatment, a sandblast treatment, and the like can be employed.

Moreover, it is preferable in the above-mentioned first, second, and third transfer materials of the first to third embodiments that the adhesive strength between the first metal layer and the second metal layer via the peel layer is weak, for example, 50 N/m (gf/cm) or less. As the peel layer, an organic layer having adhesive strength and a thickness of much thinner than 1 $\mu$m can be used. An example of the peel layer includes an urethane resin, an epoxy resin, a phenol resin, and the like. However, the peel layer is not necessarily limited thereto, and other resin such as a thermoplastic resin can be used. However, the peel layer having a thickness of 1 $\mu$m or more deteriorates the peeling property, which may make the transfer difficult.

Furthermore, in order to lower the adhesiveness in the first to third transfer materials intentionally, a plating layer may be interposed as the peel layer. A metal plating layer having a thickness of much thinner than 1 $\mu$m, for example, a nickel plating layer, a nickel-phosphorous alloy layer, an aluminum plating layer, a chrome plating layer, or the like, can be interposed between the copper foils (first and second metal layers) so as to provide a peeling property. This facilitates peeling off the second metal layer from the first metal layer after the second metal layer is transferred to the substrate, thus transferring only the second metal layer to the substrate. A suitable thickness of the peel layer formed of the metal layer is about 100 nm to 1 $\mu$m. Since the cost of the process is increased with the increase in thickness, the thickness is desirably less than 1 $\mu$m.

Furthermore, in the first to third transfer materials, if the peel layer intentionally is formed by Au plating so that it can be peeled off from the first metal layer easily, when the first metal layer is peeled off from the substrate after transfer the peel layer remains on the surface of the second metal layer of the wiring pattern. Thus, a wiring pattern whose surface is Au plating treated can be obtained. The wiring pattern exhibits an excellent FC mounting (flip-chip mounting) property, components mounting property, and the like.

Furthermore, it is preferable in the first to third transfer materials that the first metal layer includes at least one metal selected from the group consisting of copper, aluminum, silver and nickel, and particularly preferably copper. It is preferable that the second metal layer, as in the first metal layer, includes at least one metal selected from the group consisting of copper, aluminum, silver and nickel, and particularly preferably, copper. Moreover, the metals may be one kind, or may be two kinds or more.

Furthermore, it is preferable in the first to third transfer materials that the first metal layer includes the same metal component as the second metal because two-layered structure of metal layers are processed at the same time when, for example, an etching process is carried out. In this case, since there is no difference in the coefficient of thermal expansion between the first metal layer and the second metal layer, the pattern distortion is not likely to occur when heating. Therefore, it is suitable for the transfer of the fine wiring pattern. When the plating layer is used for the peel layer, desirably, a copper etching liquid can be used for processing. However, the kinds of metal are not particularly limited as long as the first and the second meals include the same materials. However, preferably they are formed of a copper foil, and more preferably an electrolytic copper foil because of its excellent conductivity. Moreover, the metals may be one kind, or may be two kinds or more.

Furthermore, in the first to third transfer materials, the average roughness (Ra) of the center line of the surface of the second metal layer is 2 μm or more, and more preferably 3 μm or more. In the first transfer material, when the average roughness (Ra) of the center line of the surface is less than 2 μm, the adhesion with respect to the substrate to be transferred may be insufficient. On the other hand, in the second and third transfer materials, when the average roughness (Ra) of the center line of the surface is less than 2 μm, the adhesion between the metal layers forming the multi-layered wiring pattern may become insufficient, and the etching liquid may enter the gap between the metal layers so as to make the wiring pattern deficient.

Furthermore, in the first to third transfer materials, the thickness of the second metal layer is preferably 1 to 18 μm, and more preferably 3 to 12 μm. When the thickness is less than 3 μm, when the second metal layer is transferred to the substrate, an excellent electric conductivity may not be exhibited. On the contrary, when the thickness is 18 μm or more, it may be difficult to form a fine wiring pattern.

Furthermore, in the first to third transfer materials, the thickness of the first metal layer is preferably 4 to 40 μm, and more preferably 20 to 40 μm. The first metal layer serves as a carrier, and at the same time has a structure in which the surface layer portion is etched like the wiring layer so as to have a convex and concave portion. Therefore, the first metal layer is desired to have a sufficient thickness. Furthermore, since the first to third transfer materials have a carrier made of a metal layer (first metal layer), they exhibit the sufficient mechanical strength or thermal resistance with respect to the thermal distortion or stress distortion in the direction of the plane, which are generated at the time of transfer.

The total thickness of the first to third transfer materials is preferably 40 to 150 μm, and more preferably 40 to 80 μm. Furthermore, the line width of the wiring pattern generally is required to be about up to 25 μm, as a fine line width. Also in the present invention, such a line width is preferable.

Moreover, it is also possible to form circuit components such as an inductor, a capacitor, a resistor, a semiconductor device, or the like, for electrically connecting to the wiring pattern of the transfer material of this embodiment and to transfer them to the substrate together with the wiring pattern. It is preferable that the passive components such as inductor, capacitor, and resistor, etc. are formed on the substrate by a printing method, for example a screen printing method.

Fourth Embodiment

In this embodiment, a method for producing the wiring substrate using the various kinds of wiring pattern formation and transfer materials of the present invention (first to third transfer materials), and a wiring substrate produced by the production method will be described.

The following are two methods for producing the wiring substrate using the transfer materials according to the present invention.

A first method includes the following steps:

(h) preparing at least one of the first to third transfer materials described in the first to third embodiments and placing the material(s) so that the wiring layer side (side on which the second metal layer etc. is formed) of the material is in contact with at least one surface of a base material sheet (a material for the substrate) so as to adhere thereto, and (i) transferring only the wiring layer to the base material sheet by peeling off the first metal layer from the transfer material.

Thus, it is possible to produce a wiring substrate on which fine wiring patterns are formed in the concave portion on the base material sheet. Furthermore, since the wiring portion of this wiring substrate has a concave shape, this concave portion can be used for positioning. This configuration is excellent in, for example, the flip chip mounting etc. of a semiconductor.

Furthermore, the second production method is a method for producing a multi-layered substrate and includes a step for laminating two or more of the wiring substrates produced by the first production method. The first production method enables the transfer formation of the wiring pattern at a low temperature of 100° C. or less. Therefore, in any cases where a ceramic green sheet is used or where a thermosetting resin sheet is used for the base material sheet, it is possible to keep the sheet uncured even after the wiring pattern is transferred. This allows a thermal curing and shrinking of the uncured wiring substrates together at a time after the uncured wiring substrates are laminated. Therefore, unlike a conventional method for producing a multi-layered substrate repeating the process in which the wiring substrate is laminated and subjected to a curing and shrinking treatment one by one, the method for producing this embodiment has an advantage in that it is not necessary to correct the curing and shrinking with each layer. Therefore, the steps can be simplified.

This method allows the formation of a multi-layered wiring substrate having fine wiring patterns. However, in the multi-layered wiring substrate, the wiring patterns formed on the wiring substrate of the inside layer are not required to have a concave shape. Therefore, with a transfer material for forming this wiring pattern, the surface portion of the first metal layer is not necessarily formed in a concave and convex shape and may be flat. In this case, for example, by controlling the time of the chemical etching process in the formation of the wiring pattern, it is possible to stop the process at the stage in which the peel layer is etched so as not to etch the first metal layer. Furthermore, when the peel layer is made of a plating layer containing Ni, by using a base solution obtained by adding ammonium into copper chloride as an etching liquid, it is possible to remove only the copper foil (wiring pattern) by an etching process and to remain the peel layer. This transfer material does not have a problem in the transfer because a carrier copper foil (first metal layer) is peeled off after being pressed onto the substrate, and the plating layer that is a peel layer also is peeled off together.

Furthermore, when the first transfer material is used, by pressing the first transfer material onto the base material sheet (a material for the substrate), the convex portions of the second metal layer and the first metal layer are embedded in the base material sheet. Thereafter, the first metal layer is peeled off, and then the wiring substrate has a concave portion on the surface and the wiring layer made of the second metal layer at the bottom of the concave portion.

Furthermore, when the second transfer material is used by pressing the second transfer material onto the base material sheet, for example, after the entire part of the second and third metal layers and the convex portion of the first metal layer are embedded in the base material sheet, the first metal layer is removed. This allows the production of the two-layered wiring substrate having a concave portion of a depth that is substantially the same as a thickness of the convex portion of the first metal layer, and the second and third metal layers formed on the bottom of the concave portion.

Similarly, when the third transfer material is used, for example, after the entire part of the second, third and fourth metal layers and the convex portion of the first metal layer are embedded in the base material sheet, the first metal layer is removed. This allows the production of the three-layered wiring substrate having a concave portion of the depth that is substantially the same as the thickness of the convex portion of the first metal layer, and the second, third and fourth metal layers formed on the bottom of the concave portion.

It is preferable in the method for producing the first and the second wiring substrates that the base material sheet includes an inorganic filler and the thermosetting resin composition and has at least one through hole which is filled with a conductive paste. This makes it easy to produce a composite wiring substrate for high-density mounting having an excellent thermal conductivity and having an IVH structure in which, for example, wiring patterns of the both sides of the substrate are electrically connected via the conductive paste. Furthermore, with the use of this base material sheet, in the formation of the wiring substrate, high temperature is not required, but treating may be carried out at a low temperature of, for example, about 200° C., i.e. the curing temperature of the thermosetting resin.

The base material sheet preferably contains 70 to 95 weight % of an inorganic filler and 5 to 30 weight % of a thermosetting resin, and more preferably contains 85 to 90 weight % of an inorganic filler and 10 to 15 weight % of a thermosetting resin. Since the base material sheet contains inorganic fillers with a high concentration, by changing the content of inorganic fillers, the coefficient of thermal expansion, thermal conductivity, dielectric constant, and the like, can be set arbitrarily.

It is preferable that the inorganic filler includes at least one inorganic filler selected from the group consisting of $Al_2O_3$, $MgO$, $BN$, $AlN$ and $SiO_2$. By determining the kinds of inorganic filler appropriately, it is possible to set, for example, the coefficient of thermal expansion, thermal conductivity, and dielectric constant to the desirable conditions. For example, it is possible to set the coefficient of thermal expansion of the base material sheet in the plane direction to the same level of the coefficient of thermal expansion of a semiconductor to be mounted, and to provide a high thermal conductivity.

The base material sheet using, for example, $Al_2O_3$, $BN$, $AlN$ and the like, among the inorganic fillers, is excellent in thermal conductivity. The base material sheet using $MgO$ is excellent in thermal conductivity and capable of raising the coefficient of thermal expansion. Furthermore, when $SiO_2$, particularly amorphous $SiO_2$, is used, a base material sheet having a small constant thermal expansion, a light weight and low dielectric constant can be obtained. Moreover, the inorganic filler can be used singly or by combination of two kinds or more of the inorganic fillers.

The base material sheet including the inorganic filler and the thermosetting resin composition can be produced by, for example, the following method. First, a solvent for adjusting the viscosity is added into a mixture including the inorganic filler and the thermosetting resin composition so as to prepare a slurry having a desired slurry viscosity. An example of the solvent for adjusting the viscosity includes, for example, methyl ethyl ketone, toluene, and the like.

Then, the slurry is formed into a film on a preliminarily prepared mold release film by a doctor blade method, etc. and the film is treated at a temperature below the curing temperature of the thermosetting resin so as to volatilize the solvent for adjusting the viscosity. Thereafter, the mold release film is removed so as to produce a base material sheet.

The thickness of the film at the formation is appropriately determined by the amount of the solvent for adjusting viscosity to be added. Usually the thickness ranges from 80 to 200 μm. Furthermore, the conditions for volatilizing the solvent for adjusting viscosity are appropriately determined in accordance with the kinds of solvents for adjusting viscosity, kinds of thermosetting resins, or the like. However, usually, the volatilization is carried out at a temperature of 70 to 150° C. for 5 to 15 minutes.

As the mold release film, usually, an organic film can be used. For example, it is preferable to use an organic film containing at least one resin selected from the group consisting of, for example, polyethylene, polyethylene terephthalate, polyethylene naphthalate, polyphenylene sulfide (PPS), polyphenylene terephthalate, polyimide and polyamide, and more preferably PPS.

Furthermore, another example of the base material sheet includes a reinforcer sheet impregnated with a thermosetting resin composition, and having at least one through hole filled with a conductive paste.

The reinforcer sheet is not particularly limited as long as it is a porous material capable of holding the thermosetting resin. However, it is preferable that the reinforcer sheet is at least one selected from the group consisting of a glass fiber woven fabric, a glass fiber non-woven fabric, a woven fabric of a thermal resistant organic fiber and a non-woven fabric of a thermal resistant organic fiber. An example of the thermal resistant organic fiber includes, for example, all aromatic polyamide (aramide resin), all aromatic polyester, polybutylene oxide, and the like. In particular, aramide resin is preferable. Another example of the base material sheet includes a film of polyimide etc. By using the film of polyimide etc., an excellent substrate having a fine pattern of wiring and via conductor can be obtained.

The thermosetting resin is not particularly limited. However, it is preferable that a resin contains at least one selected from the group consisting of an epoxy resin, a phenol resin, a cyanate resin and a polyphenylene phthalate resin because of its excellent thermal conductivity. Furthermore, the thermosetting resin can be used singly or by combination of two kinds or more of the thermosetting resins.

Such a base material sheet can be produced, for example, by immersing the reinforcer sheet into the thermosetting resin composition, and then drying to a half-cured state. It is preferable that the immersion is carried out so that the rate of the thermosetting resin with respect to the base material sheet is 30 to 60 weight %.

In the method for producing the multi-layered wiring substrate, it is preferable that when the base material sheet containing a thermosetting resin is used, the wiring substrates are laminated by a heating and pressing treatment so as to cure the thermosetting resin. This can be performed sufficiently at a low temperature such as 200° C., i.e., the curing temperature of the thermosetting resin.

Furthermore, another base material sheet includes a green sheet containing an organic binder, plasticizer, and ceramic powder, having at least one through hole filled with a conductive paste. This base material sheet exhibits an excellent thermal resistance and thermal conductivity.

The ceramic powder preferably contains at least one ceramic selected from the group consisting of $Al_2O_3$, $MgO$, $ZrO_2$, $TiO_2$, $BeO$, $BN$, $SiO_2$, $CaO$ and glass. More preferably, the ceramic powder is a mixture of 50 to 55 weight % of $Al_2O_3$ and 45 to 50 weight % of glass power. Moreover, the ceramic can be used singly or in combination of two kinds or more of them.

An example of the binders to be used includes, for example, polyvinyl butyrate (PVB), acrylic resin, methyl cellulose resin, and the like. An example of the plasticizer includes, for example, butyl benzyl phthalate (BBP), dibutylphthalate (DBP), and the like.

Such a green sheet containing the ceramic powder can be produced by, for example, the same method as the method for producing the base material sheet including the inorganic filler and the thermosetting resin. Moreover, the treating conditions are appropriately determined by the kinds of the component materials, etc.

It is preferable in the method for producing the multi-layered wiring pattern that when the green sheet is used for the base material sheet, the wiring substrates are laminated by heating and pressing the base materials to be adhered and by sintering the ceramic powder by firing.

The thickness of the base material sheet is usually 30 to 250 µm.

It is preferable that the base material sheet has at least one through hole and the through hole is filled with a conductive paste. The position of the through hole is not particularly limited as long as the through hole is formed so that it is in contact with the wiring pattern. However, it is preferable that through holes are positioned by equal intervals of 250 to 500 µm pitch.

The size of the through hole is not particularly limited. However, the diameter of the through hole is 100 to 200 µm, and preferably 100 to 150 µm.

The method for forming through holes is appropriately determined in accordance with the kinds of the base material sheet, etc. However, the preferable example of the method includes, for example, a carbon dioxide gas laser process, a process with a punching machine, a bulk process with a mold, etc.

The conductive paste is not particularly limited as long it has conductivity. However, usually, a resin containing a particulate conductive metal, and the like, can be used. An example of the conductive metal material to be used includes, for example, copper, silver, gold, silver-palladium, and the like. An example of the thermosetting resin includes, for example, an epoxy resin, a phenol resin, an acrylic resin, and the like. The amount of the conductive metal material in the conductive paste is usually 80 to 95 weight %. Furthermore, when the base material sheet is a green sheet, glass and an acrylic binder are used instead of thermosetting resin.

Next, the method for adhering the transfer material to the base material sheet in the step (h) and the method for peeling off the first metal layer from the second metal layer in the step (i) are not particularly limited. However, when the base material sheet includes a thermosetting resin, for example, the adhering method and the peeling method can be carried out as follows.

First, the transfer material and the base material sheet are placed as mentioned above, and heated and pressed so as to fuse and soften the thermosetting resin in the base material sheet, thus allowing the metal layer (the second metal layer, etc.) that forms the wiring pattern to be embedded in the base material sheet. Then, it is treated at a softening temperature or a curing temperature of the thermosetting resin. In the latter case, the resin is cured. This allows the transfer material and the base material sheet to be adhered and the adhesion between the second metal layer and the base material sheet to be fixed.

The conditions for heating and pressing treatment is not particularly limited as long as the thermosetting resin is not perfectly cured. However, the heating and pressing usually can be carried out under the pressure of $9.8 \times 10^5$ to $9.8 \times 10^6$ Pa (10 to 100 kgf/cm$^2$), at the temperature of 70 to 260° C. for 30 to 120 minutes.

Then, after the transfer material and the sheet substrate are adhered to each other, for example, the first metal layer that is the carrier layer is pulled so as to peel it off in the peel layer. Thereby, the first metal layer can be peeled off from the second metal layer. Namely, since the adhesive strength between the first metal layer and the second metal layer via the peel layer is weaker than the adhesive strength between the base material sheet and the second metal layer that is a wiring layer, the adhering surface between the first metal layer and the second metal layer is peeled off, and only the second metal layer is transferred to the base material sheet while the first metal layer is peeled off. Curing of the thermosetting resin may be carried out after the first metal layer is peeled off from the second metal layer.

When the base material sheet is the green sheet including a ceramic, for example, the adhering method and peeling method can be carried out as follows. The transfer material and the base material sheet are heated and pressed as mentioned above so as to allow the metal layer for forming the wiring pattern to be embedded into the base material sheet, thus adhering the base material sheet to the transfer material. Thereafter, similar to the above, forming materials of the transfer material except the wiring layer (second metal layer, etc.) are removed by peeling. Then, a constraint sheet is placed and laminated on one or both surfaces of the green sheet onto which the second metal layer forming the wiring pattern is transferred. The constraint sheet includes an inorganic composition that substantially is not sintered nor shrunk at the firing temperature of the green sheet. Thereafter, the binder removing process and firing are carried out. Furthermore, thereafter the constraint sheet is removed, and thus a ceramic substrate including the wiring pattern formed of the second metal layer etc. can be formed.

The conditions for heating and pressing when the transfer is carried out are appropriately determined in accordance with the kinds of the thermosetting resin contained in the green sheet and conductive paste. However, usually, the heating and pressing treatment is carried out under the pressure of $9.8 \times 10^5$ to $1.96 \times 10^7$ Pa (10 to 200 kgf/cm$^2$), at a temperature of 70 to 100° C. for 2 to 30 minutes. Therefore, the wiring pattern can be formed without damaging the green sheet.

The heating and pressing conditions for placing and laminating the constraint sheet including an inorganic composition that substantially is not sintered nor shrunk at the firing temperature of the green sheet is appropriately determined in accordance with the kinds of the thermosetting resin contained in the green sheet and the constraint sheet. However, usually, the conditions include a pressure of $1.96 \times 10^6$ to $1.96 \times 10^7$ Pa (20 to 200 kgf/cm$^2$), at a temperature of 70 to 100° C. for 1 to 10 minutes.

The conditions for the treatment for removing the binder are appropriately determined in accordance with the kinds of binders, metal that forms the wiring pattern, or the like. However, usually, the treatment is carried out by the use of the electric furnace at a temperature of 500 to 700° C., with temperature rising time of 10 hours, and maintaining time of 2 to 5 hours. In particular, in the case of the copper foil wiring pattern, a green sheet formed of an organic binder such as methacrylic methacrylic that is excellent in thermal deformation property is used, and the binder removing process and firing are carried out in an atmosphere of nitrogen, that is, an atmosphere of non-oxidation.

The conditions for firing are appropriately determined in accordance with the kinds of the ceramic and the like. However, usually, the firing is carried out in a belt furnace, at a temperature of 860 to 950° C. for 30 to 60 minutes in the air or an atmosphere of nitrogen.

Herein, the second production method is described. When the multi-layered substrate is produced in this method, each single layer wiring substrate that is produced by the above-mentioned method is laminated and the interlayer portion is adhered. Moreover, after a plurality of single layer substrates are laminated, the whole portion can be adhered and fixed.

For example, when a multi-layered wiring substrate produced by the use of a base material sheets including a thermosetting resin are laminated, first, similar to the above, only the wiring layer (second metal layer etc.) is transferred to the base material sheet from the transfer material so as to form a single layered wiring substrate by a heating and pressing treatment. When this wiring substrate is formed, the thermosetting resin is not subjected to the curing treatment and kept uncured. The plurality of single layer substrates are prepared and laminated. Then, this laminate is heated and pressed at a curing temperature of the thermosetting resin so as to cure the thermosetting resin, thereby adhering and fixing the place between the wiring substrates. When the heating and pressing temperature for transferring the wiring layer in the single layer wiring substrate is set to be 100° C. or less, intentionally, even after the transfer, the base material sheet can be used as a prepreg. Thus, it is possible to produce a multi-layered wiring substrate by adhering and fixing the laminate after the single layer wiring substrates are laminated instead of sequentially laminating the single layer wiring substrates.

With the use of the transfer material of the present invention, a build-up substrate having a glass-epoxy substrate etc. as a core layer can be produced by a method in which a wiring pattern is transferred to an uncured base material sheet to form it into single layered wiring substrates, and these single layered wiring substrates are sequentially laminated as in an uncured state, and the laminated substrates are cured as a whole.

Furthermore, for example, when a multi-layered substrate is produced by laminating ceramic wiring substrates using a base material sheet including a ceramic, as mentioned above, after the transfer material is pressed onto the base material sheet so as to transfer only the wiring layer (second metal layer etc), a plurality of the single layered ceramic wiring substrates are laminated and heating and pressing treatment and firing of the ceramic are carried out. Thus, the place between the wiring substrates are adhered and fixed.

The number of the laminated layers in the multi-layered wiring substrates is not particularly limited. However, the number is usually 4 to 10 layers, and as many as 20 layers is also possible. Furthermore, the total thickness of the multi-layered wiring substrate is usually 200 to 1000 $\mu$m.

The wiring substrate forming the outermost layer of the multi-layered wiring substrate is excellent in electric connection. Therefore, as mentioned above, the wiring substrate forming the outermost layer preferably has a structure in which a wiring layer (second metal layer etc.) is embedded in the concave portion of the surface thereof by the use of the transfer material of the present invention (first, second or third transfer material). Furthermore, middle layer(s) other than the outermost layer of the multi-layered wiring substrate may be a flat structure or may have a wiring layer (second metal layer, etc.) formed on the concave portion of the surface.

Hereinafter, a configuration of the wiring substrate of the present invention will be described in detail.

Figure 8:
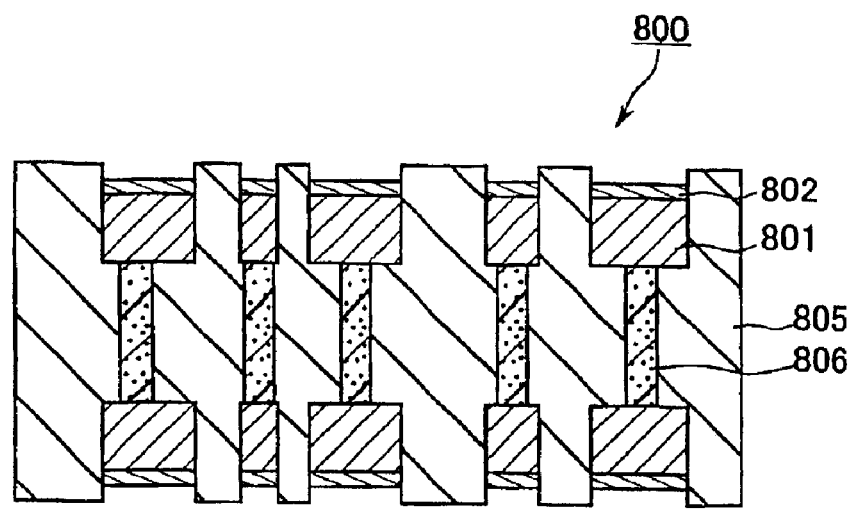
FIG. 8 is a cross-sectional view showing a schematic configuration of a ceramic wiring substrate produced by using the transfer material of the present invention.

FIG. 8 shows a wiring substrate of a first embodiment produced by using the transfer material of the present invention (first, second, or third transfer material). The wiring substrate of the first embodiment includes a wiring pattern 801 formed on a base material sheet 805. At least one surface of the base material sheet 805 is provided with at least one concave portion on the bottom of which the wiring pattern 801 is formed. Furthermore, on the wiring pattern 801, a plating layer 802 of gold etc. is formed by a plating treatment.

Figure 9:
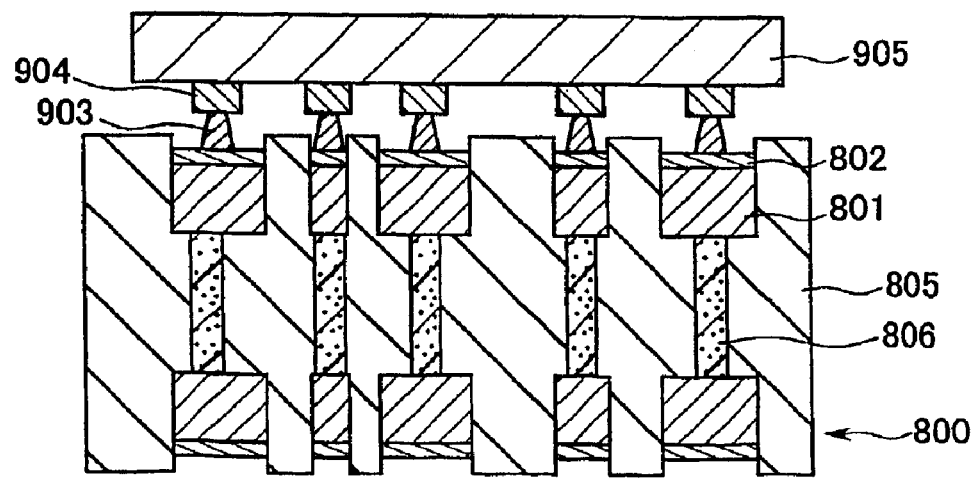
FIG. 9 is a cross-sectional view showing a schematic configuration of the ceramic wiring substrate shown in FIG. 8 on which a semiconductor chip is flip-chip mounted.

According to this configuration, when a semiconductor is flip-chip mounted on the wiring substrate, as shown in FIG. 9, the concave portion can be used for the positioning of a bump 904 formed on a semiconductor 905. Since a connection portion 903 between the semiconductor 905 and the substrate is formed on the chemically stable gold plating etc., the contacting resistance becomes smaller and the reliability can be improved. Furthermore, since the plating treatment is carried out by the use of the concave portion, it is possible to secure a creeping distance, thus maintaining the reliability of the fine wiring pattern without occurrence of the short circuit etc.

It is preferable in the wiring substrate that the thickness of the wiring pattern layer/patterns is 3 to 35 $\mu$m. When the thickness is less than 3 $\mu$m, excellent conductivity may not be obtained. On the other hand, when the thickness is more than 35 $\mu$m, it may be difficult to form a fine wiring pattern.

It is preferable in the wiring substrate that the depth of the concave portion is 1 to 12 $\mu$m. When the depth is more than 12 $\mu$m, for example, when a semiconductor is mounted, some bumps may not be brought into contact with the wiring pattern or it may take a long time to seal with a sealing resin. On the other hand, when the depth is less than 1 $\mu$m, the concave portion may not serve for the positioning of the bumps.

The second embodiment of the wiring substrate formed by the transfer material of the present invention is a multi-layered wiring substrate in which, as shown in FIG. 10J, a wiring pattern (1002 etc.) is formed on the base material sheet 1001, at least one surface of the substrate has at least one concave portion and the wiring pattern is formed on the bottom portion of the concave portion. In this multi-layered wiring substrate, by using the transfer material of the present invention, the wiring pattern can be formed on the base material sheet that is an uncured base material sheet or a green sheet. Thus, after the single layered substrate is laminated, an entire laminate is adhered and fixed, and a base material sheet and metal foil wiring patterns can be cured simultaneously. As a result, a multi-layered wiring substrate including an interlayer via of each layer having a high position accuracy can be obtained.

Figure 11:
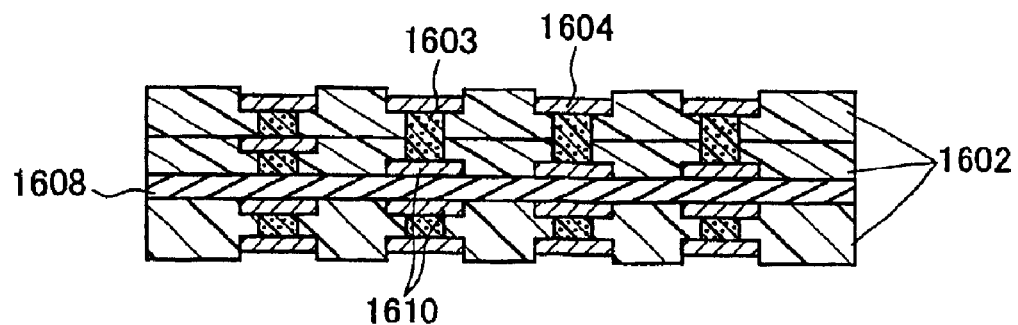
FIG. 11 is a cross-sectional view showing one example of a schematic configuration of the multi-layered wiring substrate produced by using the transfer material of the present invention.

The third embodiment of the wiring substrate formed by the transfer material of the present invention is a multi-layered wiring substrate having a laminate structure, as shown in FIG. 11. The laminate structure includes an electrically insulating substrate 1608 formed of a ceramic, and an electrically insulating substrate 1602 including at least a thermosetting resin composition. The electrically insulating substrate 1608 formed of a ceramic is formed in a state in which a wiring pattern is prevented from projecting from the surface by using the transfer material of the present invention. Furthermore, it is possible to laminate the electrically insulating sheet containing an uncured thermosetting resin and electrically insulating substrate formed of a ceramic and to cure them at relatively small pressure in one time. Thus, it is possible to attain the multi-layered substrate without damaging the ceramic layer.

On the other hand, the multi-layered wiring substrate can be produced by adhering it to an electrically insulating sheet containing a thermosetting resin after the wiring pattern has been formed beforehand on the ceramic substrate by a printing method or firing. However, since the wiring pattern produced by a printing method becomes a projection, in the process of adhering the wiring pattern to the electric insulating sheet containing a thermosetting resin composition, stress concentration occurs, from which cracks are generated in the ceramic substrate layer.

Figure 12:
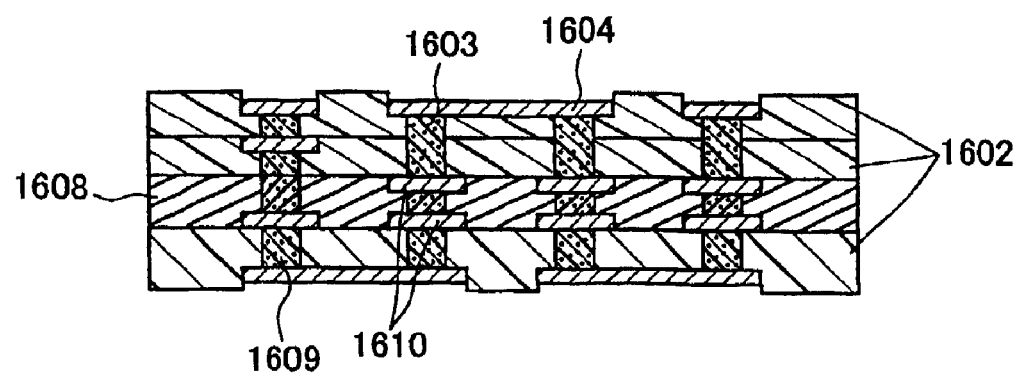
FIG. 12 is a cross-sectional view showing another example of a schematic configuration of the multi-layered wiring substrate produced by using the transfer material of the present invention.

The fourth embodiment of the wiring substrate produced by using the transfer material of the present invention is a multi-layered wiring substrate including an electrically insulating substrate 1608 formed of a ceramic, and an electrically insulating substrate 1602 including at least a thermosetting resin composition, similar to the wiring substrate of the third embodiment, as shown in FIG. 12. Furthermore, an interlayer via hole 1603 filled with a conductive via composition is provided in the predetermined position of each layer of the laminated electric insulating substrates, and a wring pattern 1610 electrically connected to the via holes 1608 is formed. Although this structure is a laminate of the ceramic substrate and a resin substrate, a multi-layered wiring connection can be used that is the same as in the wiring rule of the multi-layered wiring substrate formed of only ceramic substrates or a multi-layered wiring substrate formed of only resin substrates.

In this case, as the conductive resin composition used for the interlayer connection via of the ceramic substrates, a sintered body formed of metal powder and glass powder is used. On the other hand, as the conductive resin composition used of the inter connection via of the resin substrate, a resin composition made of a mixture of metal powder and the thermosetting resin is used.

Furthermore, in the interface between the electrically insulating substrate containing a thermosetting resin composition and the ceramic substrate, the wiring pattern layer formed on the ceramic substrate is not projected from the surface and is incorporated in the ceramic substrate.

Furthermore, it is preferable in the firing process of the ceramic substrate that the firing treatment is carried out after the constraint sheet including an inorganic composition that substantially is not sintered nor shrunk at the firing temperature of the green sheet is placed on both surfaces or one surface of the green sheet on which a wiring pattern is transferred. Thus, since the non-shrinkage sintering in the plane direction can be realized, when laminating to the resin base substrate, the common interlayer via positional data can be employed.

Needless to say, after the wiring pattern may be formed on the ceramic green sheet filled with the via paste by a printing method and by sintering, this is adhered to the electrically insulating sheet containing a thermosetting resin composition so as to form a interlayer connection. However, since the wiring pattern by a printing method becomes a projection, in a process of adhering the electrically insulating sheet containing the thermosetting resin composition to the ceramic green sheet, stress concentration occurs, from which cracks are generated in the ceramic substrate layer.

Figure 13:
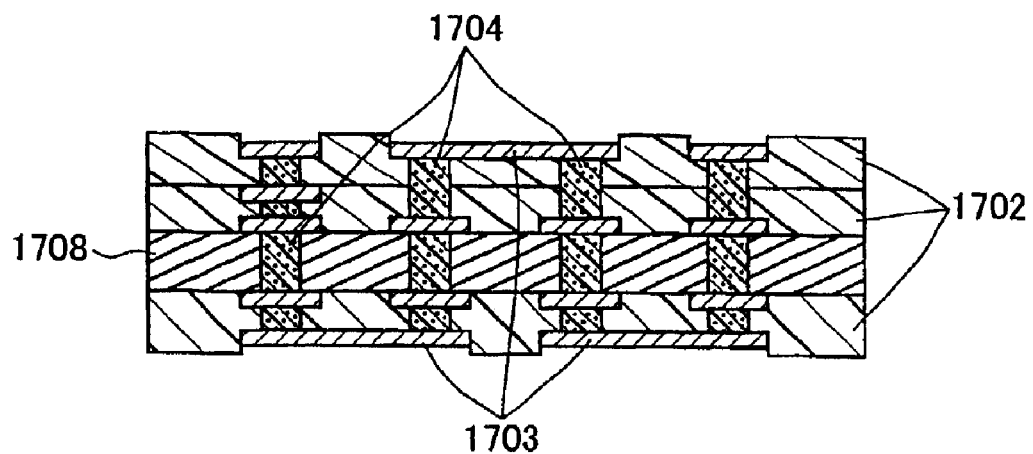
FIG. 13 is a cross-sectional view showing a further example of a schematic configuration of the multi-layered wiring substrate produced by using the transfer material of the present invention.

Furthermore, as shown in FIG. 13, by using the transfer material of the present invention, it is possible to produce a multi-layered wiring substrate in which a low resistance wiring is formed. The low resistance wiring is produced by laminating a ceramic substrate 1708 formed of an alumina substrate having a relatively high mechanical strength, and an aluminum nitride substrate having a high thermal conductivity, or the like, onto an electrically insulating substrate 1702 containing at least a thermosetting resin composition. Herein, both an interlayer via conductor used for the ceramic substrate and an interlayer via conductor used for the resin based substrate are formed of the same thermosetting resin composition.

Needless to say, as the ceramic substrate used herein, a low temperature sintering ceramic capable of being sintered together with copper, silver, etc, for example, alumina glass ceramic, Bi—Ca—Nb—O based ceramic, and the like, may be used.

Figure 14:
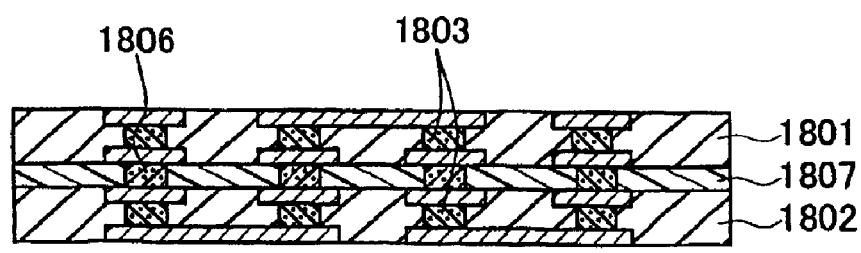
FIG. 14 is a cross-sectional view showing a still further example of a schematic configuration of the multi-layered wiring substrate produced by using the transfer material of the present invention.

The fifth embodiment of the wiring substrate formed by the use of the transfer material of the present invention is a dissimilar laminate wiring substrate. As shown in FIG. 14, similar to the wiring substrate of the third or fourth embodiment, the dissimilar laminate wiring substrate has a laminate structure including an electric insulating substrate containing a thermosetting resin composition and an electrically insulating substrate containing a ceramic. In this embodiment, electrically insulating substrates 1801 and 1802 formed of different kinds of ceramics each having a different composition are laminated via the electrically insulating substrate 1807 including a thermosetting resin.

According to this structure, it is possible to obtain a dissimilar laminate between a magnetic ceramic and a dielectric ceramic or a dissimilar laminate between a dielectric ceramic having a high dielectric constant and a dielectric ceramic having a low dielectric constant, which conventionally has been technically difficult to achieve because of the difference in the firing temperatures or shrinkage rate, or mutual diffusion etc. at the time of sintering. Furthermore, in the method for producing the dissimilar laminate wiring pattern substrate of the present invention, each wiring substrate is produced by transferring a wiring pattern such as a copper foil etc. to the green sheet or uncured thermosetting resin impregnated sheet. Thus, a laminate having a low resistant wiring in all layers can be obtained without being damaged at the time of laminate.

According to the wiring substrate according to the fifth embodiment, by interposing the electric insulating substrate including a thermosetting resin composition between the ceramic substrates, it is possible to laminate ceramic substrates, each having a different sintering temperature. Thus, it is possible to produce easily, for example, a dissimilar laminate wiring substrate in which each layer has different dielectric constant or a dissimilar laminate wiring substrate in which a magnetic layer and dielectric layer are laminated.

Needless to say, after a wiring pattern is formed on a ceramic green sheet filled with via paste by a printing method and by firing, then the electrically insulating sheet containing a thermosetting resin composition may be laminated onto the ceramic green sheet. However, since the wiring pattern by a printing method becomes a projection, in the process of adhering the wiring pattern to electrically insulating sheet containing a thermosetting resin composition, stress concentration occurs, from which cracks are generated in the ceramic substrate layer.

Figure 15:
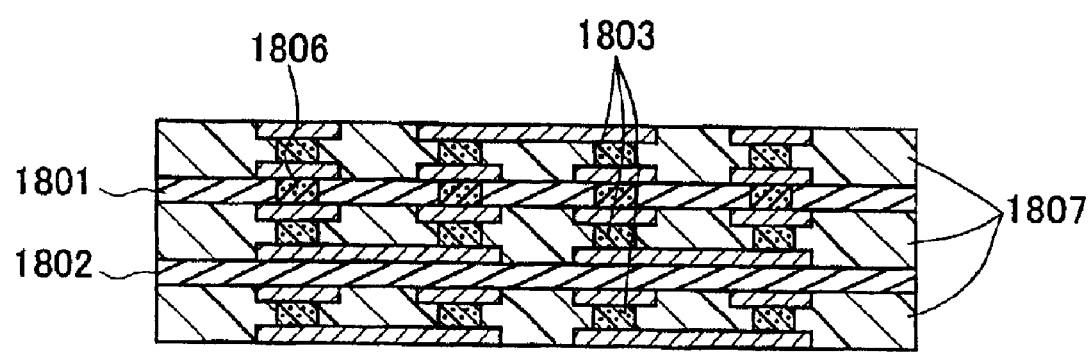
FIG. 15 is a cross-sectional view showing a further example of a schematic configuration of the multi-layered wiring substrate produced by using the transfer material of the present invention.

The sixth embodiment of the wiring substrate formed by the use of the transfer material of the present invention is a laminated structure. As shown in FIG. 15, similar to the wiring substrate of the third or fourth embodiment, a laminated structure includes electric insulating substrates 1801 and 1802 formed of a ceramic and an electric insulating substrate 1807 formed of at least one thermosetting resin composition. And the electric insulating substrate 1807 including a thermosetting resin is formed on at least a top layer or a bottom layer, and the electric insulating substrates 1801 and 1802 including a ceramic are formed in inside layers. According to this structure, since the layer covering the outermost surface of the substrate is formed of the thermosetting resin composition that is not likely to be cracked, it is excellent in falling resistant property.

In the production method for producing these dissimilar wiring substrates, by transferring the wiring pattern such as a copper foil, etc. to a green sheet or an uncured thermosetting resin impregnated sheet, each wiring substrate is produced. Thus, a laminate having a low resistance wiring in all layers can be obtained without being damaged at the time of laminate.

Needless to say, after a wiring pattern is formed on a ceramic green sheet filled with via paste by a printing method or firing, then an electrically insulating sheet containing a thermosetting resin composition may be laminated onto the ceramic green sheet, thereby performing an interlayer connection of the laminate. However, since the wiring pattern formed by a printing method becomes a projection, in a process of adhering the wiring pattern to the electrically insulating sheet containing a thermosetting resin composition, stress concentration occurs, from which cracks are generated in the ceramic substrate layer.

Moreover, it is also possible to form circuit components such as an inductor, a capacitor, a resistor, a semiconductor device, or the like, with electrically connected to the wiring pattern of the transfer material of this embodiment and to transfer them to the substrate together with the wiring pattern. It is preferable that the passive components such as inductor, capacitor, and resistor, etc. are formed on the substrate by a printing method, for example a screen printing method.

Next, the further specific Examples of the first to fourth embodiments are explained hereinafter.

EXAMPLE 1

A first transfer material of the present invention was produced by a process shown in FIGS. 4A to 4F.

Figure 4A:
FIGS. 4A to 4F are cross-sectional views schematically showing a process for producing the first transfer material.

As shown in FIG. 4A, an electrolytic copper foil having a thickness of 35 μm was prepared as a first metal layer 401. First, a copper salt raw material was dissolved in an alkaline bath and allowed to be electro-deposited on a rotation drum so that it had a high electric current density. Thus, a metal layer (copper layer) was formed and this copper layer was rolled up continuously so as to form an electrolytic copper foil.

Figure 4B:
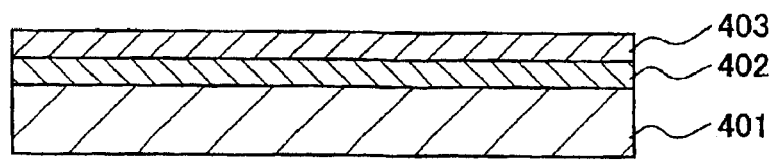

Next, as shown in FIG. 4B, a Ni—P alloy layer was formed in a thickness of about 100 nm as a peel layer 402 on the surface of the first metal layer 401 by plating. The electrolytic copper foil same as the first metal layer 401 was laminated thereon in a thickness of 9 μm as a second metal layer for forming wiring pattern 403 by electrolytic plating. Thus, a three-layered structure laminate was produced.

The surface of the laminate was subjected to a roughening treatment so that the average roughness (Ra) of the center line of the surface was about 4 μm. The roughening treatment was carried out by precipitating fine copper powder on the electrolytic copper foil.

Figure 4C:
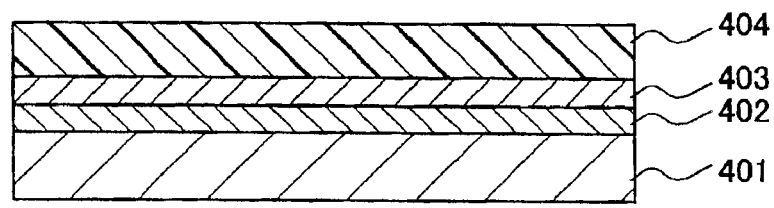
Figure 4D:
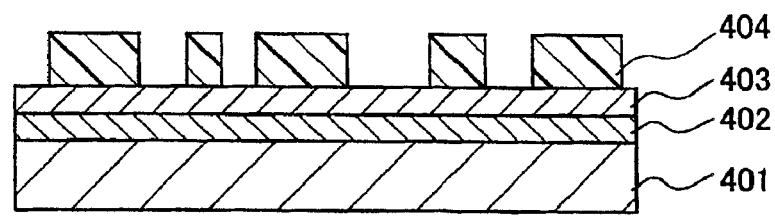
Figure 4E:
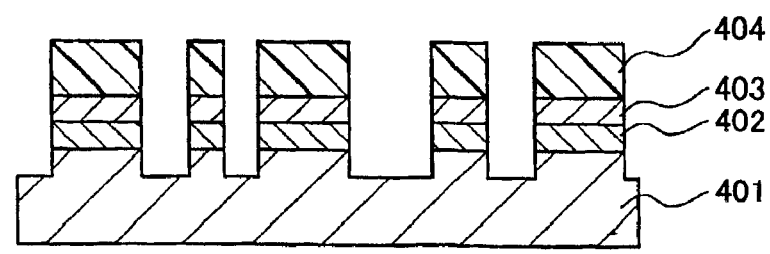

Next, as shown in FIGS. 4C to 4E, a dry film resist (DFR) 404 was placed by a photolithography method, and exposure and development of the wiring pattern portion was carried out. The first metal layer 403, the peel layer 402 and the surface portion of the first metal layer 401 of the laminate were etched by a chemical etching process (immersing in an aqueous solution of ferric chloride) so as to form a desired wiring pattern.

Figure 4F:
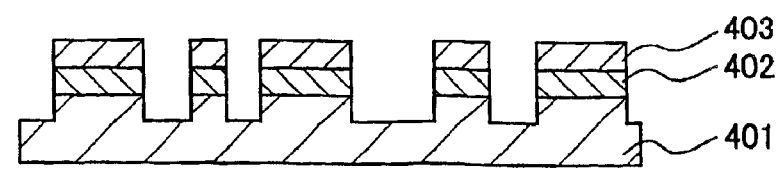

Thereafter, as shown in FIG. 4F, the first transfer material was obtained by removing a mask portion (DFR404) with a peeling material. Since the first metal layer and the second metal layer are formed of the same materials, not only the second metal layer but also the surface layer of the first metal layer can be etched in a wiring pattern in one etching process. This first transfer material has a structural feature in that the surface layer portion of the first metal layer that is a carrier layer is also processed in the wiring pattern.

In the produced first transfer material, the peel layer 402 adhering the first metal layer 401 and the second metal layer 403 is weak in adhesive strength itself but excellent in etch resistance property. Thus, even if the entire laminate of the first metal layer 401, the peel layer 402, and the second metal layer 403 are subjected to the etching process, interlayer portions are not peeled off and the wiring pattern can be formed without problems. On the other hand, the adhesive strength between the first metal layer 401 and the second metal layer 403 was 40 N/m (gf/cm), exhibiting an excellent peeling property. When the second metal layer 403 was transferred to the substrate by using such a first transfer material, the adhesive plane between the second metal layer 403 and the peel layer 402 was peeled off easily, so that only the second metal layer 403 was transferred to the substrate.

Since the first transfer material according to the present invention includes a carrier (first metal layer) formed of a copper foil having a thickness of 35 μm, even if the transfer material is deformed at the time of transfer, the carrier layer was resistant to the deformation stress.

In the first transfer material of the first metal layer that is a carrier layer, the wiring pattern is a convex portion and the portion excluding the wiring pattern is a concave portion. Therefore, when the transfer material is pressed onto the base material sheet (material for the substrate), the base material extruded from the portion into which the wiring pattern is embedded is likely to flow into the concave portion, thus suppressing the deformation stress that distorts the pattern in the vertical direction. Therefore, the distortion of the pattern in this Example was only the amount generated by the curing and shrinking of the base material (0.08%).

As a comparative example, by using a transfer material on which the surface layer of the first metal layer 401 is not etched at all and only the second metal layer is formed into the wiring pattern (that is, a transfer material including a carrier layer having a flat surface), the wiring layer was transferred to the base material sheet. The distortion of the wiring pattern was at most 0.16%. In this comparative example, since the carrier is a thick copper foil, basically the distortion is small as in Example 1. However, it was confirmed that in the portion in which the wiring patterns are concentrated, the wiring pattern is somewhat distorted because the concave portion into which base material flows is small. The distortion amount of the pattern is substantially small. However, when the transfer material according to the comparative example is used, unlike the first transfer material of the present invention, a surface of the wiring pattern is on the same plane or convex shape with respect to the surface of the substrate, but is not concave. Therefore, the effect of facilitating the positioning at the time of flip chip mounting of the transfer material of the present invention cannot be exhibited. This shows the effect of the transfer material of the present invention in which the convex portion corresponding to the wiring pattern is formed on the surface of the carrier layer by etching also the first metal layer that is a carrier layer.

In Example 1, for example, a Ni-plating layer, a nickel-phosphorous alloy layer, an aluminum plating layer, or the like, having a thickness of 200 nm or less, is used as the peel layer. However, the peel layer is not necessarily limited thereto, and any organic layers can be used. An example of the organic layer includes, for example, a long chain aliphatic carboxylic acid that can be bonded to, for example, Cu and that is in a solid state at room temperature. By using this, the same effect as the transfer material of this example can be realized.

EXAMPLE 2

A second transfer material of the present invention was produced by a process shown in FIGS. 5A to 5E by a production method different from Example 1. The second transfer material is different from the first transfer material according to Example 1 in the structure of the first transfer material and the wiring layer.

First, an electrolytic copper foil having a thickness of 35 μm was prepared as a first metal layer 501. A copper salt raw material was dissolved in an alkaline bath and allowed to be electrodeposited to a rotation drum so that it had a high electric current density. Thus, a metal layer (copper layer) was formed and this copper layer was rolled up continuously so as to form an electrolytic copper foil.

Next, a peel layer 502 formed of a thin nickel plating layer was formed in a thickness of 100 nm or less on the surface of the first metal layer 501 formed of the electrolytic copper foil. The electrolytic copper foil that is the same as the first metal layer 501 was laminated thereon in a thickness of 3 μm as a second metal layer for forming wiring pattern 503 by electrolytic plating. Thus, a three-layered laminate including the first metal layer 501, the peel layer 502 and the second metal layer 503 was produced.

The surface of the second metal layer 503 of the laminate was subjected to a roughening treatment, so that the average roughness (Ra) of the center line of the surface was about 3 μm. The roughening treatment was carried out by precipitating fine copper powder on the electrolytic copper foil. Furthermore, an adhesive material (not shown) was coated and a dry film resist (DFR) 504 used for the photolithography was placed thereon. The DFR 504 has a plating resistant property and serves as a plating resist. With the above-mentioned process, a laminate shown in FIG. 5A was produced.

Figure 5A:
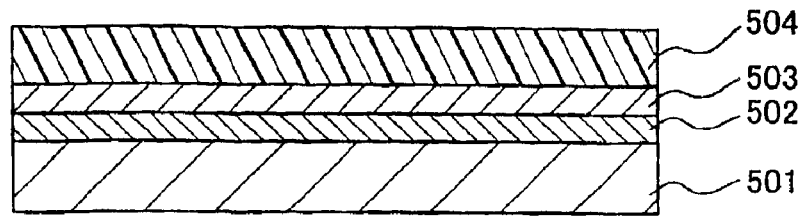
FIGS. 5A to 5E are cross-sectional views schematically showing a process for producing the second transfer material.
Figure 5B:
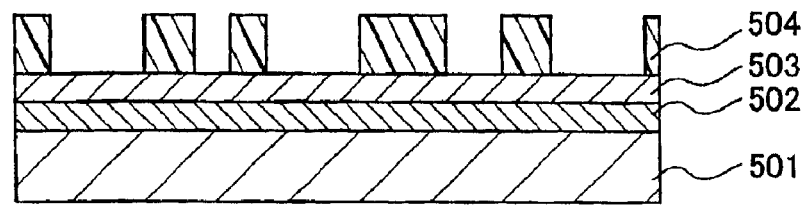
Figure 5C:
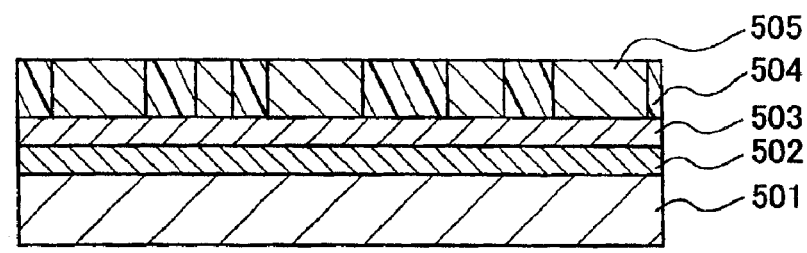

Next, as shown in FIG. 5B, the DFR 504 of the wiring pattern was exposed and developed so as to form a concave portion reaching the second metal layer 503 in a wiring pattern region of the DFR 504. The depth of the concave portion was 25 μm. Thereafter, as shown in FIG. 5C, a third metal layer 505 was formed of a copper plating layer having a thickness of 20 μm in the concave portion by plating with an electrolytic copper; and then the laminate was immersed in the peeling solution so as to remove the DFR 504.

Figure 5D:
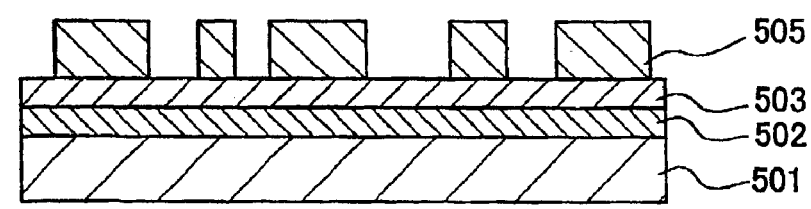
Figure 5E:
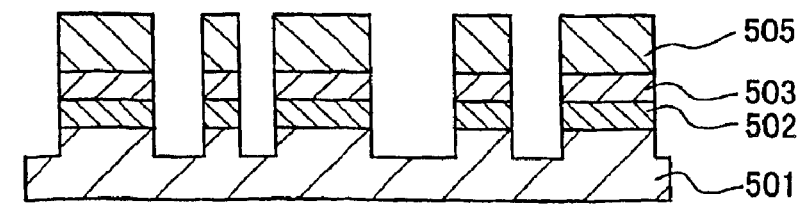

Finally, as shown in FIG. 5E, the patterning was carried out by a chemical etching process by immersing the laminate in an aqueous solution of ferric chloride. This etching process was carried out in order to remove the thin second metal layer 503 having a thickness of 3 μm and peel layer 502 (plating layer). As a result, the etching process was carried out for a short time, also the third metal layer 505 was partially etched so as to have a thickness of about 15 μm, and furthermore, the surface of the first metal layer 501 also was eroded partially. Thus, as shown in FIG. 5E, the second transfer material was produced.

Since the first, second and third metal layers are formed of the same materials, i.e., copper, not only the second and third metal layers but also a part of the first metal layer can be removed by one etching process. Thus, a part excluding the wiring pattern on the surface portion of the first metal layer was formed into a concave portion. Furthermore, similar to Example 1, since the surface of the first layer, i.e. a carrier layer, was etched, and the third metal layer was formed by an additive method, the thickness can be controlled arbitrarily. Furthermore, in Example 2, the peel layer is not limited to a plating layer, and an extremely thin adhesive layer formed of an organic layer or a sticking agent layer may be employed.

In the thus produced second transfer material, the peel layer 502 for connecting the first metal layer 501 to the metal layers 503 and 505 for forming the wiring patterns is weak in adhesive strength itself but excellent in etch resistance property. Thus, even if the four-layer structured entire laminate shown in FIG. 5D is subjected to an etching process, interlayer portions are not peeled off and the wiring pattern can be formed without problems.

On the other hand, the adhesive strength between the first metal layer 501 and the second metal layer 503 via the peel layer 502 is 30 N/m (gf/cm), exhibiting an excellent peeling property. Thereby, with this second transfer, after the second metal layer 503 as the wiring pattern, and the third metal layer 505 are transferred to the base material sheet (a material for the substrate), the portion between the second metal layer 503 and the peel layer can be peeled off easily with only the wiring layer remained on the substrate. At this time, the peel layer formed of the peel layer 502 was attached to the side of the first metal layer 501, that is, a carrier.

Moreover, as shown in FIG. 5E, the produced second transfer material of this embodiment is pressed onto the base material sheet (a material for the substrate) including an uncured thermosetting resin and thermally cured, then the first metal layer is removed by a chemical etching process, and thereby the wiring layer (the second metal layer 503 and the third metal layer 505) may be transferred to the substrate. By controlling the etching time, it is possible to make the substrate surface including the wiring layer flat and to make the wiring layer a concave shape with respect to the substrate surface.

In this Example, similar to Example 1, the carrier layer is formed of copper foil having a thickness of 35 μm, even if the base material was deformed at the time of transfer, the carrier layer was resistant to the deformation stress. On the other hand, in the transfer material in Example 2, the concave portion of the first metal layer, that is, a carrier layer is secured to be as deep as 5 μm. This allows the base material of the portion into which the wiring layer is embedded to flow toward the concave portion easily when the transfer material is pressed onto the base material sheet and to suppress the deformation stress that distorts the pattern in the vertical direction.

Therefore, when the transfer material according to this Example was used, the distortion of the pattern in this Example was only the amount generated by the curing and shrinking of the base material (0.08%). This shows the effect that the surface portion of the first metal layer that is a carrier layer is etched so as to form the wiring pattern to be a convex shape and to form the portion excluding the wiring pattern to be a concave portion. Furthermore, when the wiring resistance after transfer was measured, as compared with Example 1, a cross sectional area for the wiring can be increased and reduce the resistance value by about 20 to 30% because the thickness of the wiring pattern was increased by the third metal layer.

In this Example, as shown in FIG. 5E, after the patterning of the first metal layer was carried out by a chemical etching process, transfer was carried out. However, the transfer may be carried out with curing the base material by using the transfer material without chemical etching process.

However, in this case, after the transfer, the peeling layer and the first metal layer are peeled off, and then the second metal layer is removed by a soft etching process etc., and thus the wiring pattern including only a third metal layer can be formed.

Furthermore, also in this case, the carrier copper foil (first metal foil) including a convex wiring pattern can be reused after transfer. Furthermore, the wiring pattern transferred to the substrate by using the transfer material of this Example has a concave portion with respect to the substrate surface. This concave portion can be used for positioning, e.g. facilitates the flip-chip mounting of a bare chip.

EXAMPLE 3

A transfer material according to this Example is another example of the second transfer material. The transfer material of this Example is different from that of Example 2 in the structure of the wiring layer, however, the drawing is the same, and the transfer material of this Example is described with reference to FIGS. 5A to 5E.

First, an electrolytic copper foil having a thickness of about 35 μm was prepared as a first metal layer 501. A copper salt raw material was dissolved in an alkaline bath and allowed to be electrodeposited on a rotation drum so that it had a high electric current density. Thus, a metal layer (copper layer) was formed. This copper layer was rolled up continuously so as to form an electrolytic copper foil.

Next, a peel layer 502 formed of a thin nickel plating layer having a thickness of 100 nm or less was formed on the surface of the first metal layer 501. The electrolytic copper foil same as the first metal layer 501 was laminated thereon in a thickness of 3 μm as a second metal layer for forming wiring pattern 503 by electrolytic plating. Thus, a three-layered laminate including the first metal layer 501, the peel layer 502 and the second metal layer 503 was produced.

The surface of the laminate was subjected to a roughening treatment so that the average roughness (Ra) of the center line of the surface was about 3 μm. The roughening treatment was carried out by precipitating fine copper powder on the electrolytic copper foil. Furthermore, an adhesive material that was the same as in Example 2 was coated and a dry film resist (DFR) 504 used for the photolithography was placed thereon. The DFR 504 has a plating resistant property and serves as a plating resist. Thus, as shown in FIG. 5A, a four-layered laminate was produced.

Next, as shown in FIG. 5B, the DFR 504 of the wiring pattern was exposed and developed so as to form a concave portion that reaches the second metal layer 503 in a region corresponding to the wiring pattern in the DFR 504. The depth of the concave portion is 25 μm. Thereafter, as shown in FIG. 5C, a third metal layer 505 formed of a copper plating layer having a thickness of 2 μm was formed. Then, as shown in FIG. 5D, the laminate was immersed in a peeling solution so as to remove the DFR 504.

Finally, as shown in FIG. 5E, the patterning was carried out by a chemical etching process by immersing the laminate in an aqueous solution of ferric chloride. This etching process is different from that of Example 2 in that a gold plating layer 505 serves as an etching resist, so that it is possible to remove selectively the thin second metal layer 503 having a thickness of 3 μm and the thin peel layer 502. As a result, since a transfer material whose top layer is gold plated was obtained, the surface of the wiring pattern may not be oxidized. Therefore, when a bare chip or a component is mounted on the wiring pattern after the wiring pattern is formed on the substrate by using the transfer material, it is possible to attain a low resistance connection.

Furthermore, as a comparative example, a gold plated transfer material was produced by plating gold on the entire surface of the transfer material having a wiring formed of single layered copper foil wiring, as shown in FIG. 1. When the gold plated transfer material was examined for transferring property, the transferring property of the wiring pattern was damaged. This shows the effect of the transfer of this Example on which a gold plating layer is formed only on the surface layer of the wiring pattern.

EXAMPLE 4

A third transfer material of the present invention was produced as shown in FIGS. 6A to 6E. The third transfer material is the same at the second transfer material according to Example 2 or 3 of the present invention except the structure of the wiring layer.

Figure 6A:
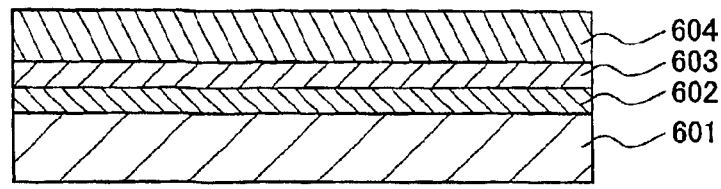
FIGS. 6A to 6E are cross-sectional views schematically showing a process for producing the third transfer material.

First, as shown in FIG. 6A, a four-layered laminate including a first metal layer 601, a peel layer 602, a second metal layer 603 and dry film resist (DFR) 604 was prepared. Since the structure and the method for producing this laminate are the same as the laminate shown in FIG. 4C in Example 1, the explanation is not repeated herein.

Figure 6B:
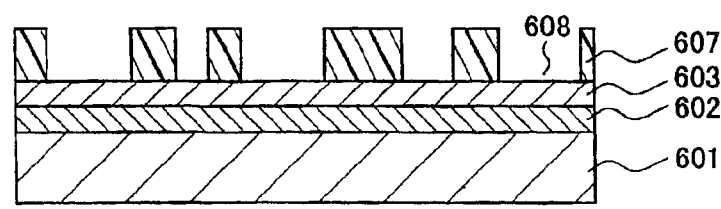
Figure 6C:
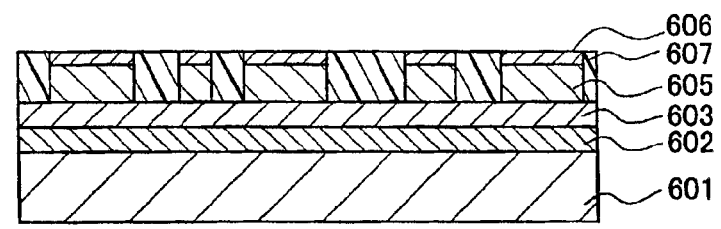

Next, as shown in FIG. 6B, a region 607 excluding a region corresponding to the wiring pattern in the DFR 604 was exposed and developed so as to form a concave portion 608 having a thickness of 25 μm corresponding to the thickness of the DFR 604 was formed in the region of the wiring pattern. Thereafter, as shown in FIG. 6C, a copper plated layer (third metal layer) 605 having a thickness of 15 μm was formed by electroless copper plating in a deposition thickness of about 2 μm followed by electrolytic copper plating. In this Example, further a silver plating layer (fourth metal layer 606) was deposited thereon by electrolytic silver plating to a thickness of about 3 μm.

Figure 6D:
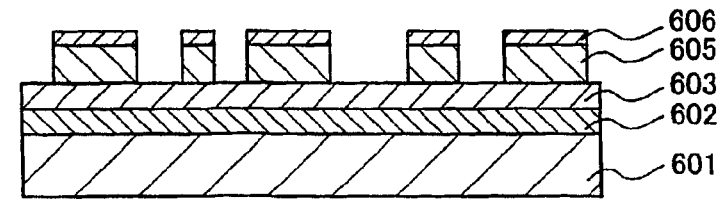
Figure 6E:
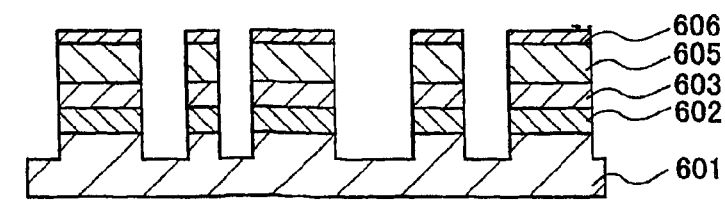

Next, similar to Example 2, as shown in FIG. 6D, the laminate was immersed in a peeling solution so as to remove the DFR. Finally, as shown in FIG. 6E, the patterning was carried out by a chemical etching process by immersing the laminate in an aqueous solution of ferric chloride. This etching process was carried out basically in order to remove the thin second metal layer 603 having a thickness of 3 μm. However, since the fourth metal layer 606 that is a silver plating layer serves as an etching mask, the third metal layer 605 and the fourth metal layer 606 are not substantially etched except for a small side etching portion, so that the thickness is maintained. Furthermore, this etching process is continued until the peel layer 602 and the surface portion of the first metal layer 601 were corroded.

Also in this Example, short-time etching is sufficient for the patterning of the second metal layer 603, etc. Thus, the third transfer material was obtained, in which a region excluding the wiring pattern on the surface layer portion of the first metal layer 601 was formed in a concave shape. By adjusting the etching time, it is possible to control the depth of the concave portion of the first metal layer 601 freely.

Since the first, second and third metal layers are formed of the same material, copper, not only the second and third metal layers but also a part of the first metal layer is corroded by one chemical etching process. Thus, a part excluding the wiring pattern on the surface layer portion of the first metal layer could be formed into a concave portion. Furthermore, similar to Example 1, in the third transfer material according to this Example, the surface of the first layer that is a carrier layer was etched. The fourth metal layer (silver plating layer) that is different from the second and third metal layers (copper plating layers) is further formed by an additive method.

In the thus produced third transfer material, the peel layer 602 adhering the first metal layer 601 as a carrier layer to the second metal layer 603 as a wiring layer, a third metal layer 605 and the fourth metal layer 602 is weak in adhesive strength itself but excellent in etch resistance property. Thus, even if the entire five-layered laminate shown in FIG. 6D is subjected to an etching process, only the second metal layer 603 can be removed effectively and the transfer material can be formed without peeling off the interlayer portion of the laminate. The adhesive strength between the first metal layer 601 and the second metal layer 603 via the peel layer 602 was 40 N/m (gf/cm), exhibiting an excellent peeling property.

With such a third transfer, a three-layered wiring pattern including the second metal layer 603, the third metal layer 605 and fourth metal layer 606 was transferred to the base material sheet (a material for the substrate). As a result, an adhesive plane (peel layer 602) between the first metal layer 601 and the second metal layer 603 was peeled off easily and the three-layered wiring pattern was transferred to the base material.

In this Example, similar to Example 1, the carrier layer was formed of copper foil having a thickness of 35 μm, and even if the transfer material was deformed at the time of transfer, the carrier layer was resistant to the deformation stress. On the other hand, in the transfer material in this example, the concave portion of the first metal layer that is a carrier layer is secured to be as deep as 10 μm. Therefore, when the transfer material is pressed onto the base material sheet, the base material extruded from the portion into which the wiring pattern is embedded is likely to flow into the concave portion, thus suppressing the deformation stress that distorts the pattern in the vertical direction.

Therefore, similar to Example 2, the distortion of the pattern in this Example was only the amount generated by the curing and shrinking of the base material (0.07%). This shows the effect of forming the concave and convex portion in accordance with the wiring pattern also in the first metal layer that is a carrier layer. Furthermore, when the wiring resistance after transfer was measured, as compared with Example 1, because the thickness of the wiring pattern was increased by the third metal layer, a cross sectional area for the wiring can be increased and reduce the resistance value by about 20 to 30%.

Furthermore, in this Example, since the outermost layer that is in contact with the base material in the wiring layer is formed of a silver plating layer, it was possible to stabilize the connecting property between the wiring pattern and the conductive via paste mentioned below in Example 5.

Furthermore, when the wiring pattern is formed on the substrate by using the transfer material of this Example, similar to the above-mentioned Examples, the concave shaped wiring pattern can contribute to the positioning in a flip chip mounting. Furthermore, it is needless to say that the carrier copper foil (first metal layer) on which the convex portion corresponding to the wiring pattern can be reused after transfer.

EXAMPLE 5

Figure 7A:
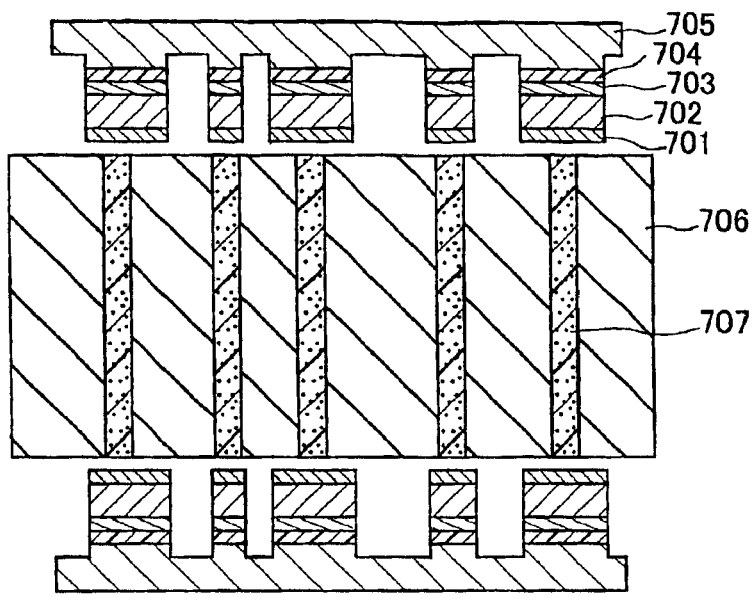
FIGS. 7A to 7C are cross-sectional views schematically showing a process for producing a composite wiring substrate using the transfer material of the present invention.
Figure 7B:
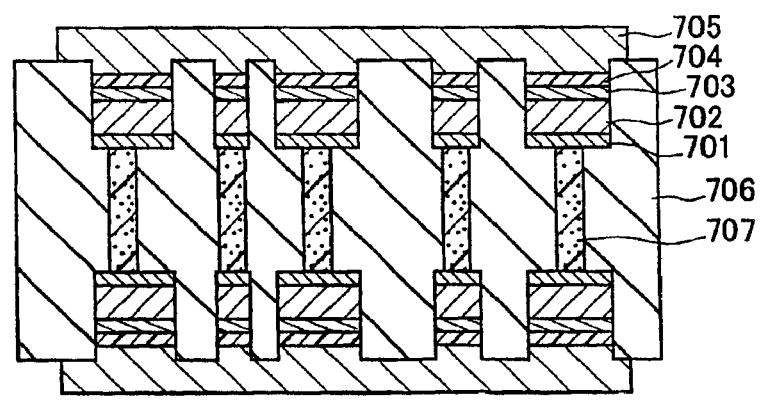
Figure 7C:
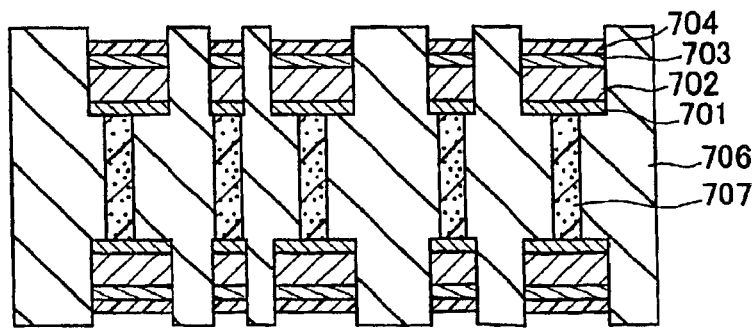

A composite wiring substrate was produced by using the third transfer material formed in Example 4 as shown in FIGS. 7A to 7C. In FIGS. 7A to 7C, a metal layer 701 corresponds to the fourth metal layer 606 of the third transfer material according to Example 4, a metal layer 702 corresponds to the third metal layer 605 of the third transfer material, a metal layer 703 corresponds to the second metal layer 603 of the third transfer material, a metal layer 704 corresponds to the peel layer 602 of the third transfer material, and a metal layer 705 corresponds to the first metal layer 601 of the third transfer material, respectively.

First, a substrate to which the wiring pattern is to be transferred was prepared. This substrate was produced by preparing the base material sheet 706 formed of composite materials shown below, providing the base material sheet with via holes, and filling the via holes with a conductive paste 707. Hereinafter, the component compositions of the base material sheet 706 are described.

(Component Composition of the Base Material Sheet 706)
$Al_2O_3$ (AS-40 manufactured by Showa Denko K. K., average particle diameter of 12 μm) 90 weight %
liquid epoxy resin (EF-450 manufactured by Nippon Rec Co. Ltd.) 9.5 weight %
carbon black (manufactured by Toyo Carbon) 0.2 weight %
coupling agent (46B, titanate based coupling agent manufactured by Ajinomoto Co., Inc.) 0.3 weight %

Each of the above-mentioned components was weighed so as to have the above-mentioned composition weight ratio. A solvent of methyl ethyl ketone was added into the mixture of the above-mentioned components so that the viscosity of the slurry mixture was about 20 Pa·s, and then rotated and mixed by the use of alumina balls in a pot at the rotation rate of 500 rpm for 48 hours so as to form into a slurry.

Next, as a mold release film, a PET film having a thickness of 75 μm was prepared. On the PET film, the slurry was formed into a film sheet at a gap of about 0.7 mm by a doctor blade method. The film sheet was allowed to stand for 1 hour at 100° C. so as to volatilize the methyl ethyl ketone solvent and to remove the PET film, thus to form into a base material sheet 706 having a thickness of 350 μm. Since the solvent was removed at 100° C., the epoxy resin was kept to be uncured and the base material sheet 706 had a flexibility.

This base material sheet 706 was cut in a predetermined size by the use of its flexibility, and provided with through holes (via holes) having a diameter of 0.15 mm at equal intervals with a pitch of 0.2 to 2 mm. Then, the through holes were filled with a conductive paste for filling via holes 707 by a screen printing method. Thus, the substrate was produced. The conductive paste 707 to be used was obtained by mixing and kneading the following materials at the below mentioned compositions by the use of a triple roller.

[Component Composition of the Conductive Paste 707]
spherical copper particles (Mitsui Mining & Smelting Co., Ltd., particle diameter of 2 μm) 85 weight %
bisphenol A epoxy resin (Epicoat 828 manufactured by Yuka Shell Epoxy) 3 weight %
glycidyl ester based epoxy resin (YD-171 manufactured by Toto Kasei) 9 weight %
amine adduct hardening agent (MY-24 manufactured by Ajinomoto Co., Inc.) 3 weight %

Next, as shown in FIG. 7A, the third transfer material was placed so that the side of the fourth metal layer 701 of the third transfer material was in contact with both surfaces of the base material sheet 706, and heated and pressed by a thermal press treatment at a pressure of $9.8 \times 10^5$ Pa (10 kgf/cm²) at a pressing temperature of 120° C. for 5 minutes. With this heating and pressing treatment, an epoxy resin in the base material sheet 706 and the conductive paste 707 was fused and softened. Thus, the wiring pattern including the second, third, and fourth metal layers 703, 702 and 701 was allowed to be embedded in the base material sheet 706.

Then, the epoxy resin was cured by raising the heating temperature and treated at 175° C. for 60 minutes. This led to strong connection between the base material sheet 706 and the second, third, and fourth metal layers 703, 702 and 701. Furthermore, the conductive paste 707 and the fourth metal layer 701 were electrically connected (inner via connection) and strongly adhered to each other.

From the laminate shown in FIG. 7B, the first metal layer 705 (carrier layer) and the peel layer 704 were peeled off together. Thus, the wiring substrate as shown in FIG. 7C including the second, third and fourth metal layers 703, 702 and 701 transferred to both surfaces was obtained. This wiring substrate is referred to as a wiring substrate 7A. This wiring substrate 7A is provided with the concave portion corresponding to the depth of the concave portion formed by etching process on the surface layer portion of the first metal layer 705. At the bottom of the concave portion, the second, third, and fourth metal layers 703, 702 and 701 were formed.

Furthermore, besides the wiring substrate 7A produced in this Example, a wiring substrate (referred to as a wiring substrate 7B) also is produced by transferring the wiring pattern by using the first transfer material described in Example 1. In order to evaluate the reliability of the thus wiring substrates 7A and 7B, a solder reflow test and a temperature cycling test were performed. The following are the methods of each test.

[Solder Reflow Test]

The solder reflow test was performed with a belt type reflow tester (manufactured by Matsushita Electric Industrial Co., Ltd.) in which a 10 second cycle was repeated 10 times at a maximum temperature of 260° C.

[Temperature Cycling Test]

The temperature cycle test was performed by allowing the wiring substrate to stand at 125° C. for 30 minutes and then at −60° C. for 30 minutes per cycle, and repeating this cycle for a total of 200 cycles.

In either the solder reflow test or the temperature cycle test, no cracks were generated in the wiring substrates 7A and 7B, and abnormality was not recognized, even if a supersonic flaw detector was used. A resistance value of the inner via connection by the conductive resin paste 707 was not substantially changed between measurements made before and after the tests.

The initial performance was hardly changed before and after the tests, however, the change rate was 5% or less in the wiring substrate 7A, while the change rate was 10% or less in the wiring substrate 7B. Both via connections of the wiring substrates had a sufficient stability, however, in the wiring substrate 7A in which Ag plating layer is present in the connecting portion between the wiring layer and the conductive resin paste, more stable via connection could be realized.

EXAMPLE 6

A ceramic wiring substrate as shown in FIG. 8 was produced by using the transfer material produced in Example 1.

First, a substrate to which the wiring pattern is to be transferred was prepared. This substrate was produced by preparing a low temperature sintering ceramic green sheet 805 including a low temperature sintering ceramic material and an organic binder, providing this green sheet with via holes, and filling the via holes with conductive paste 806. Hereinafter, the component compositions of the green sheet 805 are described.

(Component Composition of the Green Sheet 805)

mixture of ceramic powder $Al_2O_3$ and borosilicate glass (MLS-1000 manufactured by Nippon Electric Glass Co., Ltd.) 88 weight % methacrylic acid based acrylic binder (Olicox, manufactured by Kyoeisya Kagaku Co., Ltd.) 10 weight %

BBP (manufactured by Kanto Chemical Co., Inc.) 2 weight %

Each of the above-mentioned components is weighed so as to have the above-mentioned composition weight ratio. A solvent of toluene was added into the mixture of the above-mentioned components so that the viscosity of the slurry mixture was about 20 Pa·s, and then rotated and mixed by the use of alumina balls in a pot at the rotation rate of the 500 rpm for 48 hours so as to form into a slurry.

Next, as a mold release film, a polyphenylene sulfide (PPS) film having a thickness of 75 μm was prepared. On the PPS film, the slurry was formed into a film sheet at a gap of about 0.4 mm by a doctor blade method. The toluene solvent in the sheet was allowed to be volatilized so as to remove the PES film, thus to form a green sheet 805 having a thickness of 220 μm. Since in this green sheet 805, a plasticizer BBP was added into the methacrylic acid based acrylic binder, flexibility and excellent thermal decomposition property were exhibited.

This green sheet 805 was cut in a predetermined size by making use of its flexibility, and provided with through holes (via holes) having a diameter of 0.15 mm at equal intervals with a pitch of 0.2 mm to 2 mm by the use of a punching machine. Then, the through holes were filled with a conductive paste for filling via holes 806 by a screen printing method. Thus, the substrate was produced. The conductive paste 806 to be used was obtained by mixing and kneading the following materials at the following compositions by the use of a triple roller.

[Component Composition of the Conductive Paste 806]

spherical silver particles (Mitsui Mining & Smelting Co., Ltd., particle diameter of 3 μm) 75 weight % acrylic resin (manufactured by Kyoeisya Kagaku Co., Ltd., polymerization degree 100 cps) 5 weight % borosilicate glass (manufactured by Nippon Electric Glass Co., Ltd) 3 weight % terpineol (manufactured by Kanto Chemical Co., Inc.) 12 weight %

BBP (manufactured by Kanto Chemical Co., Inc.) 5 weight %

Next, the first transfer material produced in Example 1 was placed so that the side of the second metal layer (wiring layer) was in contact with both surfaces of the substrate, heated and pressed by a thermal press treatment at a pressing temperature of 70° C. and at a pressure of about $5.88 \times 10^6$ Pa (60 kgf/cm$^2$) for 5 minutes. With this heating and pressing treatment, an acrylic resin in the substrate was fused and softened. Thus, the second metal layer (wiring layer), a peel layer, and a part (concave portion) of the first metal layer (carrier) of the first transfer material were embedded into the substrate.

After the laminate was cooled, the first metal layer (carrier) and a peel layer were peeled off from the laminate, and thereby only the second metal layer remained. As shown in FIG. 8, a wiring substrate 800 having a wiring layer 801 formed of a second metal layer is formed on both surfaces of the substrate was obtained.

Then, an alumina green sheet that is not sintered at the firing temperature was laminated on both surfaces of the wiring substrate and fixed, by carrying out the binder removing process and firing in an atmosphere of nitrogen. First, in order to remove the organic binder in the green sheet 805, the laminate was heated by the use of an electric furnace in nitrogen up to 700° C. while raising temperatures at the rate of 25° C./hour, and treated at 700° C. for 2 hours.

Then, the wiring substrate in which the binder was removed was burned by treating in nitrogen at 900° C. for 20 minutes. The firing condition was set to be a temperature rising time of 20 minutes, temperature falling time of 20 minutes and in/out total time of 60 minutes. After firing, the alumina green sheet was easily removed. Thus, a low temperature sintering ceramic wiring substrate 800 was produced.

On both surfaces of the wiring substrate 800, the concave portion corresponding to the depth of the convex and concave of the first metal layer of the first transfer material was formed, and the wiring substrate 801 including the second metal layer was formed at the bottom of the concave portion. Furthermore, the surface wiring layers 801 on the both surfaces were electrically connected to each other with a conductive metal sintering via that is formed by sintering the conductive paste 806 in the thickness direction. In the configuration of this Example, as shown in FIG. 8, a gold plating layer 802 was formed on the second metal layer 801 of the wiring substrate 805.

Next, a configuration on which a bare semiconductor chip 905 was flip-chip mounted on the surface of the low temperature sintering ceramic substrate 800 is explained. FIG. 9 is a cross sectional view showing one example of the schematic configuration in which a bare semiconductor chip 905 was flip-chip mounted on the surface of the low temperature sintering ceramic substrate 800.

First, a projecting bump 903 produced by a gold wire bonding was formed on an aluminum pad 904 on the surface of the bare semiconductor chip 905, and thermosetting conductive adhesive agent (not shown) was transferred on the bump 903. By adhering the projecting bump 903 to the gold plating layer 802 via a conductive adhesive agent while positioning the projecting bump 903 with respect to the concave portion (wiring pattern portion) of the ceramic wiring substrate 800, the semiconductor device 905 was mounted. Consequently, as mentioned above, in the concave portion formed by transferring the second metal layer (wiring layer 801) by using the first transfer material, the bump 903 and the wiring layer (second metal layer 801 and gold plating layer 802) were connected.

In order to evaluate the reliability of the flip-chip mounted substrate, a solder reflow test and a temperature cycling test were carried out. Each test was carried out under the same conditions as in Example 4. As a result, a resistance value of the bump connection in the ceramic wiring substrate 800 on which the semiconductor device 905 was flip-chip mounted was not substantially changed between measurements made before and after the tests and exhibited the stability.

When the transfer material shown in FIG. 2 having the second metal layer formed of Ag plating layer and the third metal layer formed of Ag pattern plating layer was transferred, it was possible to transfer the Ag plating wiring pattern to the ceramic green sheet 805. In this case, in the production process, since binder removing process and firing treatment can be carried out in the air, it is advantageous from the viewpoint of cost. Furthermore, oxidation resistance property is remarkably improved.

EXAMPLE 7

Figure 10:
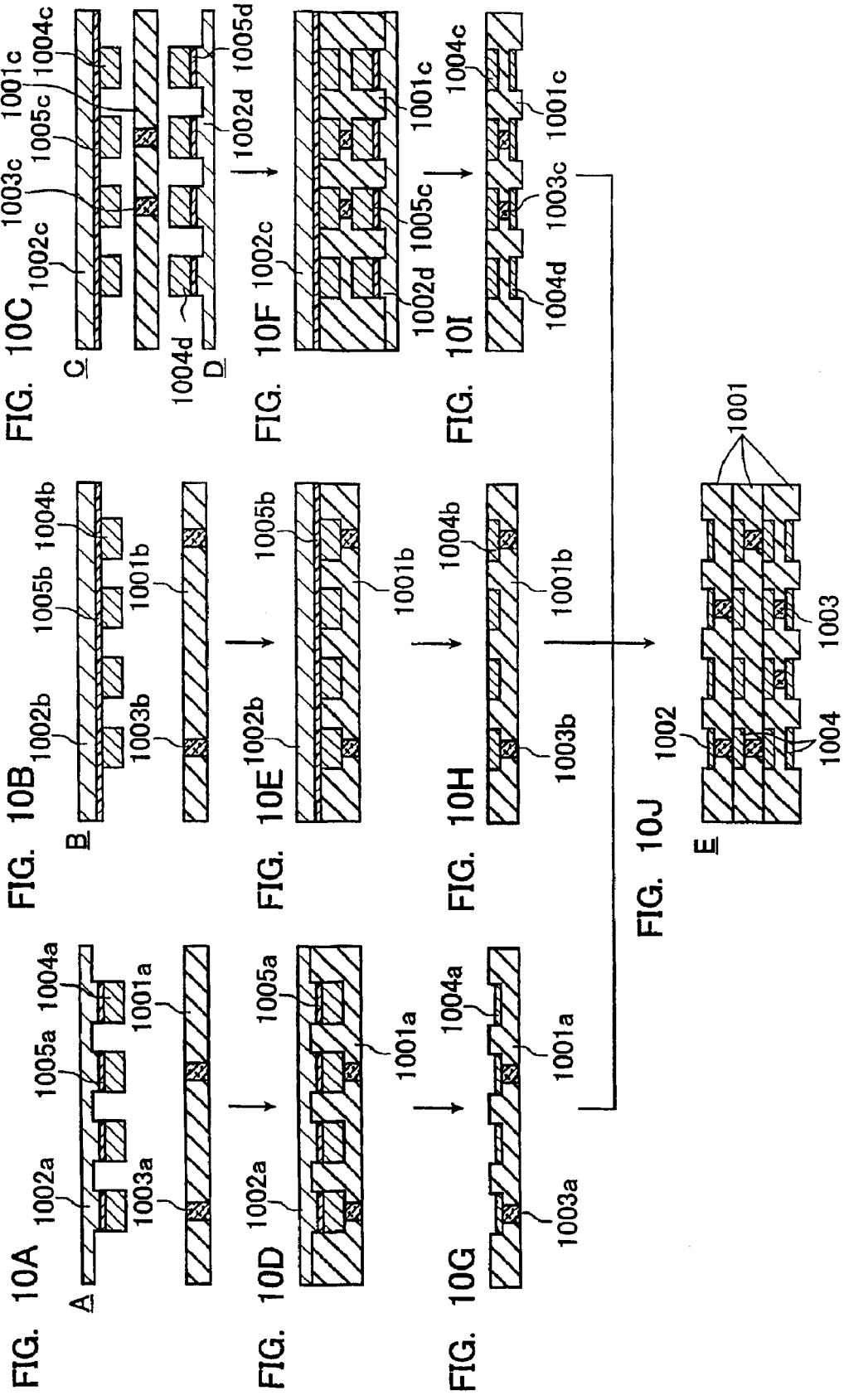
FIGS. 10A to 10J are cross-sectional views schematically showing one example of a process for producing a multi-layered wiring substrate using the transfer material of the present invention.

A multi-layered wiring substrate was produced by using a transfer material and a substrate formed of a composite material produced by the same method as in Example 5. FIG. 10 is a cross-sectional view showing one example of a schematic configuration of the multi-layered wiring substrate.

As shown in FIGS. 10A to 10J, reference numerals 1001a, 1001b and 1001c denote substrate sheets; 1002a, 10002b and 1002c denote first metal layers that are carriers; 1003a, 1003b and 1003c denote conductive pastes; 1004a, 10004b and 1004c denote second metal layers serving as a wiring pattern; 1005a, 1005b and 1005c denote peel layers; A, B, C and D denote transfer materials, and E denotes a multi-layered substrate, respectively.

Furthermore, in FIGS. 10A to 10I, FIGS. 10A, 10D and 10G show the steps for producing a single layered wiring pattern by using the transfer material A and the substrate 1001a; similarly, FIGS. 10B, 10E and 10H show the steps for producing a single layered wiring pattern-by using the transfer material B and the substrate 1001b; and FIGS. 10C, 10F and 10I show the steps for producing a single layered wiring pattern by using the transfer materials C and D and the substrate 1001c; respectively. Furthermore, FIG. 10J shows a multi-layered wiring substrate E produced by laminating the above-mentioned three single layered substrates. Unless otherwise noted, each single wiring substrate is produced by the same method as in Example 5.

First, the transfer materials A, B, C, and D shown in FIGS. 10A, 10B, and 10C were produced. First, electrolytic copper foils having a thickness of 35 $\mu$m were produced as the first metal layers 1002a, 1002b, 1002c, and 1002d by the same method for producing foils as in Example 1.

Next, the peel layers 1005a, 1005b, 1005c and 1005d made of a Ni—P alloy plating layer were formed thinly on the roughened surface of the first metal layers 1002a, 1002b, 1002c, and 1002d to the thickness of 100 nm or less. Electrolytic copper foils having a thickness of 9 $\mu$m as the second metal layers for forming wiring patterns 1004a, 1004b, 1004c, and 1004d were laminated thereon by the same electrolytic plating as in Example 1 so as to form a three-layered laminate. Herein, as the peel layer, a chrome plating layer can be used.

Next, an etching process using a base copper chloride aqueous solution capable of removing only copper was carried out from the side of the second metal layers for forming wiring patterns 1004b and 1004c so as to form the second metal layers 1004b and 1004c into desired wiring patterns. Thus, transfer materials B, C shown in FIGS. 10B and 10C were obtained. Similarly, an etching process with respect to copper and the Ni—P alloy plating layer was carried out by a chemical etching process from the side of the second metal layers for forming wiring patterns 1004a and 1004d so as to form the second metal layers 1004a and 1004d into desired wiring patterns. At the same time, a convex and concave portion corresponding to the wiring pattern was formed on the surface portion of the first metal layer 1002a and 1002d. Moreover, the convex portion corresponds to a region of the wiring patterns, and the concave portion corresponds to a region excluding the wiring patterns. Thus, transfer materials A, D shown in FIGS. 10A and 10C were obtained.

Next, as shown in FIGS. 10A, 10B, and 10C, the second metal layers 1004a, 1004b and 1004c of the transfer materials A, B, C, and D were placed so that the side of the second metal layers 1004a, 1004b and 1004c were in contact with the surfaces of the substrate sheets 1001a, 1001b and 1001c. In FIG. 10C, the transfer materials C and D were placed, respectively on both surfaces of the substrate sheet 1001c.

Then, as shown in FIGS. 10D, 10E, and 10F, the laminates of the transfer materials A, B, C and D and the substrates 1001a, 1001b and 1001c were heated and pressed at a temperature of 100° C., and at a pressure of about 9.8×10$^5$ Pa (10 kgf/cm$^2$) for 5 minutes and epoxy resin in the substrate sheets 1001*a,* 1001*b,* 1001*c* was fused and softened. Thus, the second, third, and fourth metal layers 1004*a,* 1004*b,* 1004*c,* and 1004*d* were embedded in the substrate sheets 1001*a,* 1001*b,* and 1001*c,* respectively.

Next, by peeling the first metal layers 1002*a,* 1002*b,* 1002*c* and 1002*d* from the laminate together with the peel layers 1005*a,* 1005*b,* 1005*c,* and 1005*d,* only the second metal layers 1004*a,* 1004*b,* 1004*c* and 1004*d* are remained on the substrate sheets 1001*a,* 1001*b* and 1001*c.* Thus, three kinds of single-layered wiring substrates, i.e., a single-layered wiring substrate having a flat surface (FIG. 10H), a single-layered wiring substrate having a concave portion on the wiring layer portion (FIG. 10G), and a single-layered wiring substrate having a flat surface on one surface and the concave portion on another surface (FIG. 10I), were obtained.

Finally, as shown in FIG. 10J, the three kinds of single layered wiring substrates were laminated, and then heated and pressed at a temperature of 175° C., and at a pressure of about $7.84 \times 10^6$ Pa (80 kgf/cm$^2$) for one hour so as to allow the laminate to be thermally cured and shrunk. Thus, a multi-layered substrate E was obtained. With this process, epoxy resin in the substrate sheets 1001*a,* 1001*b,* and 1001*c* and the conductive paste 1003*a,* 1003*b,* and 1003*c* were cured, so that the mechanical strength of the multi-layered wiring substrate E was maintained. Furthermore, the second metal layers 1004*a,* 1004*b,* 1004*c* and 1004*d* were electrically connected to each other with a conductive resin via paste 1003*a,* 1003*b,* and 1003*c.* Since the multi-layered substrate E was allowed to be thermally cured and shrunk in one time after the single layered wiring substrates were laminated, there was no via deviation in a via-on-via structure.

The thus obtained multi-layered substrate E can form a fine wiring pattern with a line width of about 50 µm. Furthermore, since it had an IVH structure, it was useful as an extremely small and high density mounted wiring substrate. In particular, since the wiring pattern was transferred and formed by the use of the transfer material according to the present invention, no dislocation occurs on the surface layer plane in which the fine wiring patterns are concentrated. Thus, the yield rate is expected to be improved.

Furthermore, the wiring layer on the surface layer on which chips, etc. are mounted has a concave portion, and it was possible to carry out the flip chip mounting easily. Moreover, the multi-layered substrate of the present invention is not limited to the above-mentioned structure. For example, a multi-layered wiring substrate having a single layered wiring substrate having a wiring layer provided with a concave portion as mentioned above can be employed. The multi-layered substrate in this case also shows a low resistant and high reliable via connection.

Furthermore, when the second metal layer is made of copper foil, a gold plating layer can be formed on the upper layer portion in order to prevent oxidation. In this case, if the surface of the gold plating layer also has a concave portion with respect to the substrate surface, it is possible to reduce the creeping distance even in a fine wiring pattern, and is advantageous from the viewpoint of preventing migration.

In this Example, the composite substrate was used. However, the base material is not necessarily limited thereto and a ceramic green sheet can be used. In this case, a multi-layered substrate can be attained by the same process except only the sintering process in the production process explained in this Example.

Furthermore, in this Example, the first transfer material including a wiring pattern made of the single layered metal layer was used. However, by using the second or third transfer material, a multi-layered wiring substrate having a plurality of metal layers, can be produced.

EXAMPLE 8

A multi-layered wiring substrate including a laminate made of a ceramic substrate and a substrate including at least a thermosetting resin was produced by using the first transfer material explained in Example 1.

First, a base material sheet, which is a material for a ceramic wiring substrate 1608 (see FIG. 16B) and to which a wiring pattern is transferred, was prepared. This base material sheet was produced by preparing a low temperature sintering ceramic green sheet including a low temperature sintering ceramic material and an organic binder, providing this green sheet with via holes, and filling the via holes with conductive paste 1609. Hereinafter, the component compositions of the green sheet are described.

[Component Composition of the Green Sheet]

mixture of ceramic powder $Al_2O_3$ and borosilicate glass (MLS-1000 manufactured by Nippon Electric Glass Co., Ltd) 88 weight % methacrylic acid based acrylic binder (Olicox, manufactured by Kyoeisya Kagaku Co., Ltd) 10 weight %

BBP (manufactured by Kanto Chemical Co., Inc.) 2 weight %

Each of the above-mentioned components was weighed so as to have the above-mentioned composition weight ratio. A solvent of toluene was added into the mixture of the above-mentioned components so that the viscosity of the mixture slurry was about 20 Pa·s, and then rotated and mixed by the use of alumina balls in a pot at the rotation rate of the 500 rpm for 48 hours so as to form a slurry.

Next, as a mold release film, a polyphenylene sulfide (PPS) film having a thickness of 75 µm was prepared. On the PPS film, the slurry was formed into a film sheet at a gap of about 0.4 mm by a doctor blade method. The toluene solvent in the sheet was allowed to be volatilized so as to remove the PPS film, thus to form into a green sheet having a thickness of 220 µm. Since in this green sheet, a plasticizer BBP was added into the methacrylic acid based acrylic binder, flexibility and excellent thermal decomposition property were exhibited.

This green sheet was cut in a predetermined size by making use of its flexibility, and provided with through holes (via holes) having a diameter of 0.15 mm at equally intervals with a pitch of 0.2 mm to 2 mm by the use of a punching machine. Then, the through holes were filled with a conductive paste for filling via holes 1609 by a screen printing method. Thus, the base material sheet was produced. The conductive paste 1609 to be used was obtained by mixing and kneading the following materials at the following compositions by the use of a triple roller.

[Component Composition of the Conductive Paste 1609]

spherical silver particles (manufactured by Mitsui Mining & Smelting Co., Ltd., particle diameter of 3 µm) 75 weight % acrylic resin (manufactured by Kyoeisya Kagaku Co., Ltd, polymerization degree 100 cps) 5 weight % borosilicate glass (Nippon Electric Glass Co., Ltd) 15 weight %

BBP (manufactured by Kanto Chemical Co., Inc.) 5 weight %

Next, the first transfer material described in Example 1 was placed so that the side of the second metal layer was in contact with both surfaces of the substrate, heated and pressed by a thermal press treatment at a pressing temperature of 70° C. and at a pressure of about 5.88×10⁶ Pa (60 kgf/cm²) for 5 minutes. With this heating and pressing treatment, an acrylic resin in the substrate was fused and softened. Thus, the wiring layer (second metal layer), a peel layer, and a surface portion (concave portion) of the carrier (first metal layer) of the first transfer material were embedded into the substrate.

After the laminate is cooled, the carrier of the first transfer material was peeled off from the laminate together with a peel layer, thereby only the second metal layer was remained on the laminate. As shown in FIG. 16B, a wiring substrate 1608 having a wiring layer 1610 formed of a second metal layer is formed on both surfaces of the substrate was obtained.

Then, an alumina green sheet that is not sintered at the firing temperature was laminated on both surfaces of the ceramic substrate 1608, and fixed, by carrying out the binder removing process and firing in an atmosphere of nitrogen. First, in order to remove the organic binder in the ceramic wiring substrate 1608, the laminate was heated by the use of an electric furnace in nitrogen up to 700° C. while raising temperatures at the rate of 25° C./hour, and treated at 700° C. for 2 hours. Then, the ceramic wiring substrate 1608 in which the binder was removed was burned by treating in nitrogen at 900° C. for 20 minutes. The firing condition was set to be a temperature rising time of 20 minutes, temperature falling time of 20 minutes and in/out total time of 60 minutes. After firing, the alumina green sheet was removed easily.

Figure 16A:
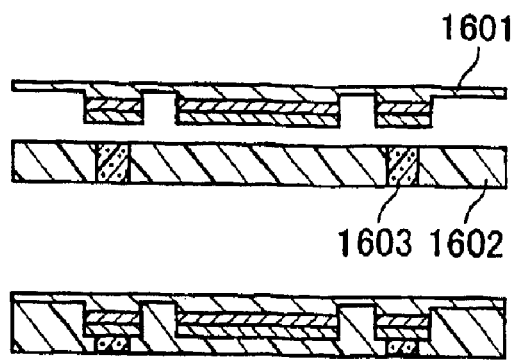
FIGS. 16A to 16C are cross-sectional views schematically showing one example of a process for producing a multi-layered wiring substrate using the transfer material of the present invention.
Figure 16B:
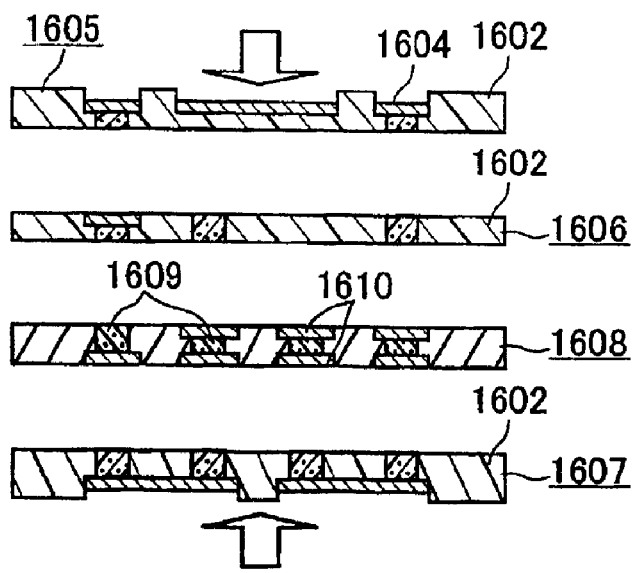
Figure 16C:
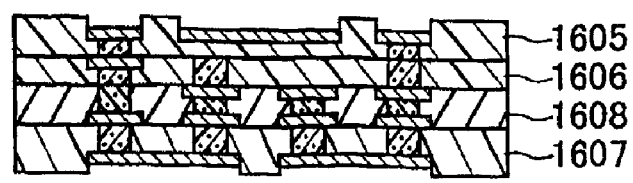

Furthermore, as shown in FIG. 16B, wiring substrates 1605, 1606, and 1607 made of composite materials were laminated as shown in FIGS. 16A to 16C, with the ceramic wiring substrate 1608 that has been produced as mentioned above being sandwiched therebetween as shown in FIG. 16B. Thus, a laminate in which all layers were interlayer connected was obtained.

Herein, the method for producing the composite wiring substrate 1605 etc. is described. As shown in the uppermost part of the FIGS. 16A and 16B, by using the first transfer material 1601 (the same as in Example 1) according to the present invention, the wiring pattern formed on the first transfer material is transferred to an uncured composite sheet (having the same composition as in Example 5, so that a single-layered wiring substrate 1605 having a wiring pattern 1604 is formed. The composite sheet 1602 is provided with thorough holes, and the through holes are filled with a conductive paste 1603. By the same method, the single-layered substrates 1606 and 1607 using the composite sheet 1602 are produced.

Thereafter, the composite single-layered wiring substrates 1605 to 1607 were laminated on both surfaces of the ceramic wiring substrate 1607, and subjected to the thermal press treatment at a pressing temperature of 200° C. and a pressure of about 2.94×10⁶ Pa (30 kgf/cm²) for 60 minutes. With this heating and pressing treatment, an acrylic resin in the composite sheet 1602 in the single-layered wiring substrates 1605 to 1607 was fused and softened. Thus, the entire wiring substrate including the ceramic layer 1608 was cured and integrated into one piece as shown in FIG. 16C.

By the same method as in this Example, a multi-layered wiring substrate including a composite wiring substrate and the ceramic wiring substrate was produced as shown in FIG. 11 or FIG. 12. The configuration is the same as that of the multi-layered wiring substrate shown in FIG. 11 or FIG. 12.

When the multi-layered wiring substrate shown in FIGS. 11 and 12 produced by a method of this Example was observed by the use of an X-ray, no damaged portions such as cracks were generated in the ceramic layer.

In addition, when the via connection resistance was evaluated, it was shown that the multi-layered substrate had a low resistant via connection.

As shown in FIG. 11, when the ceramic wiring substrate 1608 was not provided with the inner via holes and Ba—Ti—O ceramic was used for a capacitance layer, the high capacitance of 10 to 50 nF/cm² was realized easily.

Furthermore, an inner electrode layer may be formed on the resin substrate layer 1602 or may be formed in the ceramic layer 1608.

In addition, in this Example, the first transfer material was used for producing the wiring layer of each single-layered wiring substrate. However, when the second or third transfer material may be used, it is also possible to produce multi-layered wiring substrate having a wiring layer including a plurality of metal layers.

EXAMPLE 9

Figure 17A:
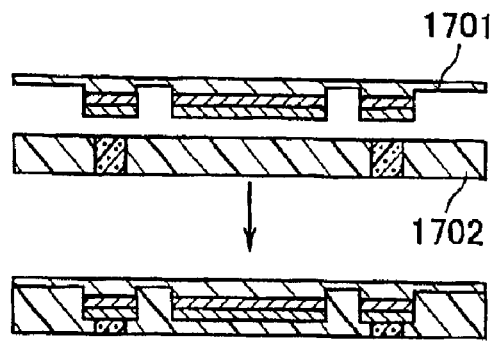
FIGS. 17A to 17C are cross-sectional views schematically showing another example of a process for producing a multi-layered wiring substrate using the transfer material of the present invention.
Figure 17B:
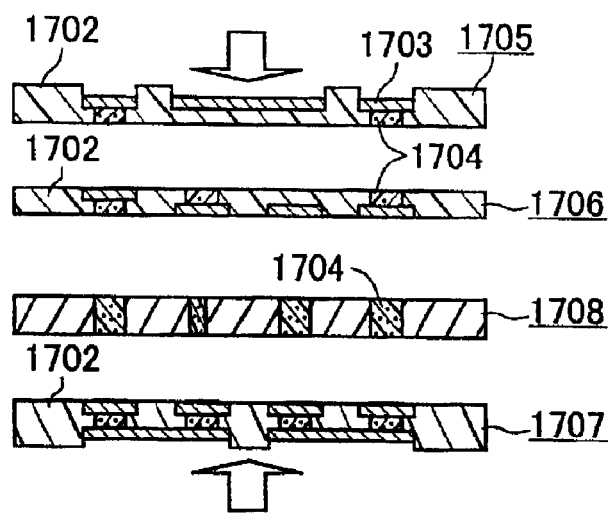
Figure 17C:
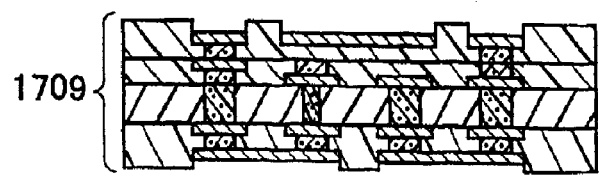

Another ceramic wiring substrate was produced. The ceramic wiring substrate has substantially the same configuration as in Example 8 except that a ceramic wiring substrate that forms a ceramic layer is formed of such a material as $Al_2O_3$ sintered only at high temperature. FIGS. 17A to 17C show the production process of the multi-layered substrate of this Example.

The multi-layered wiring substrate of this Example is characterized by including a substrate having a high strength and a high thermal conductivity, which cannot be realized by a low temperature sintering ceramic, and a low resistance wiring of a copper foil, etc.

First, an alumina green sheet was prepared as a material for a ceramic wiring substrate. This green sheet was provided with through holes and burned before being filled with a conductive paste mentioned below. In the firing process, since positional data of the thorough holes were used also in the below mentioned resin substrate (composite wiring substrate), a green sheet formed of SiC that is not sintered at the firing temperature was laminated on both surfaces of the alumina green sheet. Then, the laminate was fixed by carrying out the binder removing process and firing in the air. First, in order to remove the organic binder in the alumina green sheet, the laminate was heated by the use of an electric furnace in nitrogen up to 700° C. while raising temperatures at 25° C./hour, and treated at 1600° C. for 2 hours. After firing, it was possible to remove a SiC layer easily and to obtain an $Al_2O_3$ substrate 1708 that has been sintered in a non-shrinkage state in the plane direction. In this Example, a non-shrinkage process using a constrained layer was carried out, however, a usual sintering and shrinkage process may be employed, in which equal shrinkage in three dimensions by correcting the shrinkage amount.

The via holes having a diameter of 0.15 mm that had been formed beforehand on the $Al_2O_3$, substrate 1708 were filled with a thermosetting conductive paste for filling via holes 1704 by a screen printing method. The conductive paste 1704 had the same component composition as explained in Example 8.

Furthermore, as shown in FIG. 17B, wiring substrates 1705 to 1707 made of the composite sheet 1702 were laminated with the $Al_2O_3$ substrate 1708 sandwiched therebetween. Thus, as shown in FIG. 17C, a multi-layered wiring substrate 1709 in which all layers were interlayer connected was obtained.

Herein, the method for producing the wiring substrates 1705 to 1707 using the composite sheet 1702 is described. As shown in FIG. 17A, the first transfer material 1701 (the same as in Example 8 according to the present invention is pressed onto the uncured composite sheet 1702 (the same configuration as in Example 8.

The composite sheet 1702 was provided with through holes, and the through holes were filled with a conductive paste 1704 that is the same paste filled in the $Al_2O_3$ substrate 1708. As positional data for forming through holes, the same data used in forming though holes on the $Al_2O_3$ substrate 1708 were used.

Then, similar to Example 8, by peeling off the carrier of the first transfer material together with the peel layer, only the wiring layer of the first transfer material remains on the composite sheet 1702. Thus, as shown in the top part of the FIG. 17B, the composite wiring substrate 1705 having a wiring layer 1703 was produced. By the same method, composite substrates 1706 and 1707 were produced.

Thereafter, the composite wiring substrates 1705 to 1707 were laminated on both surfaces of the $Al_2O_3$ substrate 1708, and subjected to the thermal press treatment at a pressing temperature of 200° C., and at a pressure of about $2.94 \times 10^6$ Pa (30 kgf/cm$^2$) for 60 minutes. With this heating and pressing treatment, an acrylic resin in the composite sheets 1705 to 1707 were fused and softened. Thus, the entire wiring substrates including the $Al_2O_3$ substrate 1708 were cured and integrated into one piece as shown in FIG. 17C. Thus, a multi-layered wiring substrate 1709 was produced. The multi-layered wiring substrate has the same configuration as the multi-layered wiring substrate shown in FIG. 13.

When the multi-layered wiring substrate shown in FIG. 17C and FIG. 13 were observed by the use of an X-ray, no damaged portions such as cracks were generated in the $Al_2O_3$ substrate. Since the $Al_2O_3$ substrate had a strong mechanical strength, even if the pressure was set to be about $9.8 \times 10^6$ Pa (100 kgf/cm$^2$), no damaged portions such as cracks were observed. Thus, it was possible to obtain a multi-layered wiring substrate excellent in mechanical strength such as transverse strength etc.

In addition, when the via connection resistance of the multi-layered wiring substrate 1709 was evaluated, a copper wiring formed in a composite layer served as the low resistance wiring formed in a $Al_2O_3$ layer. A low resistance via connection and wiring resistance were confirmed. The thermal conductivity of the multi-layered substrate 1709 was a high thermal conductivity of about 6 W/m·K, because a composite sheet having a high thermal conductivity was used for the resin substrate.

In this Example, the ceramic layer and the composite layer used the same conductive resin paste so as to form an inner via. However, different thermosetting conductive pastes may be used. Furthermore, the base material used for the ceramic layer is not limited to $Al_2O_3$, and AlN having a high thermal conductivity, a low temperature burned glass ceramic, and the like, may be used.

EXAMPLE 10

In the multi-layered wiring substrates in Example 8 or 9, the wiring substrate including a resin sheet on the surface portion and a ceramic substrate in the middle layer. In this Example, as shown in FIG. 14, a ceramic layer 1801, a resin sheet 1803, and a ceramic layer 1802 were laminated in this order. In other words, the ceramic wiring substrate was placed on the surface portion and the wiring substrate using a resin sheet was placed the inside layer.

In the multi-layered wiring substrate of this Example, a high dielectric layer such as a $Nd_2O_5$—$TiO_2$—$SiO_2$ based glass ceramic etc. is used as a ceramic layer 1801 and a low dielectric layer formed of $Al_2O_3$ layer and borosilicate glass was used for a ceramic layer 1802. Thus, two layers each having the different dielectric constant were laminated via the resin sheet 1803 so as to form a dissimilar laminate.

The ceramic layer is not necessarily limited to such a combination. First, a dissimilar laminate including different kinds of dielectric layers, for example, a magnetic material such as ferrite, etc. and a Ba—Ti—O based dielectric material is also possible.

The multi-layered wiring substrate has the following advantages. First, when the different kinds of ceramic layers are laminated directly, problems, for example, a mutual diffusion, warp, or the like, occur. Therefore, it may be difficult to combine ceramic layers in accordance with the kinds of ceramic layers. However, by interposing a resin sheet between ceramic layers, it was possible to laminate the different kinds of layers easily regardless of the kinds of ceramic layers. Secondary, since the resin sheet is interposed between the ceramic layers, at the time of laminating layers, no damaged portions such as cracks are generated in the ceramic layer.

The multi-layered wiring substrate of this Example was produced as shown in FIG. 18.

First, a $Nd_2O_5$—$TiO_2$—$SiO_2$ based glass ceramic green sheet 1801 and a green sheet 1802 formed of an $Al_2O_3$ layer and a borosilicate glass (the same, configuration as in Example 8) were prepared.

Figure 18A:
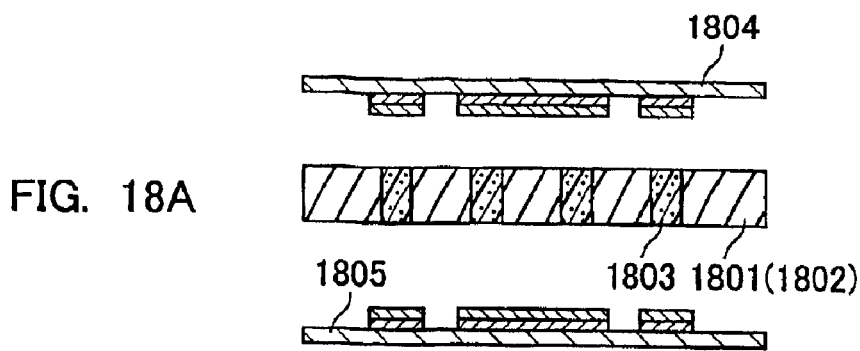
FIGS. 18A to 18E are cross-sectional views schematically showing a further example of a process for producing a multi-layered wiring substrate using the transfer material of the present invention.
Figure 18B:
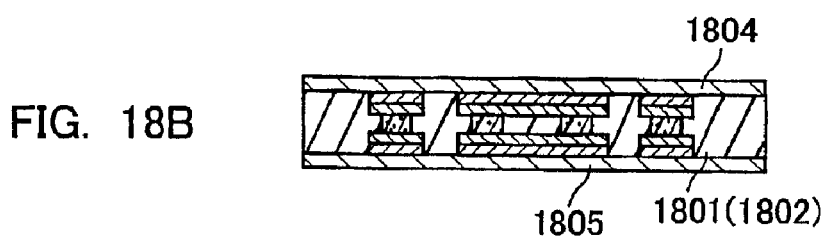
Figure 18C:

These green sheets were provided with through holes and the through holes were filled with a conductive paste 1803 (the same as in Example 8. Then, as shown in FIG. 18A, transfer materials 1804 and 1805 having a wiring pattern were laminated while positioning from both surfaces. The laminate was heated and pressed at 80° C. as shown in FIG. 18B, and thereafter the carrier was peeled off. Thereby, as shown in FIG. 18C, the wiring patterns of the transfer materials 1804 and 1805 were transferred and formed on the green sheet 1801. Similarly, wiring patterns were transferred to the green sheet 1802.

In this Example, as a positioning means for forming laminate, a pin lamination is employed. Therefore, at predetermined positions on the green sheet 1801 and 1802, through holes having diameters of 3 mm φ to 3.3 mm φ were provided. Since the green sheets 1801 and 1802 share the positional data of the through holes with the resin substrate, they are required not to shrink in the firing process. Therefore, on both surfaces of the laminate, a green sheet formed of $Al_2O_3$ that is not sintered at the firing temperature was laminated, and the laminate was fixed by carrying out the binder removing process and firing in the air. First, in order to remove the organic binder in the green sheets 1801 and 1802, the laminate was heated in nitrogen by the use of an electric furnace up to 700° C. while raising temperatures at 25° C./hour, and treated at 900° C. for 2 hours. After firing, it was possible to remove the $Al_2O_3$ layer easily and to obtain a $Nd_2O_5$—$TiO_2$—$SiO_2$ based glass ceramic substrate (1801) and an $Al_2O_3$ group substrate (1802), which have been sintered in a non-shrinkage state in the plane direction.

Figure 18D:
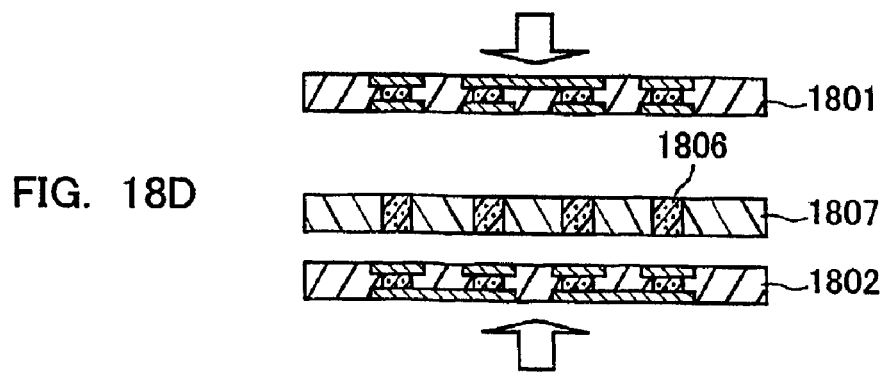

Next, as shown in FIG. 18D, a composite sheet 1807 filled with a conductive paste 1806 was placed between ceramic layers, that is, between the green sheets 1801 and 1802, and previously positioned thereof by the use of a pin. Thereafter, thermal press treatment was carried out at a pressing temperature of 170° C and a pressure of $7.84 \times 10^6$ Pa (80 kgf/cm$^2$) for 30 minutes.

Herein, when the pin for positioning had a diameter of 3 mm φ, via holes that was not filled with paste were partially shrunk. It was difficult to allow the pin to penetrate through some of the via holes. However, as to the via holes in which somewhat larger via holes (3.06 mm φ to 3.3 mm φ) were provided by punching by taking a shrinkage into account, it was possible to allow the pin to pass through the via holes without any difficulties. In this case, the punching diameter may set to be 3 mm φ and the diameter of the pin may be made to be thinner than 3 mm φ.

Figure 18E:
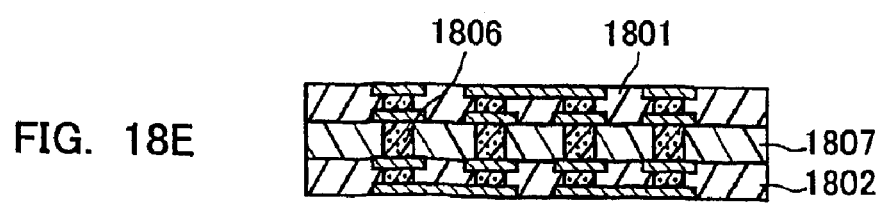

Furthermore, with the heating and pressing treatment at the time of pressing the laminate, the epoxy resin in the composite sheet 1807 was fused and softened. Thus, a multi-layered wiring substrate in which the green sheets 1801 and 1802 that are ceramic layers were integrated was obtained (FIG. 18E). The multi-layered wiring substrate has the same configuration as the multi-layered wiring substrate shown in FIG. 14.

In the composite sheet 1807 in this Example, the wiring pattern is not formed. Occasionally, a wiring pattern may be transferred in an uncured state.

Furthermore, in this Example, the composite sheet formed of an inorganic filler and an epoxy resin was used. However the composite sheet is not necessarily limited thereto, and any composite sheets, for example, a resin sheet without containing inorganic fillers, a prepreg containing glass fabrics, a prepreg formed of an aramide resin and a glass woven fabric, may be used.

In this Example, a sintering process that is not substantially shrunk in the plane direction was employed, however, a sintering process of an equal shrinkage in three dimension may be employed.

When the multi-layered wiring substrate shown in FIG. 18E was observed, no damaged portions such as cracks were generated in the ceramic layer.

In addition, when the via connection resistance of this laminate was evaluated, the low resistant via connection was confirmed. Furthermore, when the multi-layered wiring substrate was allowed to pass through a reflow furnace (JEDEC level 1) at 230° C. after moisture adsorption with respect to the multi-layered wiring substrate (85° C., 85 Rh, 168 hr), as compared with the case where the via connection resistance in which only resin substrates were laminated, the via connection resistance with extremely smaller resistance fluctuation was realized. This is an effect of the high adsorption resistance property of the ceramic layer.

On the other hand, as shown in for example FIG. 15, a configuration in which the resin base layer 1807 was laminated on both surfaces of the multi-layered substrate shown in FIG. 14 (or FIG. 18E) was produced as a trial product (configurations of the ceramic layer, and the resin based layer were the same as in this Example). When the drop test with respect to the trial product was carried out, as compared with the configuration using only the ceramic wiring substrate, it was confirmed that extremely little damage such as cracks was generated.

The base material to be used in the resin layer 1807 that is an outermost layer is not necessarily a composite sheet used in the middle layer. It can be selected for in accordance with the applications of use, and for example, a glass epoxy resin, etc. can be used.

The above-mentioned results show that the substrate having both an advantage of a ceramic and an advantage of a resin can be realized.

As mentioned above, the present invention can provide a transfer material capable of transferring a fine wiring pattern at a low temperature without distortion of pattern, reliably and easily. And by using the transfer material, it is possible to realize a wiring substrate having a fine wiring pattern and advantageous in flip-chip mounting of the semiconductor device, etc.

Furthermore, since the transfer material has a wiring layer formed in a convex shape, an IVH can be compressed easily. Thus, it is advantageous in stabilizing the via connection.

Furthermore, since the transfer material of the present invention transfers only the wiring pattern (second metal layer etc.), so that the materials for forming the first metal layer that is a carrier can be reused, thus realizing a low cost. Furthermore, it is useful from the viewpoint of industrial applicability.

Furthermore, the wiring substrate of the present invention has a configuration in which a wiring pattern is not projected from the substrate. Thus, the multi-layered wiring substrate in which a ceramic wiring substrate and a resin base wiring substrate are laminated, which has been difficult to form due to the damage for the ceramic layer at the lamination, easily can be produced.

Moreover, in each of the transfer materials of Examples 1 to 10, it is also possible to form circuit components such as an inductor, a capacitor, a resistor, a semiconductor device, or the like, for electrically connecting to the wiring pattern, and to transfer them to the substrate together with the wiring pattern. It is preferable that the passive components such as inductor, capacitor, and resistor, etc. are formed on the substrate by a printing method, for example a screen printing method.

Fifth Embodiment

In the above-mentioned embodiments, the transfer materials for transferring the wiring pattern to the substrate (first to third transfer materials) are explained. The following embodiments describe another transfer materials according to the present invention, that is, a component and wiring pattern transfer and formation material for transferring a wiring pattern and a circuit component to the substrate simultaneously.

Figure 19A:
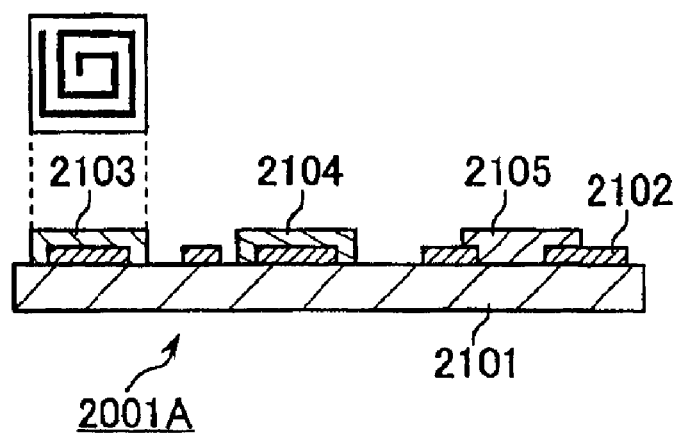
FIGS. 19A and 19B are cross-sectional views showing a schematic configuration of a circuit component and wiring pattern formation and transfer material (a fourth transfer material) according to a fifth embodiment of the present invention.
Figure 19B:
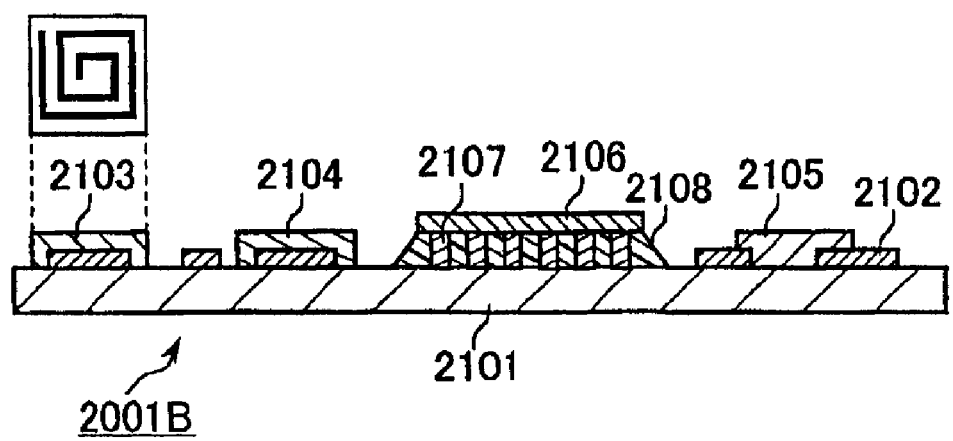

FIGS. 19A and 19B are cross-sectional views showing a schematic configuration of a component and wiring pattern transfer and formation material (hereinafter, fourth transfer material will be referred to) according to one embodiment of the present invention.

As shown in FIG. 19A, in a fourth transfer material 2001A, on a wiring pattern transfer and formation material having a two-layered structure in which a wiring metal foil 2102 that is a second metal layer is formed on a mold release carrier metal foil 2101 that is a first metal layer, circuit components (an inductor 2103, a capacitor 2104 and a resistor 2105) are formed for electrically connecting to the wiring metal foil 2102 by a printing method.

Furthermore, as shown in FIG. 19B, numeral 2001B denotes another embodiment of the fourth transfer material. The transfer material 2001B has substantially the same configuration as the transfer material 2001A shown in FIG. 19A. However, in this embodiment, not only a passive component such as the inductor 2103, the capacitor 2104, the resistor 2105, etc., but also a positive component such as a semiconductor chip 2106, etc. is flip-chip mounted on a connection portion 2107 so that the components are adhered to the wiring metal foil 2102.

Each of the transfer materials shown in FIGS. 19A and 19B is pressed onto the substrate and only the mold release carrier 2101 is peeled off. Thus, components excluding the mold release carrier 2101, that is, the metal foil for wiring 2102, the inductor 2103, the capacitor 2104, and the resistor

2105, etc., and a positive component such as the semiconductor chip 2106, etc. can be transferred to the substrate.

Sixth Embodiment

Figure 20:
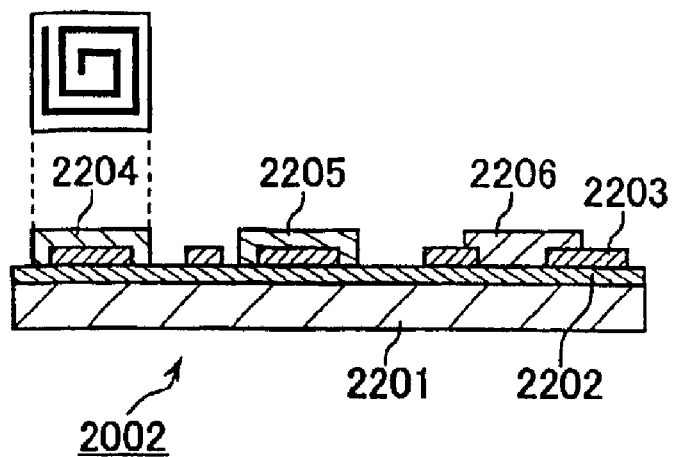
FIG. 20 is a cross-sectional view showing a schematic configuration of a circuit component and wiring pattern formation and transfer material (a fifth transfer material) according to a sixth embodiment of the present invention.

Next, FIG. 20 shows a schematic configuration of a component and wiring pattern transfer and formation material (hereinafter, a fifth transfer material will be referred to) according to a sixth embodiment of the present invention.

As shown in FIG. 20, in a fifth transfer material 2002, on a wiring pattern transfer and formation material having a three-layered structure in which a mold release carrier metal foil 2201 that is a first metal layer, a peel layer 2202 formed on the first metal layer, and a wiring metal foil 2203 that is a second metal layer formed on the peel layer 2202, an inductor 2204, a capacitor 2205 and a resistor 2206 are formed for electrically connecting the wiring metal foil 2203 by a printing method.

Seventh Embodiment

Figure 21:
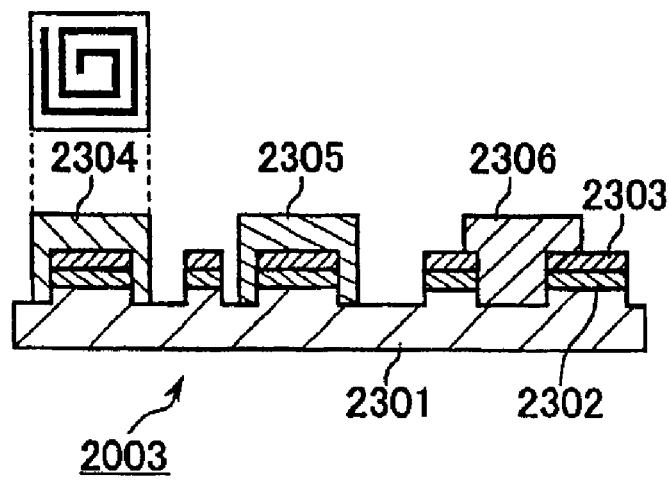
FIG. 21 is a cross-sectional view showing a schematic configuration of a circuit component and wiring pattern formation and transfer material (a sixth transfer material) according to a seventh embodiment of the present invention.

Next, FIG. 21 shows a schematic configuration of a component and wiring pattern transfer and formation material (hereinafter, a sixth transfer material will be referred to) according to a further embodiment of the present invention.

As shown in FIG. 21, in a sixth transfer material 2003, on a wiring pattern transfer and formation material having a three-layered structure in which a mold release carrier metal foil 2301 that is a first metal layer, a peel layer 2302, and a wiring metal foil 2303 that is a second metal layer, an inductor 2304, a capacitor 2305 and a resistor 2306 are formed for electrically connecting to the wiring metal foil 2303 by a printing method.

The mold release carrier metal foil 2301 has a concave and convex portion on the surface portion thereof The convex portion corresponds to a wiring pattern. On the region of the convex portions, a peel layer 2302 made of an organic layer or a metal plating layer and a metal foil for wiring 2303 are formed. The mold release carrier metal foil 2301 is adhered to the metal foil for wiring 2303 via the peel layer 2302.

It is preferable in the fourth to sixth transfer materials that the adhesive strength between the first metal layer and the second metal layer via the peel layer is weak, for example, 50 N/m (gf/cm) or less. In the fourth transfer material, by plating or an evaporation method, two metal layers are not peeled off from each other in the processes of etching, plating, washing in water, and the like. However, it is shown that only the second metal layer can be peeled off easily in a peeling process. Furthermore, a passive component pattern formed by a printing method can be peeled off easily from the first metal layer that is a carrier.

On the other hand, in the fifth and sixth transfer materials, a thin organic layer having an adhesive strength and a thickness of less than 1 $\mu$m is used for the peel layer. As the material for the organic layer, for example, an urethane resin, an epoxy resin, a phenol resin, and the like, which are thermosetting resins, can be used. However, the material is not necessarily limited thereto, and other thermoplastic resin, etc. can be used. However, if the thickness is 1 $\mu$m or more, the peeling property of the peel layer is deteriorated, which may make the transfer difficult.

On the other hand, in order to lower the adhesive strength intentionally, a plating layer may be interposed as the peel layer. For example, a nickel plating layer, a nickel-phosphorous alloy layer, an aluminum plating layer, or the like, having a thickness of less than 1 $\mu$m, can be used as the peel layer so as to provide the transfer material with a peeling property.

Thus, in the wiring portion including a second metal layer, at the time of transfer, the second metal layer can be peeled off from the first metal layer easily, and the second metal layer and component pattern can be transferred to the substrate easily. A suitable thickness of the peel layer formed of the metal layer is about 100 nm to 1 $\mu$m. Since the process cost is increased with the increase in thickness, the thickness is desirably less than 1 $\mu$m.

Moreover, in the fifth and sixth transfer materials, the second metal layer and the passive component pattern formed by a printing method can be peeled off easily from the first metal layer that is a carrier.

Furthermore, it is preferable in the fourth to sixth transfer materials that the first metal layer includes at least one metal selected from the group consisting of copper, aluminum, silver and nickel, and particularly copper. Furthermore, it is preferable that the second metal layer, similar to the first metal layer, includes at least one metal selected from the group consisting of copper, aluminum, silver and nickel. It is preferable that the fourth transfer material includes silver, and the firth and sixth transfer materials include copper. Copper is used for the first metal layer because of its low cost. Namely, copper foils having various kinds of predetermined thickness are commercially available. Copper is used for the second layer because of its easiness in plating.

Furthermore, in the sixth transfer material, there is an effect of controlling a process with one etching liquid if the first metal layer and the second metal layer are formed of the same metal. In particular, when the metal layers are formed of copper, it is advantageous in that the conditions for carrying out the etching process have been investigated in detail. Moreover, one kind of metal may be used, and the combination of two metals or more may be used.

Furthermore, it is preferable in, for example, an etching process etc. of the sixth transfer material that when the peel layer and the surface portion of the first metal layer are removed by etching process (see FIG. 21), the first metal layer and the second metal layer include the same metal component. Moreover, in a case where the plating layer is used for a peel layer, the configuration shown in FIG. 21 can be processed with a copper etching liquid, but the configuration shown in FIG. 20 cannot be processed with a copper etching liquid. Furthermore, in the case where the first metal layer and the second metal layer include the same metal components, the kinds of the metal are not particularly limited. However, it is formed of a copper foil preferably, and particularly preferably an electrolytic copper foil because of its excellent conductivity. Moreover, one kind of metal may be used, and the combination of two metals or more may be used.

In the fourth to sixth transfer materials, the thickness of the first metal layer is preferably 1 to 18 $\mu$m, and more preferably 3 to 12 $\mu$m. When the thickness is less than 3 $\mu$m, when the second metal layer is transferred to the substrate, an excellent electric conductivity may not be exhibited. On the contrary, when the thickness is 18 $\mu$m or more, it may be difficult to form a fine wiring pattern.

In the fourth and fifth transfer materials, the thickness of the first metal layer is preferably 4 to 10 $\mu$m, and more preferably 20 to 70 $\mu$m. The first metal layer serves as a carrier, and occasionally, as shown in FIG. 21, the surface portion thereof as well as the wiring pattern is etched so as to form a convex and concave portion. Therefore, the first metal layer is desired to be a metal layer having a sufficient thickness. Furthermore, since the fourth to fifth transfer materials have a carrier layer that is a metal layer (first metal layer), they exhibit sufficient mechanical strength or thermal resistance with respect to the thermal distortion or stress distortion in the direction of the plane, which are generated at the time of transfer.

The material for forming passive components electrically connected to the wiring pattern is a paste material. It is preferable that when the substrate to which the passive components are transferred is made of, for example, a thermosetting resin, a material for the passive components also contains the thermosetting resin. When the inductor is formed, a magnetic metal powder or ferrite is used as the filler to be mixed in the thermosetting resin. When the capacitor is formed, a high dielectric ceramic powder, for example, barium titanate, Pb based perovskite, or the like, is used similarly as the filler. When various kinds of resistors are formed, carbon, etc. is used as the filler. In this case, by varying the content of carbon, the resistance value can be adjusted. When the resistor is formed in a thin film, Nichrome alloy, chromium silicon, tantalum nitride, ITO, or the like, is used.

On the other hand, with the fourth or fifth transfer material, a pattern transfer can be formed at low temperature of 100° C. or less, so that it is possible to form a component wiring pattern on the ceramic green sheet.

On the other hand, when the substrate to which the passive components are transferred is a ceramic, a material (paste) to be used for printing the passive component is preferably a material in which only filler is remained through the binder removing process. Therefore, a vehicle in which a binder having an excellent thermal deformation property is dissolved, for example, paste vehicle in which a binder is dissolved in terpineol, is used. Specifically, the paste material capable of screen printing is formed by kneading various fillers corresponding to the property of the inductor, the capacitor, and the resistor, respectively, by the use of a triple roller.

When the inductor is formed, a material obtained by mixing a magnetic metal powder, or a ferrite that is sintered at low temperature as the filler with a glass is used as the filler. When the capacitor is formed, barium titanate, glass, and Pb based perovskite, and the like, is used as the filler similarly. When the resistor is formed, a material obtained by mixing a ruthenium pyrochlore, ruthenium oxide, lanthanum borite, as a filler, with glass is used. These materials can be sintered together with the substrate, ceramic that is sintered at a low temperature. Furthermore, even in the case of the inner layer resistor, it is possible to adjust the resistant value relatively easily.

Eighth Embodiment

One example of a method for producing the fourth transfer material (see FIGS. 19A and 19B) is described in this embodiment.

This production method includes the following steps (1) and (2);

(1) forming a two-layered structure in which a second metal layer 2403 that is a wiring pattern is directly adhered to the first metal layer 2401 that is a carrier (see FIGS. 22A to 22E); and (2) forming component patterns 2405, 2406, 2407 and 2408 by a printing method with positioning so that they are electrically connected to the second metal layer 2403 (see FIGS. 22E and 22E').

In the steps shown in FIGS. 22A to 22E', a pattern opposite to the wiring pattern is formed on the first metal layer 2401 by using a dry film resist 2404 and then, the wiring pattern formed of a metal foil (second meat layer 2403) is formed by a direct drawing method, for example, pattern plating or a sputtering method, an evaporation method, and the like. Thus, it is possible to form a fine wiring pattern.

Furthermore, when it is produced by plating, a metal foil forming a second metal layer 2402 may be the same as the metal foil (for example, a copper foil) forming the first metal layer 2401 or may be formed of a silver plating film that is a different metal. Furthermore, the metal foil of the first metal layer can be reused. Therefore, low cost can be realized and the industrial applicability is excellent.

A suitable method for forming passive components for electrically connecting the wiring pattern is a printing method. As the printing method, any of an off set printing, a gravure printing, a screen printing, etc, may be employed, however, the screen printing method is preferred. In the pattern used for the resistor, the suitable thickness sometimes is 1 μm or less. In such a case, a dielectric layer produced by a PVD method or a CVD method can be attached.

The line width of the wiring pattern is usually required to be as thin as about 25 μm. In the present invention, such a line width is preferred.

Ninth Embodiment

FIGS. 23A to 23F show one example of a method for producing the fifth transfer material (see FIG. 20).

This production method includes the following steps (1) to (3);

(1) forming a three-layered laminate in which a first metal layer 2501, a peel layer 2502 made of an organic layer or a metal plating layer and the second metal layer 2503 containing the same metal component as that contained in the first metal layer 2501 are laminated (see FIG. 23A);

(2) forming a wiring pattern for transfer 2503a (see FIG. 23E) by processing the second metal layer 2503 into a wiring pattern, with an entire peel layer maintained, by a chemical etching process (see FIGS. 23B to 23E); and (3) forming component patterns (an inductor 2505, a capacitor 2506 and a resistor 2507) by a printing method with positioning so that they are electrically connected to the layer 2503 (see FIG. 23F);

In the process for forming the wiring pattern described in (2), in the step shown in FIG. 23B, a dry film resist 2504 is adhered to the second metal layer 2503. In the step shown in FIG. 23C, the wiring pattern region is formed by exposing the pattern. In the step shown in FIG. 23D, the dry film resist is removed from a region (2504b) excluding the wiring pattern 2504a by developing and etching. In the step shown in FIG. 23E, the remained dry film resist is removed.

Specifically, the chemical etching process is carried out as follows. When the aqueous solution of basic cupric chloride including an ammonium ion is used as an etchant, when the peel layer 2502 is formed of, for example, a nickel-phosphorous alloy layer, only the second metal layer 2503 can be etched. Thereafter, by using, as an etching liquid, a mixed liquid including nitrate and hydrogen peroxide solution, only the peel layer 2502 can be removed. With this method, the wiring portion transferred to the substrate does not become a concave portion. Thus, the surface of the substrate can be made flat.

Tenth Embodiment

Next, FIGS. 24A to 24F show one example of a method for producing the sixth transfer material (see FIG. 21).

The steps of FIGS. 24A to 24F are the same as in the method for producing the fifth transfer material of the ninth embodiment except the following steps.

In other words, in the method for producing the fifth transfer material, only the second metal layer and the peeling layer are processed into the pattern by a chemical etching process, however, in the method for producing the sixth transfer material, the surface portion of the first metal layer 2601 also is processed into the wiring pattern by the chemical etching process as shown in FIGS. 24D and 24E.

Namely, a convex and concave portion is formed on the surface portion of the first metal layer 2601. As shown in FIG. 24F, component patterns (an inductor 2605, a capacitor 2606, and a resistor 2607) are formed by printing with positioning so that the components are electrically connected to the wiring pattern.

According to the method for producing the fourth to sixth transfer materials, it is possible to form a fine wiring pattern because the metal layer of the wiring pattern is formed by a chemical etching process such as photolithography, etc. Furthermore, in the case of the method for producing the sixth transfer material, by making the metal foil of the wiring pattern (second metal layer) to be the same as that contained in the metal foil of a carrier (first metal layer), it is possible to make the surface portion of the carrier to have the same convex and concave portion as that of the wiring pattern in one etching process.

As mentioned above, it is possible to reuse the component materials except the second metal layer. Furthermore, in the sixth transfer material, since the first metal layer is processed in a wiring pattern, it is possible to reuse the first metal layer in a different pattern formation as letterpress printing. Therefore, a low cost and excellent industrial applicability can be realized.

Moreover, in the method for producing the fourth to sixth transfer materials, the second metal layer is formed by electrolytic plating. Furthermore, a further metal layer (third metal layer) may be formed by electrolytic plating on the second metal layer. When the third metal layer or second metal layer for forming wiring pattern is formed by electrolytic plating, appropriate adhesive strength can be obtained between the second metal layer and the third metal layer. Moreover, a gap between the metal layers occurs, so that an excellent wiring pattern can be formed. Or, the pattern can be formed by masking the wiring pattern after the third metal layer is formed on the second metal layer by panel plating. In this case, an effect of preventing the surface of the transferred second metal layer from being oxidized and improving the wettability of the soldering can be obtained.

Moreover, it is preferable in the method for producing the wiring pattern for transfer that before the third metal layer is formed on the second metal layer, the surface of the second metal layer is roughened. The term "before the third metal layer is formed" means before a mask for forming the wiring pattern is formed on the second metal layer, or before the third metal layer is formed along the wiring pattern on the second metal layer on which masking is performed in the wiring pattern Thus, the second metal layer is roughened, the adhesion between the second metal layer and the third metal layer is improved.

Furthermore, it is preferable in the method for producing the transfer material that the fourth metal layer that is different from the first to third metal layers can be formed by electrolytic plating. It is preferable that by selecting a component that is chemically stable with respect to the etching liquid corroding the first to third metal layers as the material for the fourth metal layer, the second, third, and fourth metal layers can be processed into the wiring pattern along with the surface layer portion of the first metal layer without reducing the thickness of the second, third, and fourth metal layers.

For the fourth metal layer, for example, Ag, Au, or the like, having chemical stability and the low resistance property are desirable. Since these metals are not likely to be oxidized, the adhesion between the plating wiring layer plated with these metals and for example, a via hole that is preliminarily formed on the substrate, a bump of a bare chip, or conductive adhesive can be further stabilized.

In the method for producing the fifth and sixth transfer materials, as a method for forming passive components for electrically connecting the wiring pattern, a printing method is suitable same as in the fourth transfer material. When the peel layer is formed of a plating layer such as a nickel plating layer or a nickel-phosphorous alloy layer, as the printing method, any of an off set printing, a gravure printing, screen printing, etc may be employed, and the screen printing is preferred.

Furthermore, the materials used for printing of the component pattern are preferred to be paste. As in the fourth transfer material, when the substrate-on which the passive components are transferred is made of, for example, a thermosetting resin, a material for the passive components also contains the thermosetting resin. When the inductor is formed, as the filler to be mixed with the thermosetting resin, a magnetic metal powder or ferrite can be used. When the capacitor is formed, as the filler similarly, high dielectric ceramic powder, for example, barium titanate, Pb based perovskite, or the like, can be used. When the resistor is formed, as the filler, carbon is used. As to the resistance value, by varying the content of carbon, the resistance value can be controlled. When the resistor is formed in a form of a thin film. The material for a resistor and the production method are the same as in the fourth transfer material.

Since in the fifth transfer material, like a fourth transfer material, a pattern transfer can be formed at low temperature of 100° C. or less, so that it is possible to form a component wiring pattern on the ceramic green sheet.

When the substrate on which the components are transferred is a ceramic substrate, a material (paste) to be used for printing the component pattern is preferably a material in which only the filler remains after a binder removing process. Therefore, a vehicle in which a binder having an excellent thermal deformation property is dissolved, for example, paste vehicle in which a binder is dissolved in terpineol is used. Specifically, the paste material capable of screen printing is formed by kneading various fillers corresponding to the property of the inductor, capacitor, and resistor, respectively, by using a triple roller.

When the inductor is formed, a material obtained by mixing a glass and filler is used. As the filler, a magnetic metal powder and a ferrite that is sintered at low temperature with are used. When the capacitor is formed, as the filler similarly, barium titanate, Pb based perovskite, or the like is used. When the resistor is formed, as the filler, a material obtained by mixing a ruthenium pyrochlore, ruthenium oxide, lanthanum borite with a glass is used. These materials can be sintered together with the ceramic substrate that is sintered at a low temperature. Furthermore, even in the case of an inner layer resistor, it is possible to adjust the resistance value relatively easily.

These two kinds of fifth and sixth component and wiring pattern formation and transfer materials can be used in different ways appropriately. For example, when the component wiring pattern formed in the transfer material is transferred to the inside layer of the laminate substrate, in particular, when the via is formed directly on the via, it is preferable that the transfer material shown in FIG. 20 (fifth transfer material) is preferably used, from the viewpoint of the via connection.

On the other hand, when transferred to the surface portion, in particular, when the distance between terminals of the inductor, capacitor, semiconductor chip is small, the transfer material (sixth transfer material) that is partially processed to the carrier layer shown in FIG. 21 is preferred form the purpose of reducing the creeping distance.

Eleventh Embodiment

Next, FIGS. 22G, 22G', 23H, and 24H show one embodiment of the circuit component produced by the use of the fourth to sixth transfer materials.

A circuit substrate using the fourth to sixth transfer materials can be produced by at least two methods. The first method for producing this embodiment includes the following steps:

A step in which the transfer materials of the fifth to seventh embodiment are prepared (see FIGS. 22E, 23F, and 24F). This transfer material is placed so that the side on which the component wiring patterns are formed is brought into contact with a least one surface of the substrate so as to adhere thereto.

A step in which by peeling off first metal layer that is a carrier from the transfer material adhered to the base material sheet, the component wiring pattern including at least the second metal layer and the component pattern is transferred to the base material sheet. Thus, a substrate in which components are incorporated is produced (see FIGS. 22G, 23H, and 24H).

Thus, the fine wiring pattern and the component pattern including an inductor, a capacitor, and a resistor, and a semiconductor chip is formed on the base material sheet in flat form (see FIGS. 22G and 23H) or in a form of a concave shape (see FIG. 24H). Furthermore, in the thus produced wiring substrate, when for example the wiring portion is in a concave shape (FIG. 24H), the positioning of the wiring portion and the bump of the semiconductor chip can be carried out easily and the excellent flip-chip mounting of the semiconductor is provided.

Twelfth Embodiment

Figure 25:
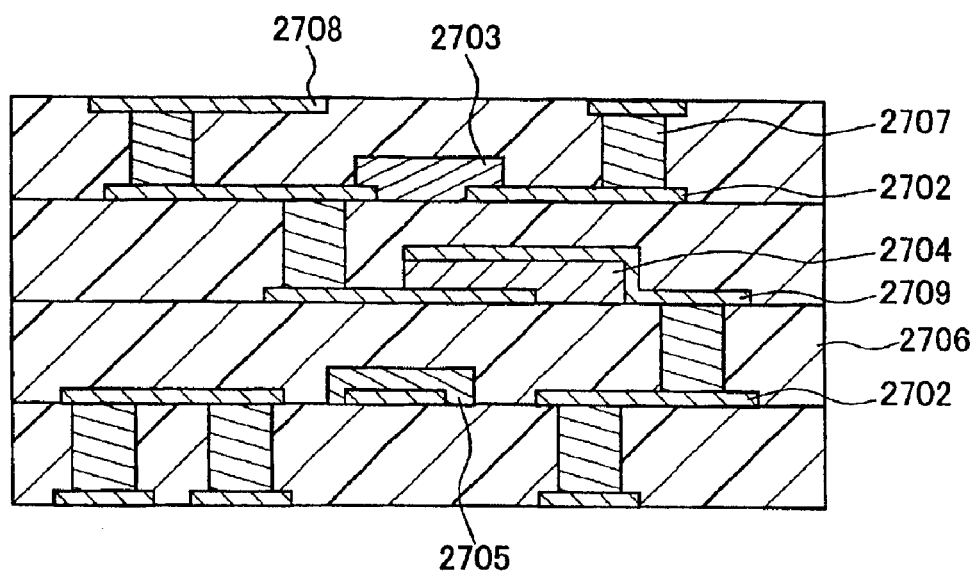
FIG. 25 is a cross-sectional view showing a multi-layered circuit substrate produced by using the fourth to sixth transfer materials.

Furthermore, the second method for producing the circuit substrate of the present invention is a method for producing a multi-layered circuit substrate shown in FIG. 25. In this production method, the substrate circuits (see FIGS. 22G, 23H, 24H, and the like) obtained in the eleventh embodiment are laminated in two layers or more.

Herein, numeral 2702 and 2709 denote a second metal layer forming a wiring pattern, 2703 denotes a resistor, 2704 denotes a capacitor, 2705 denotes an inductor, and 2706 denotes a base material sheet.

Since with this circuit substrate, a component pattern and a wiring pattern can be transferred and formed at low temperature of 100° C. or less, it is possible to maintain an uncured state not only in the ceramic green sheet but also in the sheet using a thermosetting resin. Thus, the circuit substrate is laminated in two layers or more in an uncured state and then the laminate is heated and cured in one operation.

Therefore, in the multi-layered circuit substrate of four layers or more, it is not necessary to correct the curing and shrinkage for each layer. Thus, it is possible to form a multi-layered circuit substrate having a fine wiring pattern and a component pattern can be produced. However, the shape of the wiring portion and the component portion forming an inner layer is not necessarily concave but may be flat. Therefore, the circuit substrate etc. as shown in FIGS. 22G and 23H can be used.

It is preferable in the production method described in the eleventh embodiment and this embodiment that the base material sheet includes an inorganic filler and a thermosetting resin, is provided with at least one through hole and the through hole is filled with a conductive paste. Thus, it is possible to obtain a composite wiring substrate for high-density mounting, which has an excellent thermal conductivity and has an IVH structure in which the wiring pattern is electrically connected to the conductive paste easily.

Furthermore, when the base material sheet is used, when the wiring substrate is formed, high temperature treatment is not required. This can be performed sufficiently at about 200° C., i.e., the curing temperature of the thermosetting resin.

The base material sheet preferably contains 70 to 95 weight % of an inorganic filler and 5 to 30 weight % of a thermosetting resin, and more preferably contains 85 to 90 weight % of an inorganic filler and 10 to 15 weight % of a thermosetting resin. Since the base material sheet can contain inorganic fillers with a high concentration, by changing the content of inorganic fillers, the coefficient of thermal expansion, thermal conductivity, dielectric constant, and the like, can be set arbitrarily.

It is preferable that the inorganic filler includes at least one inorganic filler selected from the group consisting of $Al_2O_3$, MgO, BN, AlN and $SiO_2$. By determining the kinds of inorganic filler properly, it is possible to set, for example, the coefficient of thermal expansion, thermal conductivity, and dielectric constant to the desirable conditions. For example, it is possible to set the coefficient of thermal expansion of the base material sheet in the plane direction to be substantially the same as the coefficient of thermal expansion of a semiconductor to be mounted, and to provide a high thermal conductivity.

The base material sheet using, for example, $Al_2O_3$, BN, AlN and the like, among the inorganic fillers, is excellent in thermal conductivity. The base material sheet using MgO is excellent in thermal conductivity and capable of raising the constant of thermal expansion. Furthermore, when $SiO_2$, particularly amorphous $SiO_2$ is used, a base material sheet having a small constant thermal expansion, a light weight and low dielectric constant can be obtained. Moreover, the inorganic filler can be used singly or by combination of two kinds or more of the inorganic fillers.

The base material sheet including the inorganic filler and the thermosetting resin composition can be produced by, for example, the following method. First, a solution for adjusting the viscosity is added into a mixture including the inorganic filler and the thermosetting resin composition so as to prepare slurry having an arbitrary slurry viscosity. An example of the solvent for adjusting the viscosity includes, for example, methyl ethyl ketone, toluene, and the like.

Then, the slurry is formed into a film on the preliminarily prepared mold release film by a doctor blade method, etc. and the film is treated at a temperature below the curing temperature of the thermosetting resin so as to volatilize the solvent for adjusting the viscosity. Thereafter, the mold release film is removed, thereby producing a base material sheet.

The thickness of the film at the formation is appropriately determined by the amount of the solvent for adjusting viscosity to be added. Usually the thickness ranges from 80 to 200 μm. Furthermore, the conditions for volatilizing the solvent for adjusting viscosity is appropriately determined in accordance with the kinds of solvents for adjusting viscosity, kinds of thermosetting resins, or the like. However, usually, the volatilization is carried out at a temperature of 70 to 150° C. for 5 to 15 minutes.

As the mold release film, usually, an organic film can be used. For example, it is preferable to use an organic film containing at least one resin selected from the group consisting of, for example, polyethylene, polyethylene terephthalate, polyethylene naphthalate, polyphenylene sulfide (PPS), polyphenylene terephthalate, polyimide and polyamide, and more preferably PPS.

Furthermore, another example of the base material sheet includes a sheet reinforcer impregnated with a thermosetting resin composition, and having at least one through hole filled with a conductive paste.

The sheet reinforcer is not particularly limited as long as it is a porous material capable of holding the thermosetting resin. However, it is preferable that the sheet reinforcer is at least one selected from the group consisting of a glass fiber woven fabric, a glass fiber non-woven fabric, a woven fabric of a thermal resistant organic fiber and a non-woven fabric of a thermal resistant organic fiber. An example of the thermal resistant organic fiber includes, for example, all aromatic polyamide (aramide resin), all aromatic polyester, polybutylene oxide, and the like. In particular, aramide resin is preferable.

The thermosetting resin is not particularly limited as long as it has a thermal resistance property. However, because of its excellent thermal conductivity, a resin containing at least one selected from the group consisting of an epoxy resin, a phenol resin, a cyanate resin and a polyphenylene phthalate resin. Furthermore, the thermosetting resin can be used singly or by combination of two kinds or more of the thermosetting resins.

Such a base material sheet can be produced, for example, by immersing the reinforcer sheet into the thermosetting resin composition, and then drying to half-cured state.

It is preferable that the immersion is carried out so that the rate of the thermosetting resin with respect to the base material sheet is 30 to 60 weight %.

It is preferable in the production method that when the base material sheet containing a thermosetting resin is used, the wiring substrates are laminated by a heating and pressing treatment so as to cure the thermosetting resin. This can be performed sufficiently at about 200° C., i.e., the curing temperature of the thermosetting resin.

The reinforcer sheet may be a film such as polyimide, LCP, aramide etc. coated with the thermosetting resin.

On the other hand, the wiring substrate is not necessarily limited to the resin substrate, and it may be a ceramic substrate. In this case, a green sheet containing an organic binder, plasticizer, and ceramic powder and having at least one through hole filled with the conductive paste can be used as a base material sheet. This base material sheet has a high thermal resistance, an excellent sealing property and excellent thermal conductivity.

The ceramic powder preferably contains at least one ceramic selected from the group consisting of $Al_2O_3$, MgO, $Zro_2$, $TiO_2$, BeO, BN, $SiO_2$, CaO and glass. More preferably, the ceramic powder is a mixture of 50 to 55 weight % of $Al_2O_3$ and 45 to 50 weight % of glass powder. Moreover, the ceramic can be used singly or in combination of two kinds or more of them.

An example of the binders to be used includes, for example, polyvinyl butyrate (PVB), acrylic resin, methyl cellulose resin, and the like. An example of the plasticizer includes, for example, butyl benzyl phthalate (BBP), dibutylphthalate (DBP), and the like.

Such a green sheet containing a ceramic can be produced by, for example, the same method as that for producing the base material sheet including the inorganic filler and the thermosetting resin. Moreover, the treating conditions are appropriately determined by the kinds of the component materials, etc.

For example, when the second metal layer 2403 of the transfer material shown in FIG. 22, which is a wiring layer, is formed of silver, since silver has an oxidation resistant property, a binder removing process and firing in the air are possible. Thus, the production process becomes easy. On the other hand, when the second metal layer 2503 and 2603 of the transfer materials shown in FIGS. 23 and 24 are formed of copper, the wiring portion to be transferred is a base metal that is likely to be oxidized easily, the binder removing process in a non-oxidization atmosphere, for example in an nitrogen atmosphere, or nitrogen firing process is required. Therefore, the green sheet is required to have a configuration corresponding to the nitrogen process. Furthermore, also vehicle and binder used for printing of the inductor, capacitor, and resistor, are strongly required to have a thermal deposition property under the non-oxidation atmosphere.

The thickness of the base material sheet is usually 100 to 250 µm.

It is preferable that the base material sheet has at least one through hole and the through hole is filled with a conductive paste. The position of the through hole is not particularly limited as long as the through hole is formed so that it is in contact with the wiring pattern. However, it is preferable that through holes are positioned at equal intervals of 250 to 500 µm pitch.

The size of the through hole is not particularly limited, but usually, the diameter is 100 to 200 µm, and more preferably 100 to 150 µm.

The method for forming through holes is appropriately determined in accordance with the kinds of the base material sheet, etc. However, the preferable example of the method includes, for example, a carbon dioxide gas laser process, a process with a punching machine, a bulk process with a mold, and the like.

The conductive paste is not particularly limited as long it has conductivity. However, usually, a resin containing a particulate conductive metal, and the like, can be used. An example of the conductive metal material to be used includes, for example, copper, silver, gold, silver-palladium, and the like. An example of the thermosetting resin includes an organic binder of, for example, an epoxy resin, a phenol resin, a cellulose resin, an acrylic resin, and the like.

The amount of the conductive metal material in the conductive paste is usually 80 to 95 weight %. Furthermore, when the base material sheet is a green sheet, thermal plasticizer binder is used instead of thermosetting, and glass powder is used as an adhesive agent.

Next, the method for adhering the transfer material to the base material sheet and the method for peeling off the first metal layer from the second metal layer are not particularly limited. However, when the base material sheet includes a thermosetting resin, for example, the adhering method and the peeling method can be carried out as follows.

First, the transfer material (FIG. 23F) and the base material sheet 2508 are placed as shown in FIG. 23G, and heated and pressed so as to fuse and soften the thermosetting resin in the base material sheet, thus allowing the metal layer 2503 having a wiring patterns and passive component patterns 2505, 2506, and 2507 to be embedded in the base material sheet. Herein, numeral 2505 denotes an inductor, 2506 denotes a capacitor, and 2507 denotes a resistor. However, it is preferable that when a circuit component such as a capacitor that needs to have electrodes on both surfaces of the dielectric layer is transferred, only the wiring pattern 2510 corresponding to the wiring pattern is preliminarily formed on the base material sheet 2508 preliminarily (see FIG. 23G,).

Then, the base material sheet on which the transfer material is pressed is treated at a softening temperature or a curing temperature of the thermosetting resin. In the latter case, the resin is cured, which allows the adhesion between the transfer material and the base material sheet and the adhesion between the second metal layer 2503 and the base material sheet 2508 to be fixed.

The conditions for heating and pressing treatment are not particularly limited as long as the thermosetting resin is not perfectly cured. However, the heating and pressing usually can be carried out under the pressure of $9.8 \times 10^5$ to $9.8 \times 10^6$ Pa (10 to 100 kgf/cm$^2$), at the temperature of 70 to 260° C. for 30 to 120 minutes.

Then, after the transfer material (FIG. 23F) and the sheet substrate 2508 are adhered to each other, for example, the first metal layer 2501 that is the carrier layer is pulled so as to peel it off with the peeling layer. Thus, the first metal layer 2501 can be peeled off from the second metal layer 2503 and the passive component 2505, 2506 and the 2507.

Namely, since the adhesive strength between the first metal layer and the second metal layer via the peeling layer is weaker than the adhesive strength between the base material sheet and the second metal layer that is a wiring layer, the adhering surface between the first metal layer and the second metal layer is peeled off, and only the second metal layer is transferred to the base material sheet while the first metal layer is peeled off (see FIG. 23H).

Curing of the thermosetting resin may be carried out after the first metal layer is peeled off from the component wiring pattern.

On the other hand, when the base material sheet is a green sheet forming the ceramic substrate, the following method can be employed. For example, in FIGS. 22A to 22D, a copper foil is used for the first metal layer, and silver wiring is formed for the second metal layer 2403 that is a wiring layer. Thereafter, a passive component etc. is formed by a screen printing method for electrically connecting the silver wiring, thus forming a component for transfer and a wiring pattern. However, since in the case of the ceramic substrate, firing also is carried out, the semiconductor chip as shown in FIG. 22E' is not mounted. By carrying out the same heating and pressing treatment as mentioned above, the component wiring pattern is allowed to be embedded in the green sheet that is a base material sheet and to adhere the green sheet and the component wiring pattern for transfer.

Thereafter, as mentioned above, by peeling the carrier, the component material other than the component wiring pattern is removed. Then, on the green sheet on which the component wiring pattern is transferred, an alumina green sheet for constraint is laminated. Thereafter, the binder removing process and the sintering treatment are carried out in the air, thus to sinter the ceramic and to fix the transferred second metal layer and the component pattern onto the ceramic substrate. Since the transfer material has a wiring pattern made of silver, it is advantageous that the binder removing process and the firing can be carried out in the air.

On the other hand, in the case of the methods shown in FIGS. 23A to 23H, and the FIGS. 24A to 24H, the first metal layer is formed of a copper foil, and a copper wiring is formed as the second metal layer, that is, a wiring layer is formed by a chemical etching process using the photolithography. The copper wiring can be produced more cheaply than the silver wiring produced by plating, and is excellent in migration resistance property. Thereafter, a passive component etc. is formed by a screen printing method for electrically connecting to the copper wiring. Thus, the component wiring pattern for transfer is produced.

However, since in the case of the ceramic substrate, firing also is carried out, the semiconductor chip as shown in FIG. 22E' is not mounted. By carrying out the same heating and pressing treatment as mentioned above, the component wiring pattern is allowed to be embedded in the green sheet that is a base material sheet and to adhere the green sheet and the component wiring pattern for transfer.

Thereafter, as mentioned above, by peeling the carrier, the component material other than the component wiring pattern is removed.

Then, on the green sheet to which the component wiring pattern is transferred, an alumina green sheet for constraint is laminated. Thereafter, in such an atmosphere in which copper is not oxidized, for example, nitrogen atmosphere, a binder removing process and firing are carried out, thereby sintering the ceramic. Thereby, the transferred second metal layer and wiring pattern are allowed to be fixed on the ceramic substrate. Since this transfer material has a wiring made of copper, transfer itself can be produced cheaper that the silver wiring. However, it is necessary to carry out the firing process in a non-oxidization atmosphere by taking the copper wiring into account.

Therefore, both for a binder for green sheet and a binder for a paste forming a passive component, it is necessary to use a binder having an excellent thermal decomposition property such as, for example, methacrylate based acrylic binder, etc.

Therefore, the transfer materials are used in different ways in accordance with sintering conditions of a green sheet that forms a substrate or the ceramic forming the passive component.

The conditions for heating and pressing treatment can be determined appropriately. However, the heating and pressing usually can be carried out under the pressure of $9.8 \times 10^5$ to $9.8 \times 10^7$ Pa (10 to 200 kgf/cm$^2$), at the temperature of 70 to 100° C. for 2 to 30 minutes. Therefore, a wiring pattern can be formed without damaging the green sheet.

The conditions for the treatment for removing the binder is appropriately determined in accordance with the kinds of binders, metal forming the wiring pattern, or the like. However, usually, the treatment is carried out by the electric furnace under the conditions of a temperature of 500 to 700° C., temperature rising time of 10 hours, and maintaining time of 2 to 5 hours.

The conditions for firing are appropriately determined in accordance with the kinds of the ceramic and the like. However, usually, the firing is carried out in a belt furnace, at a temperature of 860 to 950° C. for 30 to 60 minutes in the air or in nitrogen.

Furthermore, the second method for producing the wiring substrate will be explained. When the multi-layered circuit substrate as shown in FIG. 25 is produced, single layered circuit substrates laminated sequentially as mentioned above, and interlayer portion is adhered. Needless to say, it is possible to harden two or more of single layered circuit substrates in one operation.

Figure 26A:
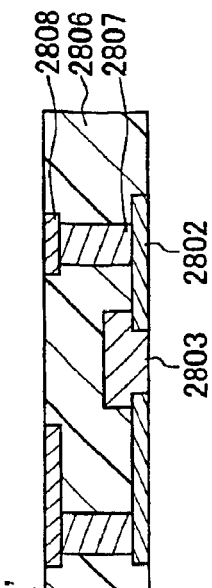
FIGS. 26A to 26C are cross-sectional views schematically showing a process for producing a single layered wiring substrate that forms each layer of the multi-layered circuit substrate shown in FIG. 25 by using the sixth transfer material of the present invention.
Figure 26B:
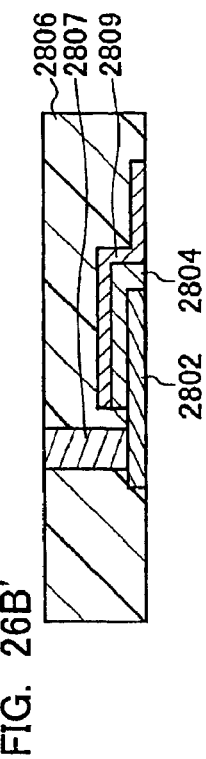
Figure 26C:
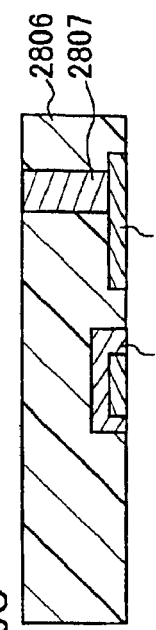

For example, when the circuit substrate having a base material sheet including a thermosetting resin is laminated, respectively as shown in FIGS. 26A to 26C, similar to the above, by transferring only the component wiring pattern to the base material sheet, a single layered circuit substrate as shown in FIGS. 26A' to 26C' can be obtained. The laminate of the single layered circuit substrates is heated and pressed at the curing temperature of the thermosetting resin so as to cure the thermosetting resin, thus to fix the adhesion between the circuit substrates.

When the heating and pressing temperature for transferring the wiring layer in the single layer wiring substrate is set to be 100° C. intentionally, even after the transfer, the base material sheet can be used as a prepreg. Thus, it is possible to produce a multi-layered wiring substrate by fixing the adhesion between the substrates after the single layer wiring substrates are laminated instead of sequentially laminating the single layer wiring substrates.

Furthermore, for example, in the case of laminating the ceramic circuit substrate having a base material sheet including a ceramic, similar to the above, after only the component wiring pattern is transferred to the base material sheet, this single layered ceramic circuit substrate is laminated and heated and pressed. Thus, firing of the ceramic and the adhesion fixation between the circuit substrates can be carried out at the same time.

The number of the laminated layers in the multi-layered circuit substrates (FIG. 25) is not particularly limited. However, the number is usually 4 to 10 layers, and as many as 12 layers is also possible. Furthermore, the total thickness of the multi-layered circuit substrate is usually 500 to 1000 µm.

The surface of the circuit substrates forming inside layers other than the outermost layer of the multi-layered circuit substrate (FIG. 25) may be flat instead of a convex and concave portion in which the wiring pattern is embedded in its concave portion by taking the electric connection structure by inner via into account. In order to obtain this structure intentionally, the use of the fourth or fifth transfer material is one solution. Furthermore, the outer most layer of the multi-layered substrate may be a flat circuit substrate, the surface of which is flat. However, if the surface has a concave portion, and the second metal layer etc. is formed in the bottom of the concave portion in the wiring substrate, it is possible to mount a semiconductor chip etc. as shown in FIG. 24H more easily.

EXAMPLE

Hereinafter, the fifth to twelfth embodiments of the present invention will be described in detail by way of Examples.

EXAMPLE 11

FIGS. 22A to 22G' are cross-sectional views schematically showing one example of a process for producing the fourth transfer material of the present invention.

As shown in FIGS. 22A to 22E and FIGS. 22A to 22E', a transfer material including passive components 2405, 2406 and 2407 (FIG. 22E), and a transfer material including a semiconductor chip that is an active component 2408 (FIG. 22E') were produced.

As shown in FIG. 22A, as a first metal layer 2401, an electrolytic copper foil having a thickness of 35 µm was prepared. First, a copper salt raw material was dissolved in an alkaline bath and allowed to be electrodeposited to a rotation drum so that it had a high electric current density. Thus, a metal layer (copper layer) was formed. This copper layer was rolled up continuously so as to form an electrolytic copper foil.

Next, as shown in FIG. 22B, a pattern opposite to the wiring pattern was formed by using a dry film resist 2404. Thereafter, as shown in FIG. 22C, a metal layer for forming a wiring pattern made of silver 2403 was laminated by electrolytic plating on the first metal layer 2401 in a thickness of 9 µm. Thus, two-layered structure as shown in FIG. 22D was produced. The surface thereof was subjected to a roughening treatment so that the average roughness (Ra) of the center line of the surface was about 4 µm.

Next, the portion corresponding to the passive components (inductor, capacitor, and resistor) were formed by a screen printing method. In a configuration of this Example, the passive components capable of being sintered together were employed so that they are mounted on a ceramic substrate.

As the inductor 2405, a paste was formed by kneading a Ni—Zn ferrite powder, 5 weight % of acrylic resin (Kyoeisya Kagaku Co., Ltd.; polymerization degree 100 cps), 15 weight % of terpineol (manufactured by Kanto Chemical Co., Inc), and 5 weight % of BBP (manufactured by Kanto Chemical Co., Inc) by using a triple roller.

As the capacitor 2406, similarly, a paste was formed by kneading Pb-based perovskite compound (PbO—MgO—$Nb_2O_5$—NiO—$WO_3$—$TiO_2$) powder by using a triple roller. As the resistor 2407, similarly, a paste was formed by mixing 5 to 50 weight % of ruthenium oxide powder with 95 to 50 weight % of low melting point borosilicate glass.

The inductor 2405, capacitor 2406, and resistor 2407 formed of these pastes were produced on the two layered structure shown in FIG. 22D by a printing method by using a predetermined shaped mask as shown in FIG. 22E. After printing, they were dried at 90° C. for 20 minutes.

When the transfer, firing and fixation were carried out on the ceramic substrate, an active component such as semiconductor chip, etc. was not formed on the transfer material (see FIG. 22E). However, when the transfer is carried out on the resin substrate, an active component such as semiconductor chip 2408 etc. can be formed (see FIG. 22E'). After flip-chip mounting, an underfill 2411 may be used for sealing a gap between a semiconductor chip 2408 and a wiring pattern 2412 and completely cured for integration at 150° C.

By using the transfer material shown in FIG. 22E, as shown in FIGS. 22F to 22G, a ceramic circuit component was produced.

First, a substrate 2409 on which a wiring pattern is transferred was prepared. This substrate 2409 was produced by preparing a low temperature sintering ceramic green sheet A including a low temperature sintering ceramic material and an organic binder, providing the substrate 2409 with via holes, and filling the via holes with a conductive paste 2410. Hereinafter, the component compositions of the green sheet A are described.

(Component Composition of the Green Sheet A)
mixture of ceramic powder $Al_2O_3$ and borosilicate glass (MLS-1000 manufactured by Nippon Electric Glass Co., Ltd.) 88 weight %
carboxylic acid based acrylic binder (Olicox, Kyoeisya Kagaku Co., Ltd.) 10 weight %
BBP (manufactured by Kanto Chemical Co., Inc.) 2 weight %

Each of the above-mentioned component was weighed so as to have the above-mentioned composition weight ratio. A solvent of toluene was added into the mixture of the above-mentioned components so that the viscosity of the slurry mixture was about 20 Pa·s, and then rotated and mixed by using alumina balls in a pot at the rotation rate of 500 rpm for 48 hours so as to form into a slurry.

Next, as a mold release film, PPS film having a thickness of 75 µm was prepared. On the PPS film, the slurry was formed into a film sheet by the doctor blade method at a gap of about 0.4 mm. The toluene solvent in the sheet was allowed to volatilize so as to remove the PPS film, thus to form a green sheet A having a thickness of 220 µm. Since in this green sheet A a plasticizer BBP was added into the carboxylic acid based acrylic binder, this sheet had high strength, flexibility and excellent thermal decomposition property.

This green sheet A was cut in a predetermined size by the use of its flexibility, and provided with through holes (via holes) having a diameter of 0.15 mm at equally intervals with a pitch of 0.2 to 2 mm by using a punching machine. Then, the through holes were filled with a conductive paste for filling via holes by a screen printing method. Thus, the substrate 2409 was produced. The conductive paste 2410 to be used was obtained by kneading the following materials at the following compositions by using a triple roller.

[Conductive Paste 2410]

spherical silver particles (Mitsui Mining & Smelting Co., Ltd., particle diameter of 3 µm) 75 weight % acrylic resin (manufactured by Kyoeisya Kagaku Co., Ltd., polymerization degree 100 cps) 5 weight % terpineol (manufactured by Kanto Chemical Co., Inc.) 15 weight %

BBP (manufactured by Kanto Chemical Co., Inc.) 5 weight %

Next, as shown in FIG. 22F, the transfer material produced in Example 22E was placed so that it was brought into contact with both surfaces of the substrate 2409, and a heating and pressing treatment was carried out by a thermal press method at a pressing temperature of 70° C. and a pressure of about $5.88 \times 10^6$ Pa (60 kgf/cm) for 5 minutes. Herein, in the capacitor 2406, an electrode pattern 2411 may be formed previously on the substrate 2409 by a transfer method etc. so that the dielectric layer was sandwiched between the upper and lower sides of the electrode surface. This method is possible only with the transfer material of the present invention on which the capacitor is formed by printing and was not possible in the conventional method in which the dielectric layer was printed on the substrate green sheet.

With this heating and pressing treatment, an acrylic resin in the substrate 2409 was fused and softened. Thus, the wiring layer 2403 of the second metal layer and circuit components 2405, 2406 and 2407 were embedded into the substrate 2409.

After the laminate of this substrate 2409 and the transfer material was cooled, the first metal layer 2401 that is a carrier of transfer material was peeled off from the laminate, and thereby a circuit substrate sheet, on both surfaces of which the wiring layer 2403 and the circuit components 2405, 2406 and 2407 were transferred, was obtained.

Then, the circuit substrate sheet was sandwiched by an alumina green sheet formed of an alumina inorganic filler that is not sintered at the firing temperature so as to form a laminate, and the laminate was subjected to a binder removing process and firing in the air, and thereby fixed. First, in order to remove the organic binder in the circuit substrate (FIG. 22G), the laminate was heated by an electric furnace up to 500° C. at the raising temperatures at 25° C./hour, treated at 500° C. for 2 hours. Then, the wiring substrate in which the binder was removed was burned at 900° C. for 20 minutes in the air. The firing conditions were set to be a temperature rising time of 20 minutes, temperature falling time of 20 minutes and in/out total time of 60 minutes. After firing, the alumina green sheet was easily removed.

This wiring substrate had a flat mounted surface after firing. On the wiring layer 2403 of this circuit substrate (FIG. 22G), a gold plating layer may be formed.

Warp, cracks, distortion did not occur in this circuit substrate. This is partly because a non-shrinkage sintering process was used in a plane direction. This process made it possible to burn the copper foil wiring and ceramic substrate simultaneously. The mounting position of each of the circuit components (inductor, capacitor and resistor) was accurate. Thus, a precise circuit substrate as designed was produced in one transfer.

Furthermore, when capacitor high temperature load reliability test (125° C., 50V, 1000 hours) was carried out, the insulating resistance of the dielectric layer of the capacitor 2406 was not deteriorated and $10^6 \Omega$ or more of insulating resistance was secured. Furthermore, the dielectric constant was 5000 for the dielectric layer, and 8.1 for the substrate layer. An inductance of the inductor 2405 was secured to be 0.5 µH. Furthermore, the resistance value of the resistor 2407 was permitted to be a desired value ranging from 100Ω to 1 MΩ.

Thus, the use of the transfer material of the present invention facilitated formation of circuit components including passive components such as an inductor, a capacitor, and a resistor, etc.

In addition, it is advantageous in the present invention that by a non-shrinkage sintering process in the plane direction and a transfer process of a high-density conductive pattern by plating, a wiring having an extremely high dielectric constant can be attained and that by using silver for the wiring metal, a binder removing process and firing can be performed in the air. In particular, since the latter process can be employed, the composition of a substrate, each composition of passive components such as an inductor, a capacitor, and resistor, etc, can be selected from the wide range.

FIGS. 22F' and 22G' show the case where the transfer material shown in FIG. 22E' is transferred, mounted and fixed to a resin substrate. As in the case of the ceramic green sheet, it was confirmed that transfer and mounting were carried out in one time.

EXAMPLE 12

FIGS. 23A to 23H are cross-sectional views schematically showing one example of a process for producing a wiring substrate by using the fifth transfer material.

The fifth transfer material was produced by the way shown in FIGS. 23A to 23F.

First, as shown in FIG. 23A, as a first metal layer 2501, an electrolytic copper foil having a thickness of 35 µm was prepared. Specifically, a copper salt raw material was dissolved in an alkaline bath and allowed to be electrodeposited to a rotation drum so that it had a high electric current density. Thus, a metal layer (copper layer) was formed. This copper layer was rolled up continuously so as to form into an electrolytic copper foil.

Next, a thin nickel-phosphorous alloy plating layer was formed on the surface of the first metal layer 2501 as a peel layer 2502. As a metal layer for forming a wiring pattern 2503, an electrolytic copper foil that is the same as the first metal layer 2501 was laminated in a thickness of 9 µm by electrolytic plating, to thus form the second metal layer 2503. Thus, a three-layered laminate was produced (FIG. 23A).

The surface of the laminate was subjected to a roughening treatment so that the average roughness (Ra) of the center line of the surface was about 4 µm. The roughening treatment was carried out by precipitating fine copper powder on the electrolytic copper foil.

Next, a dry film resist (DFR) 2504 was placed on the laminate by photolithography as shown in FIG. 23B, and exposure and development of the wiring pattern portion were carried out as shown in FIG. 23C. Thereafter, the second metal layer 2503 of the laminate was etched by a chemical etching process (immersing in an aqueous solution of ferric chloride) so as to form a desired wiring pattern as shown in FIG. 23D. With such an etchant, only the second metal layer was etched and the thin nickel-phosphorous alloy layer that is the peel layer was not etched.

Thereafter, as shown in FIG. 23E, the remaining dry film resist was removed by a peeling agent. Thus, a transfer material was obtained.

Next, the portion corresponding to the passive components was formed by a screen printing method. In a configuration of this Example, the passive components capable of being sintered together were employed so that they are mounted on a ceramic substrate.

As the inductor 2505, a paste was formed by kneading Ni—Zn ferrite powder, 5 weight % of acrylic resin (Kyoeisya Kagaku Co., Ltd.; polymerization degree: 100 cps), 15 weight % of terpineol (manufactured by Kanto Chemical Co., Inc), and 5 weight % of BBP (manufactured by Kanto Chemical Co., Inc) by using a triple roller.

As the capacitor 2506, similarly, a paste was formed by kneading Pb-based perovskite compound (PbO—MgO—$Nb_2O_5$—NiO—$WO_3$—$TIO_2$) powder by using a triple roller.

As the resistor 2507, similarly, a paste was formed by mixing 5 to 50 weight % of ruthenium oxide powder with 95 to 50 weight % of low melting point borosilicate glass.

By using these pastes, by using a predetermined shaped mask, the inductor 2505, capacitor 2506, and resistor 2507 were formed on the transfer material shown in FIG. 23E by a printing method as shown in FIG. 23F. By using the transfer materials, a ceramic substrate was produced by the method shown in FIGS. 23G to 23H.

First, a substrate 2508 was prepared. This substrate 2508 was produced by preparing a low temperature sintering ceramic green sheet B including a low temperature sintering ceramic material and an organic binder, providing the substrate 2508 with via holes, and filling the via holes with a conductive paste 2509. Hereinafter, the component compositions of the green sheet B are described.

[Component Composition of the Green Sheet B]

mixture of ceramic powder $Al_2O_3$ and borosilicate glass (MLS-1000 manufactured by Nippon Electric Glass Co., Ltd.) 88 weight % methacrylic acid based acrylic binder (Olicox 7025, Kyoeisya Kagaku Co., Ltd.) 10 weight %

BBP (manufactured by Kanto Chemical Co., Inc.) 2 weight %

Each of the above-mentioned component was weighed so as to have the above-mentioned composition weight ratio. A solvent of toluene was added into the mixture of the above-mentioned components so that the viscosity of the slurry mixture was about 20 Pa·s, and then rotated and mixed by using alumina balls in a pot at the rotation rate of 500 rpm for 48 hours so as to form into a slurry.

Next, as a mold release film, a PPS film having a thickness of 75 $\mu$m was prepared. On the PPS film, the slurry was formed into a film sheet by the doctor blade method at a gap of about 0.4 mm. The toluene solvent in the sheet was allowed to volatilize so as to remove the PPS film, thus to form a green sheet B having a thickness of 220 $\mu$m. Since in this green sheet B, a plasticizer BBP was added into the methacrylic acid based acrylic binder that is an organic binder, this sheet had flexibility and an excellent thermal decomposition property.

This green sheet B was cut in a predetermined size by the use of its flexibility, and provided with through holes (via holes) having a diameter of 0.15 mm at equally intervals with a pitch of 0.2 to 2 mm by using a punching machine. Then, the through holes were filled with a conductive paste 2509 for filling via holes by a screen printing method. Thus, the substrate 2508 was produced by the above-mentioned process. The conductive paste 2509 to be used was obtained by kneading the following materials at the following compositions by using a triple roller.

[Conductive Paste 2509]

spherical silver particles (Mitsui Mining & Smelting Co., Ltd., particle diameter of 3 $\mu$m) 75 weight % acrylic resin (manufactured by Kyoeisya Kagaku Co., Ltd., polymerization degree 100 cps) 5 weight % terpineol (manufactured by Kanto Chemical Co., Inc.) 15 weight %

BBP (manufactured by Kanto Chemical Co., Inc.) 5 weight %

Next, the transfer material produced as mentioned above (FIG. 23F) was placed so that it was brought into contact with both surfaces of the substrate 2508, and a heating and pressing treatment was carried out by a thermal press at a pressing temperature of 70° C. and a pressure of about $5.88 \times 10^6$ Pa (60 kgf/cm$^2$) for 5 minutes. Herein, in the capacitor 2506, an electrode pattern 2510 may be formed previously on the substrate 2508 by a transfer method etc. so that the dielectric was sandwiched between the upper and lower sides of the electrode surfaces. This method is possible only with the transfer material of the present invention on which the capacitor is formed by printing and was difficult in the conventional method in which the dielectric layer was printed directly on the substrate green sheet.

With this heating and pressing treatment, an acrylic resin in the substrate 2508 was fused and softened. Thus, the second metal layer 2503 that is a wiring pattern and circuit components (the inductor 2505, the capacitor 2506, and the resistor 2507) were embedded into the substrate 2508.

After such a laminate of the transfer material and this substrate 2508 was cooled, the first metal layer 2501 that is a carrier was peeled off from the laminate, thereby a circuit substrate sheet both surfaces of which the second metal layer 2503 that is a wiring pattern and the circuit components (the inductor 2505, the capacitor 2506, and the resistor 2507) were transferred was obtained.

Then, the circuit substrate sheet was sandwiched by an alumina green sheet formed of only an alumina inorganic filler, which is not sintered at the firing temperature of the substrate so as to form a laminate, and the laminate was subjected to a binder removing process and firing in an atmosphere of nitrogen, and thereby fixed.

First, in order to remove the organic binder in the circuit substrate (FIG. 23H), the laminate was heated by an electric furnace up to 600° C. with raising temperatures at 25° C./hour, and treated at 600° C. for 2 hours. Then, the wiring substrate in which the binder was removed was burned at 900° C. for 20 minutes by a belt furnace in an atmosphere of nitrogen. The firing condition was set to be a temperature rising time of 20 minutes, temperature falling time of 20 minutes and in/out total time of 60 minutes. After firing, the alumina green sheet was easily removed.

This wiring substrate (FIG. 23H) had a flat mounted surface. On the wiring layer 2503 of this circuit substrate (FIG. 23H), a gold plating layer may be formed.

Warp, cracks, distortion did not occur in this circuit substrate. This is partly because a non-shrinkage sintering process was used in a plane direction. This made it possible to burn the copper foil wiring and ceramic substrate simultaneously. Also, the mounting position of each circuit component was accurate. Thus, a precise circuit substrate as designed was produced in one transfer.

Furthermore, when capacitor high temperature load reliability test (125° C., 50V, 1000 hours) was carried out, the insulating resistance of the dielectric layer of the capacitor 2506 was not deteriorated and the $10^6 \Omega$ or more of insulating resistance was secured. Furthermore, the dielectric constant was 5000 for the dielectric layer, and 8.1 for the substrate layer. An inductance of the inductor 2505 was secured to be 0.5 µH. Furthermore, the resistance value of the resistor 2507 could be a desired value ranging from 100Ω to 1 MΩ.

Thus, the use of the transfer material of the present invention facilitated formation of circuit components including an inductor, a capacitor, and a resistor, etc.

EXAMPLE 13

FIGS. 24A to 24H are cross-sectional views schematically showing one example of a process for producing a wiring substrate by using the sixth transfer material.

The sixth transfer material was produced by a method shown in FIGS. 24A to 24H.

First, as a first metal layer 2601, an electrolytic copper foil having a thickness of 35 µm was prepared. A copper salt raw material was dissolved in an alkaline bath and allowed to be electrodeposited to a rotation drum so that it had a high electric current density. Thus, a metal layer (copper layer) was formed. This copper layer was rolled up continuously so as to form into an electrolytic copper foil.

Next, an adhesive agent formed of an organic layer was applied thinly on the surface of the first metal layer 2601 as a peel layer 2602. As a second metal layer 2603 for forming a wiring pattern, an electrolytic copper foil same as the first metal layer 2601 was laminated in a thickness of 9 µm by electrolytic plating. Thus, three-layered laminate was produced (FIG. 24A).

The surface of the laminate was subjected to a roughening treatment so that the average roughness (Ra) of the center line of the surface was about 4 µm. The roughening treatment was carried out by precipitating fine copper powder on the electrolytic copper foil.

Next, as shown in FIG. 24B, a dry film resist (DFR) 2604 was placed on the laminate by photolithography and exposure and development of the wiring pattern portion was carried out as shown in FIG. 24C. Thereafter, as shown in FIG. 24D, not only the second metal layer 2602 but also the surface portion of the first metal layer 2601 of the laminate were etched by a chemical etching process (immersing in an aqueous solution of ferric chloride) so as to form a desired wiring pattern.

Thereafter, the DFR 2604 was peeled off by a peeling agent so as to produce a three-layered structure shown in FIG. 24E. Since the first metal layer and the second metal layer are formed of the same metal, copper, it is possible to form a convex portion on not only the second metal layer but also a part of the first metal layer. This structure is characterized in that the wiring pattern is processed also in the first metal layer that is a carrier layer. Moreover, in this example, as the peel layer, an organic layer was used. The peel layer is not necessarily limited thereto, and for example, a nickel plating layer etc. may be used. In this case, the transfer material having the same effect can be obtained.

In this three-layered structure, the peel layer 2602 that adheres the first metal layer 2601 to the second metal layer 2603 for forming the wiring pattern was weak in adhesive strength itself but excellent in etch resistance property. Thus, even if the entire three-layered structure was subjected to an etching process, the wiring pattern was formed without peeling of the interlayer portion. The adhesive strength between the first metal layer 2601 and the second metal layer 2603 via the peel layer 2602 was 40 N/m (gf/cm), exhibiting an excellent peeling property.

Next, a circuit component was formed by a screen printing method. In a configuration of this Example, the passive components capable of being sintered together were employed so that they are mounted on a resin substrate.

As the inductor 2605, a paste was formed by kneading a Ni—Zn ferrite powder, 10 weight % of liquid epoxy resin (EF-450 manufactured by Nippon Rec Co. Ltd.), 0.3 weight % of coupling agent (46B, titanate based coupling agent manufactured by Ajinomoto Co., Inc.) by using a kneader revolving both on its orbital and on its own axis at high speed.

Moreover, a paste including magnetic alloy powder, was sendust powder as a filler was produced. As the capacitor 2606, similarly, a paste was formed by kneading Pb-based perovskite compound ($PbO—MgO—Nb_2O_5—NiO—WO_3—TiO_2$) powder by using a triple roller. As the resistor 2607, similarly, a paste was formed having the similar configuration with the content of carbon content by varying the content of carbon.

The sixth transfer material was produced by using the circuit components formed of these pastes were produced on the three-layered structure shown in FIG. 24E by a printing method by using a predetermined shaped mask as shown in FIG. 24F. After printing, they were dried at 90° C. for 20 minutes.

Moreover, on the transfer material, a wiring pattern 2613 was formed so that a semiconductor chip 2608 is mounted on the wiring substrate after transfer by using the transfer material.

Thereafter, as shown in FIGS. 24G to 24H, a print circuit substrate was produced as follows.

First, a substrate 2610 was prepared. This substrate 2601 was produced by preparing a base material sheet formed of a composite material, providing the substrate 2601 with via holes, and filling the via holes with a conductive paste 2611. Hereinafter, the component compositions of the base material sheet 2610 are described.

[Component Composition of the Substrate Sheet 2610]

$Al_2O_3$ (AS-40 manufactured by Showa Denko K. K., average particle diameter of 12 µm) 90 weight % liquid epoxy resin (EF-450, manufactured by Nippon Rec Co. Ltd.) 9.5 weight % carbon black (manufactured by Toyo Carbon) 0.2 weight % coupling agent (46B, titanate based coupling agent manufactured by Ajinomoto Co., Inc.) 0.3 weight %

Each of the above-mentioned components was weighed so as to have the above-mentioned composition weight ratio. A solvent of methyl ethyl ketone as a solvent for adjusting viscosity was added into the mixture of the above-mentioned components so that the viscosity of the slurry mixture was about 20 Pa·s, and then rotated and mixed by using alumina balls in a pot at the rotation rate of 500 rpm for 48 hours so as to form into a slurry.

Next, as a mold release film, a PET film having a thickness of 75 µm was prepared. On the PET film, the slurry was formed into a film sheet at a gap of about 0.7 mm by a doctor blade method. The film sheet was allowed to stand for 1 hour at 100° C. so as to volatilize the methyl ethyl ketone solvent and to remove the PET film, thus to form into a base material sheet 2601 having a thickness of 350 µm. Since the solvent was removed at 100° C., the epoxy resin was kept uncured and the base material sheet had a flexibility.

This base material sheet was cut in a predetermined size by the use of its flexibility, and provided with through holes (via holes) having a diameter of 0.15 mm at equally intervals with a pitch of 0.2 to 2 mm. Then, the through holes were filled with a conductive paste 2611 for filling via holes by a screen printing method. Thus, the substrate 2610 was produced. The conductive paste 2611 to be used was obtained by mixing and kneading the following materials at the below mentioned compositions by using a triple roller.

[Conductive Paste 2611]

spherical copper particles (Mitsui Mining & Smelting Co., Ltd., particle diameter of 2 μm) 85 weight % bisphenol A epoxy resin (Epicoat 828 manufactured by Yuka Shell Epoxy) 3 weight % glycidyl ester based epoxy resin (YD-171 manufactured by Toto Kasei) 9 weight % amine adduct hardening agent (MY-24 manufactured by Ajinomoto Co., Inc.) 3 weight %

Next, as shown in FIG. 24G, the transfer material was placed so that the transfer material produced in the above (FIG. 24F) was brought into contact with both surfaces of the substrate 2610, heated and pressed by a thermal press at a pressing temperature of 120° C. and a pressure of $9.8 \times 10^5$ Pa (10 kgf/cm) for 5 minutes.

In the capacitor 2610, when the dielectric layer is sandwiched between the upper and lower electrodes, an electrode pattern 2612 can be transferred to the substrate previously. Such a method is possible only with the transfer material of the present invention on which the capacitor is formed by printing and was difficult in the conventional method in which the dielectric layer was printed on the composite sheet including a ceramic as a filler.

With this heating and pressing treatment, an epoxy resin in the substrate 2610 (an epoxy resin in the base material sheet and the conductive paste 2611) was fused and softened (FIG. 24H). Thus, the circuit components pattern (the inductor 2605, the capacitor 2606, and the resistor 2607) and the second metal layer 2603 as a wiring pattern were embedded in the substrate 2610. The heating temperature was further raised and treated at 175° C. for 60 minutes, thereby the epoxy resin was cured. Thereafter, a semiconductor chip 2608 was flip-chip mounted on the wiring 2613.

Thus, the base material sheet was adhered to the entire circuit component pattern strongly. Furthermore, the conductive paste 2611 and each of the circuit components was electrically connected (inner via connection) and adhered to each other strongly.

Thereafter, a first metal layer 2601 that is a carrier layer and the peel layer 2602 were peeled off, thereby a wiring substrate both surfaces of which had a circuit component patterns (inductor 2605, capacitor 2606, and resistor 2607) and wiring patterns (second metal layer 2603) was obtained. On the surfaces of the wiring substrate, the concave portion corresponding to the depth of the etched portion of the first metal layer 2603 was formed in the transfer material, and all the wiring patterns and the circuit component patterns were formed at the bottom of the concave portion.

Thus, the use of this transfer material facilitated peeling of the adhesive plane between the first metal layer 2601 and the second metal layer 2603 via the peel layer 2602, and enabled transfer of only the second metal layer 2603 and circuit component patterns (inductor 2605, capacitor 2606, and resistor 2607) to the substrate when the second transfer 2603 was transferred to the substrate 2610.

In this Example, the first metal layer 2601 that is a carrier layer was formed of a copper foil having a thickness of 35 μm, and even if the transfer material of the substrate 2610 was deformed at the time of transfer, the carrier layer was resistant to the deformation stress. On the other hand, in the transfer material in this example, the wiring portion has a convex shape, when the transfer material is pressed onto the base material sheet, the base material is likely to flow into the concave portion, thus suppressing the deformation stress that distorts the pattern in the vertical direction. Therefore, the pattern distortion in this example was 0.08% that is an amount generated by the curing and shrinking of the base material.

Moreover, in this Example, the peel layer formed of an organic layer was used. The peel layer is not necessarily limited thereto, and for example, plating layer such as a Ni plating layer etc. having a thickness of 200 nm or less may be used. In this case, the transfer material having the same effect was obtained.

Furthermore, the semiconductor chip 2608 was flip-chip mounted on the wiring 2613 easily by positioning the bumps with respect to the wiring 2613 formed on the concave portion.

The mounting position of each of the circuit components (inductor, capacitor and resistor) was accurate. Thus, a precise circuit substrate as designed was produced in one transfer. The wiring substrate of this Example was excellent in connection between the semiconductor chip 2608 and the wiring 2613. Also, a capacitor 2606 that was mounted so that it functioned as a bypass capacitor functioned excellently. Furthermore, when capacitor high temperature load reliability test (125° C., 50V, 1000 hours) was carried out, the insulating resistance of the dielectric layer of the capacitor 2606 was not deteriorated and the $10^6 \Omega$ or more of insulating resistance was secured.

Furthermore, the dielectric constant was 200 for the dielectric layer, and 8.1 for the substrate layer. An inductance of the inductor 2605 was secured to be 0.5 μH or more, that is a sufficient value, even whether it is ferrite or a magnetic alloy. Furthermore, the resistance value of the resistor 2607 could be a desired value ranging from 100Ω to 1 M Ω.

Thus, the use of the transfer material of the present invention facilitates the formation of circuit components including wiring pattern, active components such as a semiconductor chip, and passive components such as an inductor, capacitor, and resistor, etc.

EXAMPLE 14

With the fourth to sixth transfer materials of the present invention, and by using the substrate formed of composite material produced by the same method as in Example 13, a multi-layered wiring substrate was produced as shown in FIG. 25. FIG. 26 is a cross sectional view schematically showing the method for producing each layer.

As shown in FIG. 26, reference numerals 2800A, 2800B and 2800C denote transfer materials, respectively. 2800A denotes a transfer material on which mainly a resistor is formed by printing. 2800B denotes a transfer material in which mainly a dielectric layer that serves as a capacitor 2804 is formed by printing. 2800C is transfer material in which mainly a magnetic layer that serves as the inductor 2805 was formed by printing.

Furthermore, in this Example, as shown in FIGS. 26A to 26C, inner via holes in the substrate sheet 2806 are filled with the conductive paste 2807. Since the configuration of this was the same as in Example 13, the detailed explanation is not repeated herein.

Furthermore, the wiring pattern layer 2808 formed on the surface of the top layer of the multi-layered substrate and one electrode 2809 of the capacitor 2804 were formed on the substrate previously. Moreover, the transfer material to be used for the transfer has the same configuration of the transfer material of the present invention.

Conventionally, when passive components formed by printing are incorporated into a multi-layered substrate, an individual component was formed by printing on the substrate green sheet. However, in such a process, the unevenness having a thickness of a several tens μm occurs on the surface of the substrate. Therefore, if many layers are laminated for obtaining a multi-layered structure, when sintered and pressed, an external terminal of the outer capacitor etc. is deformed as squashed, thus deteriorating the insulating property. Thus, the short circuit of the capacitor was generated frequently.

In this Example, as shown in FIG. 26B, the electrode 2802 and the dielectric layer 2804 formed on the transfer material 2800B were pressed with positioning onto the electrode patterns 2809 that were previously formed on the substrate sheet 2806. At this time, these electrode 2802 and dielectric layer 2804 are embedded in the substrate sheet 2806 having an excellent in fluidity. As shown in FIG. 26B', a single layered wiring substrate was produced without unevenness on the surface.

Similarly, when the transfer was carried out by using the transfer materials 2800A and 2800C, no unevenness occur. As shown in FIGS. A' and C', a flat level was formed respectively.

Figure 26D:
FIG. 26D' is a cross-sectional view showing a bottom layer wiring substrate of the multi-layered circuit substrate.
Figure 26A:
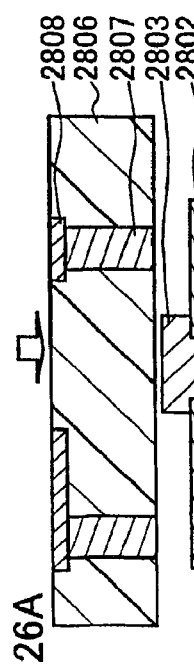
Figure 26B:
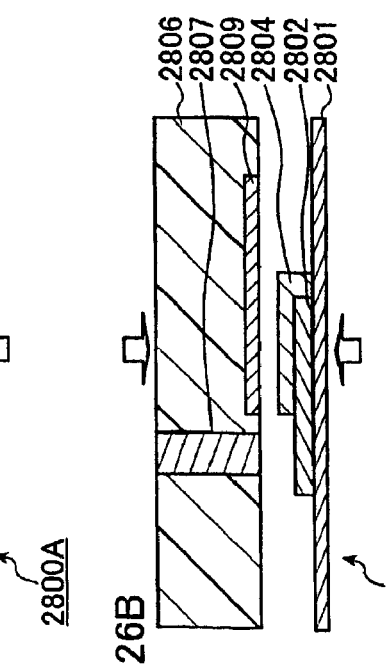
Figure 26C:
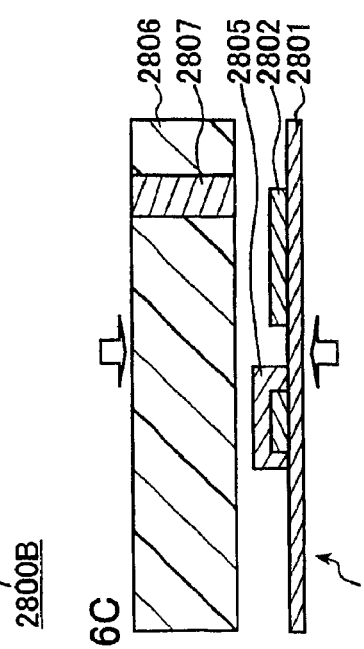

Finally, the single layered wiring substrates shown in FIGS. 26A' to 26C' and the wiring substrate to which the wiring patterns were transferred on both surfaces as shown in FIG. 26D' were laminated into a sheet, and the sheet was cured in one heating and pressing treatment. Thereby, each layer in which the circuit component such as an inductor, capacitor, and resistor are integrated, thus a multi-layered circuit substrate as shown in FIG. 25 can be produced. In this example, each layer has a flat surface without unevenness, and thus a laminating process can be carried out easily.

As mentioned above, the fourth to sixth transfer materials of the present invention allow a fine wiring pattern as well as circuit components such as inductor, capacitor, and resistor etc. to be formed by a printing method and to be transferred in one transfer process. Therefore, easy and accurate mounting to the substrate can be possible. Furthermore, since the wiring pattern and component pattern are mounted by transfer, the wiring pattern and the component patterns can be embedded without occurring unevenness. This facilitates the subsequent laminating process without disconnection of the wiring or damage of the pattern shape.

Moreover, in the fifth to twelfth embodiments and Examples 11 to 14, the transfer material on which all of the inductor, capacitor, and resistor are formed is described, however, all of these components are not necessarily formed.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. A wiring substrate comprising
   an electric insulating substrate,
   a wiring pattern embedded in at least one principal plane of the electric insulating substrate by a transfer method by the use of a transfer material, and
   at least one concave portion formed on the surface of the electric insulating substrate,
   wherein the wiring pattern is formed at the bottom of the concave portion such that the surface of the wiring pattern is lower than the surface of the substrate at portion in the vicinity of the wiring pattern.

2. The wiring substrate according to claim 1, wherein a depth of the concave portion is 1 to 12 μm.

3. The wiring substrate according to claim 1 or 2, wherein the wiring pattern comprises a first metal layer and a second metal layer formed on the first metal layer.

4. The wiring substrate according to claim 3, wherein the second metal layer is a gold-plating layer.

5. The wiring substrate according to claim 1 or 2, further comprising a semiconductor device mounted on the wiring pattern, wherein the bump of the semiconductor device is flip-chip bonded on the wiring pattern by positioning the bump of the semiconductor device in the concave portion, and the bump is electrically connected to the wiring pattern.

6. The wiring substrate according to claim 1, wherein the electric insulating substrate is provided with a through hole filled with a conductive composition, and the wiring pattern is electrically connected to the conductive composition.

7. The wiring substrate according to claim 1, wherein the electric insulating substrate comprises an inorganic filler and a thermosetting resin composition, and has a through hole filled with a conductive composition.

8. The wiring substrate according to claim 7, wherein the inorganic filler comprises at least one inorganic filler selected from the group consisting of $Al_2O_3$, MgO, BN, AlN and $SiO_2$, the content of the inorganic filler is 70 to 95 weight %, and the content of the thermosetting resin composition is 5 to 30 weight %.

9. The wiring substrate according to claim 1, wherein the electric insulating substrate is a reinforcer impregnated with a thermosetting resin, and the reinforcer is at least one selected from the group consisting of a woven fabric of a glass fiber, a non-woven fabric of a glass fiber, a woven fabric of a thermal resistant organic fiber and a non-woven fabric of a thermal resistant organic fiber.

10. The wiring substrate according to claim 1, wherein the electric insulating substrate is formed of a ceramic.

11. The wiring substrate according to claim 10, wherein the ceramic comprises at least one component selected from the group consisting of $Al_2O_3$, MgO, $ZrO_2$, $TiO_2$, $SiO_2$, BeO, BN, CaO and glass, or a Bi—Ca—Nb—O containing ceramic.

12. A multi-layered wiring substrate in which a plurality of wiring substrates are laminated,
    wherein at least one layer has a wiring substrate according to claim 1.

13. The multi-layered wiring substrate according to claim 12, wherein at least one of the plurality of wiring substrates is a ceramic wiring substrate having an electric insulating substrate including a ceramic,
    at least one of the ceramic wiring substrates has a convex wiring pattern formed an at least one principal plane,
    a wiring substrate laminated on the principal plane having the convex wiring pattern is a composite wiring substrate having an electric insulating substrate including a thermosetting resin composition, and
    the convex wiring pattern is embedded in the principal plane of the composite wiring substrate.

14. The multi-layered wiring substrate according to claim 12, wherein at least two of the plurality of wiring substrates are ceramic wiring substrates having an electric insulating substrate including a ceramic,
    at least one of the ceramic wiring substrates comprises a ceramic material different from the ceramic material of the other ceramic wiring substrates, and
    a wiring substrate having an electric insulating substrate including a thermosetting resin composition is placed between the ceramic wiring substrates each containing a different ceramic material.

15. The multi-layered wiring substrate according to claim 12, wherein at least a top layer and a bottom layer of the plurality of wiring substrates are composite substrates having an electric insulating substrate including a thermosetting resin composition, and an inside layer is a ceramic wiring substrate having an electric insulating substrate including a ceramic.

* * * * *

UNITED STATES PATENT AND TRADEMARK OFFICE
CERTIFICATE OF CORRECTION

PATENT NO. : 6,936,774 B2
DATED : August 30, 2005
INVENTOR(S) : Sugaya et al.

It is certified that error appears in the above-identified patent and that said Letters Patent is hereby corrected as shown below:

<u>Column 67,</u>
Line 59, "at portion" should read -- at a portion --.

<u>Column 68,</u>
Line 41, "formed an at least" should read -- formed on at least --.

Signed and Sealed this

Fourth Day of April, 2006

JON W. DUDAS
*Director of the United States Patent and Trademark Office*